(12) United States Patent
Barnett et al.

(10) Patent No.: US 12,596,402 B2
(45) Date of Patent: *Apr. 7, 2026

(54) DOCKING CONNECTOR PLATFORM FOR MOBILE ELECTRONIC DEVICES

(71) Applicant: PopSockets LLC, Boulder, CO (US)

(72) Inventors: David B. Barnett, Boulder, CO (US); Altan Nahum, Boulder, CO (US)

(73) Assignee: POPSOCKETS LLC, Boulder, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/245,011

(22) Filed: Jun. 20, 2025

(65) Prior Publication Data

US 2025/0370503 A1 Dec. 4, 2025

Related U.S. Application Data

(63) Continuation-in-part of application No. 18/405,877, filed on Jan. 5, 2024, now Pat. No. 12,373,003, which
(Continued)

(51) Int. Cl.
*G06F 1/16* (2006.01)
*A63F 13/23* (2014.01)
(Continued)

(52) U.S. Cl.
CPC ............ *G06F 1/1632* (2013.01); *A63F 13/23* (2014.09); *A63F 13/92* (2014.09); *A63F 13/98* (2014.09);
(Continued)

(58) Field of Classification Search
CPC .... G06F 1/1632; G06F 1/1626; G06F 1/1635; G06F 1/1656; A63F 13/23; A63F 13/92; A63F 13/98; H10F 19/00; Y02E 10/50
See application file for complete search history.

(56) References Cited

U.S. PATENT DOCUMENTS 3,191,513 A 6/1965 Turner
3,901,574 A 8/1975 Paullus et al.
(Continued)

FOREIGN PATENT DOCUMENTS

CN 2398783 Y 9/2000
KR 101738073 5/2017
(Continued)

OTHER PUBLICATIONS

Transmittal of International Search Report and Written Opinion issued in PCT/US2018/066137 on Nov. 22, 2019.
(Continued)

*Primary Examiner* — Christopher M Brandt
(74) *Attorney, Agent, or Firm* — Irell and Manella LLP

(57) ABSTRACT
A docking-accessory platform is configured to couple to a mobile electronic device. The platform includes a front surface and a back surface opposite the front surface of the platform. The back surface of the platform faces a back of the mobile electronic device when the platform is coupled to the mobile electronic device. The platform also includes a docking connector that comprises a cavity, where the docking connector comprises an annular magnetic attachment system formed beneath the front surface of the platform. The annular magnetic attachment system comprises a magnet and is (i) centered laterally on the platform and (ii) configured to form detachable magnetic attachments to compatible docking accessories.

20 Claims, 47 Drawing Sheets

Related U.S. Application Data is a continuation of application No. 18/202,847, filed on May 26, 2023, now Pat. No. 11,899,496, which is a continuation of application No. 16/745,226, filed on Jan. 16, 2020, now Pat. No. 11,899,495, and a continuation-in-part of application No. 15/852,518, filed on Dec. 22, 2017, said application No. 16/745,226 is a continuation of application No. 15/723,506, filed on Oct. 3, 2017, now Pat. No. 10,571,964, said application No. 15/852,518 is a continuation-in-part of application No. 15/173,644, filed on Jun. 4, 2016, now abandoned, and a continuation of application No. 14/588,402, filed on Dec. 31, 2014, now Pat. No. 10,019,034, said application No. 15/173,644 is a continuation of application No. 14/384,663, filed on Sep. 11, 2014, now Pat. No. 9,367,090, said application No. 15/723,506 is a continuation of application No. 14/302,203, filed on Jun. 11, 2014, now Pat. No. 9,804,636, said application No. 16/745,226 is a continuation-in-part of application No. PCT/US2013/030911, filed on Mar. 13, 2013.

(60) Provisional application No. 61/922,294, filed on Dec. 31, 2013, provisional application No. 61/833,634, filed on Jun. 11, 2013, provisional application No. 61/610,575, filed on Mar. 14, 2012.

(51) Int. Cl.
 *A63F 13/92* (2014.01)
 *A63F 13/98* (2014.01)
 *H10F 19/00* (2025.01)

(52) U.S. Cl.
 CPC .......... *G06F 1/1626* (2013.01); *G06F 1/1635* (2013.01); *G06F 1/1656* (2013.01); *H10F 19/00* (2025.01); *Y02E 10/50* (2013.01)

(56) References Cited

U.S. PATENT DOCUMENTS

| | | | |
|---|---|---|---|
| 4,601,361 A | 7/1986 | Nakada |
| 4,915,540 A | 4/1990 | Kennedy et al. |
| 4,955,493 A | 9/1990 | Touzani |
| 5,568,549 A | 10/1996 | Wang |
| 5,694,292 A | 12/1997 | Pausel et al. |
| 5,739,665 A | 4/1998 | Bares |
| 5,752,834 A | 5/1998 | Ling |
| 5,852,545 A | 12/1998 | Pan-Ratzlaff |
| 6,736,285 B2 | 5/2004 | Stewart-Stand |
| 6,771,329 B2 | 8/2004 | Hung et al. |
| 7,076,270 B2 | 7/2006 | Jaggers et al. |
| 7,303,282 B2 | 12/2007 | Dwyer et al. |
| 7,778,023 B1 | 8/2010 | Mohoney |
| 8,090,130 B2 | 1/2012 | Zorkendorfer |
| 8,137,192 B2 | 3/2012 | Thomas |
| 8,183,825 B2 | 5/2012 | Sa |
| 8,382,059 B2 | 2/2013 | Le Gette et al. |
| 8,509,865 B1 | 8/2013 | LaColla |
| 8,560,031 B2 | 10/2013 | Barnett et al. |
| 8,688,037 B2 | 4/2014 | Chatterjee et al. |
| 8,757,374 B1 | 6/2014 | Kaiser |
| 8,986,033 B2 | 3/2015 | Berger et al. |
| 9,118,750 B2 | 8/2015 | Vossoughi et al. |
| 9,136,259 B2 | 9/2015 | Pratt |
| 9,160,189 B2 | 10/2015 | Glanzer et al. |
| 9,301,584 B2 | 4/2016 | Butts |
| 9,360,154 B2 | 6/2016 | Le Gette et al. |
| 9,367,090 B2 | 6/2016 | Barnett et al. |
| 9,397,719 B1 | 7/2016 | Schmidt |
| 9,470,358 B2 | 10/2016 | Le Gette et al. |
| 9,496,642 B1 | 11/2016 | Fan |
| D777,022 S | 1/2017 | Barnett |
| 9,804,636 B2 | 10/2017 | Barnett et al. |
| D818,808 S | 5/2018 | Barnett |
| 9,970,589 B2 | 5/2018 | Hobbs et al. |
| 10,019,034 B2 | 7/2018 | Barnett et al. |
| 10,113,691 B2 | 10/2018 | Grieve |
| 10,200,518 B2 | 2/2019 | Richter |
| 10,484,522 B1 | 11/2019 | McHatet |
| 10,638,627 B1 | 4/2020 | Stime |
| D883,273 S | 5/2020 | Chen |
| 10,742,280 B2 | 8/2020 | Onggesanusi et al. |
| 10,774,871 B1 | 9/2020 | Srour |
| 10,897,984 B2 | 1/2021 | Roth |
| 10,972,596 B1 | 4/2021 | Blau |
| D921,359 S | 6/2021 | Roth |
| D928,764 S | 8/2021 | Yeo |
| 11,274,697 B2 | 3/2022 | Srour |
| 2003/0008680 A1 | 1/2003 | Huh et al. |
| 2004/0172162 A1 | 9/2004 | Bonney et al. |
| 2005/0277092 A1 | 12/2005 | Hwang |
| 2006/0214757 A1 | 9/2006 | Schloss et al. |
| 2007/0279852 A1 | 12/2007 | Daniel et al. |
| 2008/0153543 A1 | 6/2008 | Newman et al. |
| 2008/0315990 A1 | 12/2008 | Komatsu |
| 2010/0038514 A1 | 2/2010 | Yu |
| 2010/0081473 A1* | 4/2010 | Chatterjee ............... H02J 50/10 455/575.1 |
| 2010/0195279 A1 | 8/2010 | Michael |
| 2010/0208434 A1* | 8/2010 | Kim ..................... H04N 23/631 361/729 |
| 2010/0216397 A1* | 8/2010 | Takasu .................. G06F 1/1632 455/41.1 |
| 2010/0222110 A1 | 9/2010 | Kim et al. |
| 2010/0321899 A1 | 12/2010 | Vossoughi et al. |
| 2011/0016494 A1 | 1/2011 | Linhardt |
| 2011/0035512 A1 | 2/2011 | Morimoto |
| 2011/0036876 A1 | 2/2011 | Fathoullahi |
| 2011/0192857 A1 | 8/2011 | Rothbaum et al. |
| 2011/0216495 A1 | 9/2011 | Marx |
| 2011/0291927 A1* | 12/2011 | Slaby ............... H04M 1/72457 345/158 |
| 2012/0042476 A1 | 2/2012 | Karmatz |
| 2012/0043452 A1 | 2/2012 | Karmatz |
| 2012/0138647 A1 | 6/2012 | Norling |
| 2012/0155454 A1* | 6/2012 | Eichen .................... H04L 12/66 370/352 |
| 2012/0190406 A1 | 7/2012 | Chen |
| 2012/0262109 A1 | 10/2012 | Toya et al. |
| 2012/0274282 A1 | 11/2012 | Yoneyarna et al. |
| 2013/0003984 A1 | 1/2013 | Belfonte et al. |
| 2013/0039015 A1 | 2/2013 | Li |
| 2013/0052956 A1* | 2/2013 | McKell .................. H04M 1/05 361/679.41 |
| 2013/0164949 A1* | 6/2013 | Riering-Czekalla ......................... G06F 1/1632 439/39 |
| 2013/0177304 A1 | 7/2013 | Chapman et al. |
| 2013/0198867 A1 | 8/2013 | Ricci et al. |
| 2013/0203473 A1 | 8/2013 | Kota |
| 2013/0313252 A1 | 11/2013 | Chan |
| 2014/0034531 A1 | 2/2014 | Wang |
| 2014/0083997 A1 | 3/2014 | Chen et al. |
| 2014/0104771 A1 | 4/2014 | Colan |
| 2014/0187289 A1 | 7/2014 | Cataldo et al. |
| 2014/0233181 A1 | 8/2014 | Harms et al. |
| 2014/0317329 A1 | 10/2014 | Barnett et al. |
| 2014/0321048 A1 | 10/2014 | Kupferstein |
| 2014/0355200 A1 | 12/2014 | Thiers |
| 2015/0029352 A1 | 1/2015 | Burciaga |
| 2015/0072555 A1 | 3/2015 | Riddiford et al. |
| 2015/0076020 A1 | 3/2015 | Smith |
| 2015/0077927 A1 | 3/2015 | Barnett et al. |
| 2015/0137732 A1 | 5/2015 | Lai et al. |
| 2015/0144754 A1 | 5/2015 | ElHarar |
| 2015/0354747 A1 | 12/2015 | Jennings |
| 2016/0069512 A1 | 3/2016 | Grieve |
| 2016/0070156 A1 | 3/2016 | Alster |
| 2016/0166056 A1 | 6/2016 | Le |

(56) References Cited

U.S. PATENT DOCUMENTS

| | | |
|---|---|---|
| 2016/0230925 A1 | 8/2016 | Le Gette et al. |
| 2016/0249472 A1 | 8/2016 | Tu |
| 2016/0282192 A1 | 9/2016 | Wikstrand |
| 2016/0282907 A1 | 9/2016 | Barnett et al. |
| 2016/0363258 A1 | 12/2016 | Le Gette et al. |
| 2016/0373152 A1 | 12/2016 | Schmidt |
| 2017/0025886 A1 | 1/2017 | Rohrner et al. |
| 2017/0104359 A1 | 4/2017 | Song et al. |
| 2017/0108167 A1 | 4/2017 | Fan |
| 2017/0167669 A1 | 6/2017 | Purkiss |
| 2017/0195000 A1 | 7/2017 | Srour |
| 2017/0288445 A1 | 10/2017 | Lee et al. |
| 2017/0331318 A1 | 11/2017 | Jankins et al. |
| 2018/0051851 A1 | 2/2018 | Hobbs |
| 2018/0101197 A1 | 4/2018 | Barnett et al. |
| 2018/0146078 A1 | 5/2018 | Shin |
| 2018/0173275 A1 | 6/2018 | Barnett et al. |
| 2018/0248415 A1 | 8/2018 | Yoshizawa et al. |
| 2018/0262603 A1 | 9/2018 | Richter |
| 2018/0335178 A1 | 11/2018 | Bin et al. |
| 2018/0348541 A1 | 12/2018 | Radzwill |
| 2019/0074731 A1 | 3/2019 | Lee et al. |
| 2019/0081515 A1 | 3/2019 | Gajwala et al. |
| 2019/0081517 A1 | 3/2019 | Graham et al. |
| 2019/0243421 A1 | 8/2019 | Barnett et al. |
| 2019/0281961 A1 | 9/2019 | Peterson |
| 2020/0093231 A1 | 3/2020 | Mora et al. |
| 2020/0150721 A1 | 5/2020 | Barnett et al. |
| 2020/0162594 A1 | 5/2020 | Cantoli-Alves |
| 2020/0203975 A1 | 6/2020 | Sobh |
| 2020/0299030 A1 | 9/2020 | Fromme |
| 2020/0326030 A1 | 10/2020 | Surani et al. |
| 2020/0328017 A1 | 10/2020 | Isenberg |
| 2020/0329133 A1 | 10/2020 | Surani et al. |
| 2021/0231970 A1 | 7/2021 | Radzwill |
| 2022/0103367 A1 | 3/2022 | Yalagandula |
| 2022/0206532 A1 | 6/2022 | Barnett et al. |

FOREIGN PATENT DOCUMENTS

| | | |
|---|---|---|
| WO | 2014190574 | 12/2014 |
| WO | 2020113045 | 6/2020 |
| WO | 2020154702 A1 | 7/2020 |

OTHER PUBLICATIONS

Transmittal of International Search Report and Written Opinion issued in PCT/US2021/012813 on Mar. 26, 2021.
File History of U.S. Appl. No. 18/202,847, filed May 26, 2023.

\* cited by examiner

INTERFACE PLUG

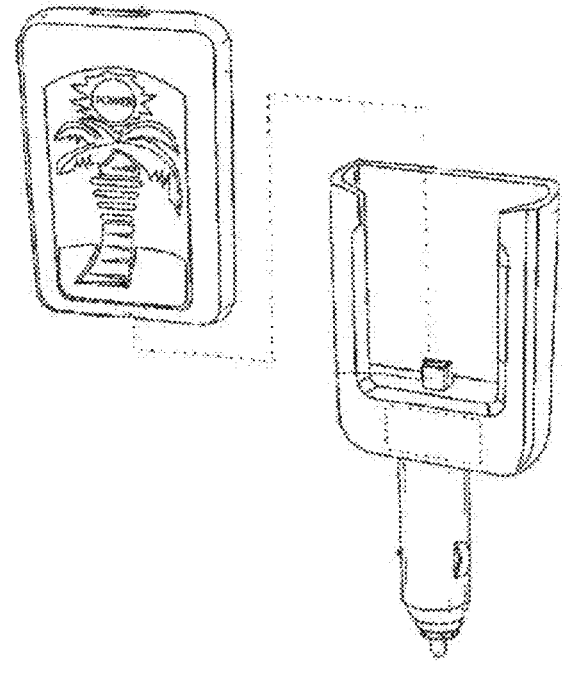
FIG. 1B (PRIOR ART)
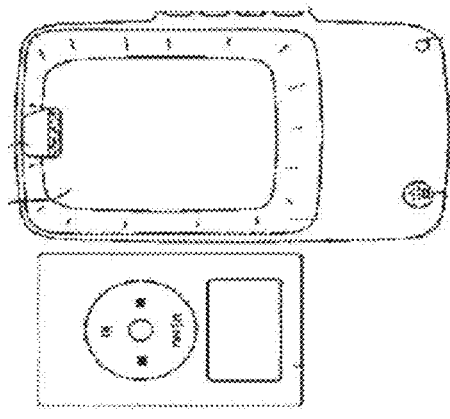
FIG. 1C (PRIOR ART)
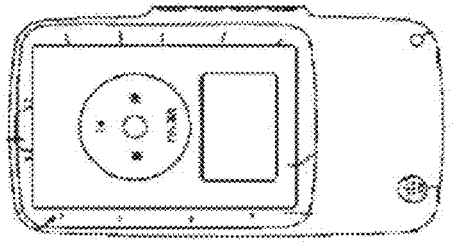

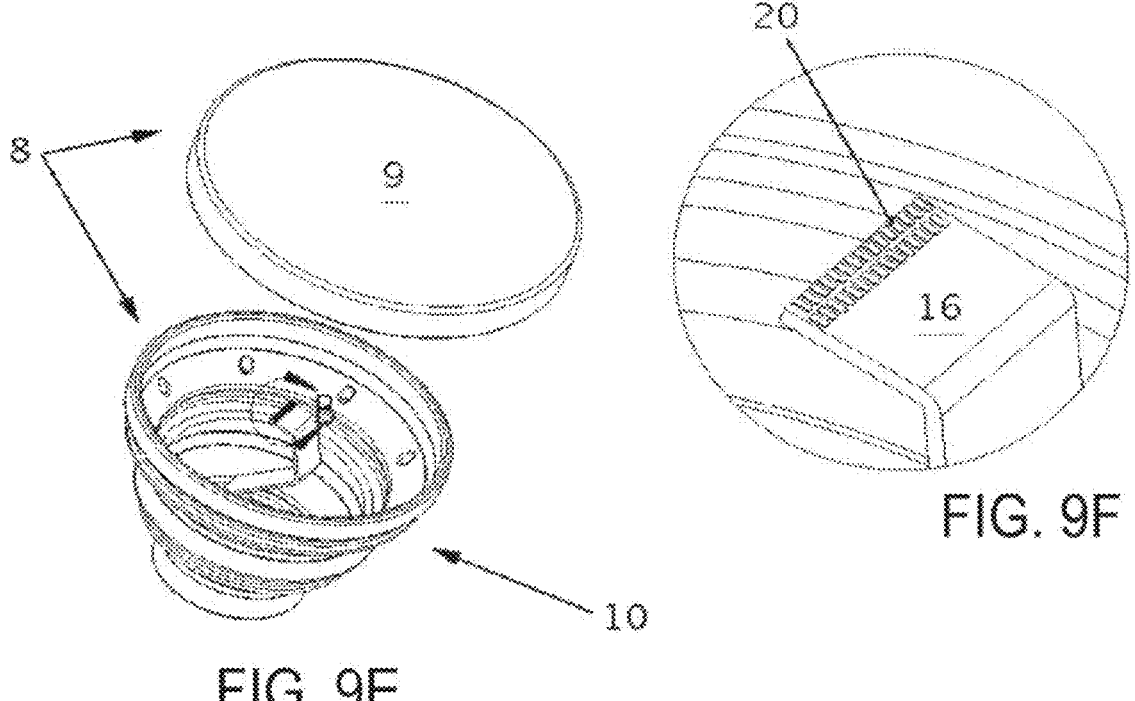
FIG. 9E
FIG. 9F
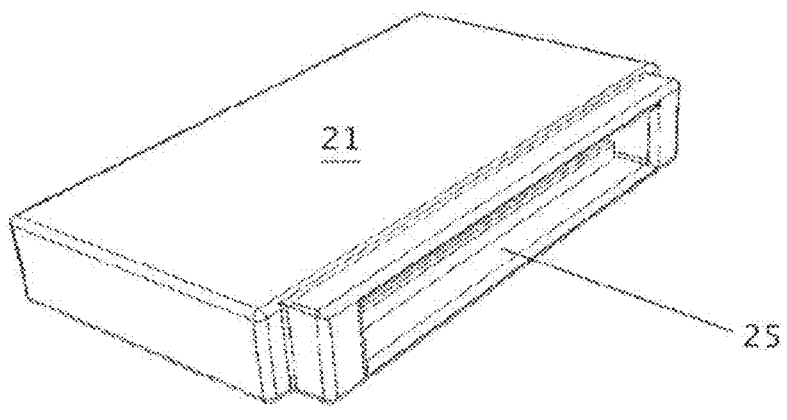
FIG. 9G

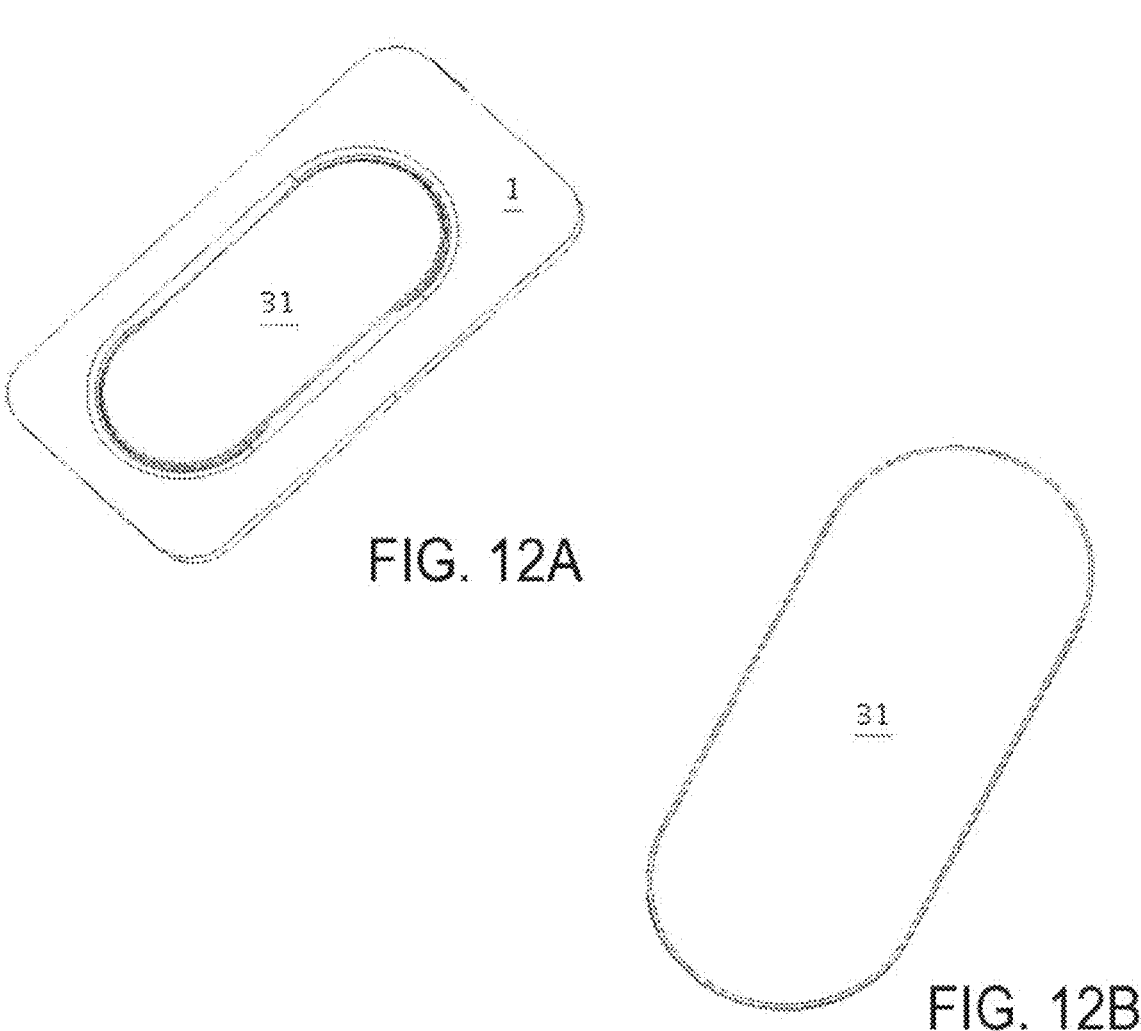
FIG. 12A
FIG. 12B
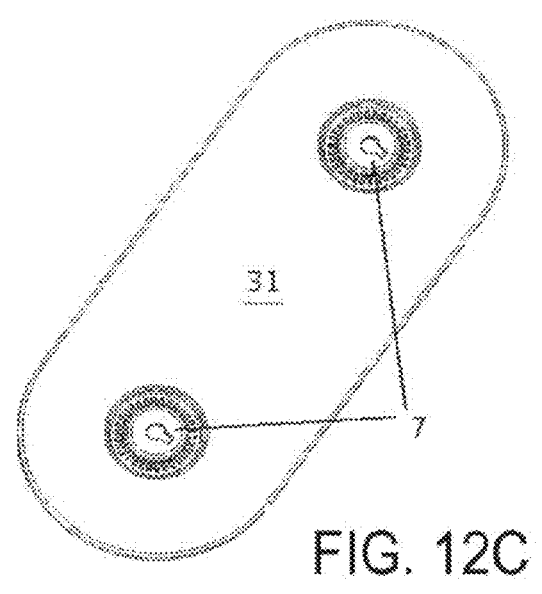
FIG. 12C

250

252

254

DOCKING CONNECTOR PLATFORM FOR MOBILE ELECTRONIC DEVICES

CROSS-REFERENCE TO RELATED APPLICATIONS

This application is a continuation-in-part of U.S. application Ser. No. 18/405,877, filed Jan. 5, 2024, which is a continuation of U.S. application Ser. No. 18/202,847, filed May 26, 2023, which is a continuation of U.S. application Ser. No. 16/745,226 filed on Jan. 16, 2020, which is a continuation of U.S. application Ser. No. 15/723,506 filed on Oct. 3, 2017, which is a continuation of U.S. application Ser. No. 14/302,203 filed on Jun. 11, 2014, which claims the benefit of U.S. Provisional Application 61/833,634 filed on Jun. 11, 2013. U.S. application Ser. No. 14/302,203 is also a continuation-in-part of Application PCT/US13/30991 filed on Mar. 13, 2013, which claims the benefit of U.S. Provisional Application 61/610,575 filed on Mar. 14, 2012.

This application is also a continuation-in-part of U.S. application Ser. No. 15/852,518, filed on Dec. 22, 2017, which is a continuation of U.S. Pat. No. 10,019,034, filed on Dec. 31, 2014, which claims the benefit of U.S. Provisional Patent Application No. 61/922,294, filed Dec. 31, 2013. U.S. application Ser. No. 15/852,518 is also a continuation-in-part of U.S. patent application Ser. No. 15/173,644, filed Jun. 4, 2016, which is a continuation of U.S. Pat. No. 9,367,090, filed on Sep. 11, 2014, which claims the benefit of International Patent Application No. PCT/US2013/030991, filed Mar. 13, 2013, which claims the benefit of U.S. Provisional Patent Application No. 61/610,575, filed Mar. 14, 2012. The entire contents of each of the foregoing applications are incorporated herein by reference in their entirety.

FIELD OF THE INVENTION

The present invention relates to docking accessories and/or platforms for mobile electronic devices.

DISCUSSION OF RELATED ART

Mobile electronic devices often comprise docking connectors, which enable the mobile electronic devices to temporarily attach to multiple external docking accessories, such as speakers and batteries, generally further enabling power and data transmission between the mobile electronic device and the docking accessories. Docking connectors are generally housed on an edge of the mobile electronic device, as opposed to one of the two major faces of a typical mobile electronic device, where the front face is generally designated by the location of a screen (should the device comprise a screen), and the back face is opposite the front face. For example, the smartphone shown in FIG. 1A has two major faces (front and back) and four relatively narrow edges, with a docking connector housed on the bottom edge.

A shortfall of housing a docking connector on the edge of a mobile electronic device is that when the device is attached to docking accessories, the resultant system is generally inconvenient for transport. For example, if the docking accessories attach by a flexible cable as shown in FIG. 1A (Prior Art), a user must manage two or more independently moving bodies along with the connecting cable. If the docking accessories instead attach in a rigid fashion (i.e., directly) to the docking connector, a user must manage an oddly shaped set. Furthermore, mobile electronic devices having a docking connector along an edge is generally reinforced/enlarged in some way, in order to counterbalance and/or support an attached accessory. For example, as shown in prior art FIG. 1B (Prior Art), mobile electronic devices may require a supportive case or extended/thickened housing in order to support rigid connection with a mobile electronic device. This again increases the effective magnitude of a mobile electronic system (device, support, accessories) to a degree that renders the resultant system inconvenient for transport.

To address the preceding transport problem, some docking accessories, such as certain supplemental batteries, are manufactured as parts of mobile electronic device cases. The resultant "docking cases" attach to mobile electronic devices, both at their docking connectors (as standard docking accessories attach) and around their various edges (as standard mobile electronic device cases attach), to enable the docking accessories to be transported securely against the back faces of the mobile electronic devices. See for example FIG. 1C (Prior Art). In a similar vein, some docking accessories are manufactured as parts of docking "sleeves" or "jackets", which attach to compatible mobile electronic devices at their side edges and at their docking connectors. See for example FIG. 1D (Prior Art). Docking cases and sleeves facilitate distribution of the weight of accessories across the relatively large back faces of mobile electronic devices, with the aim of minimizing effective increases in magnitude in any single dimension of the mobile electronic device and thus increasing convenience of transport.

However, such docking cases and sleeves have several drawbacks. First, docking cases and sleeves house a limited number of docking accessories-typically one; hence, the use of a broad range of docking accessories requires a broad range of docking cases. This creates unnecessary expense and hassle for consumers, who must purchase multiple docking cases and sleeves to acquire a broad range of docking accessories, and who must remove and replace an entire case in order to change the docking accessories that are connected to the docking connector. Second, docking cases and sleeves are compatible with only a single mobile device form factor. This creates unnecessary expense and hassle for consumers, who must (i) purchase a new docking case or sleeve each time they upgrade their mobile electronic device; (ii) purchase multiple docking cases and sleeves for multiple mobile electronic devices; and (iii) limit their choice of mobile electronic devices to only those that are compatible with an extant docking case or sleeve. Third, docking cases and sleeves do not typically allow multiple docking accessories to attach simultaneously and independently to the mobile electronic device. Some docking accessories, such as supplemental camera lenses and flashes, stereo speakers, and electrophysiology sensors, naturally work together in pairs, so there is a need for a method that enables multiple docking accessories of different types to attach simultaneously to the mobile electronic device. Furthermore, different circumstances might call for one and the same accessory to be paired with different partner accessories. For instance, a daytime circumstance might call for a supplemental camera lens accessory to be combined with a supplemental battery accessory, whereas a nighttime circumstance might call for the same camera lens to be combined instead with a supplemental flash accessory. Therefore, there is a need for a method that enables multiple docking accessories to attach both simultaneously and independently to the mobile electronic device.

To address the preceding docking-system problems, what is needed is a docking system configured to form a detachable accessory attachment to the back surface of a wide range of devices. The docking platform should be configured to form detachable attachments to multiple, independent, accessories. By allowing the volumes of attached accessories to be distributed across the relatively large surface areas of the back surfaces of mobile electronic devices, such a docking system would solve the docking-system problems presented by prior art cases and sleeves. Moreover, by having the capacity to form detachable attachments to a wide range of mobile electronic devices and cases, and by enabling multiple, independent, and differentiated accessories to attach temporarily to the mobile device, the docking system would avoid the shortfalls of the preceding solutions.

SUMMARY OF THE INVENTION

One or more embodiments described herein address the aforementioned problems by providing docking accessories and/or platforms for mobile electronic devices to enable multiple docking accessories of various shapes and sizes to simultaneously and independently attach to the mobile electronic device with the optional freedom to expand away from, and rotate at various angles to, the back face of the mobile device, and with at most a nominal increase in the effective magnitude of any one dimension of the mobile device. Furthermore, the docking platform does not require ports or other docking openings along the edges of the mobile device.

In one embodiment, a detachable accessory docking platform for a mobile electronic device enhances the functionality of the mobile electronic device with functionality supported by compatible detachable docking accessories. The detachable accessory docking platform includes a docking platform body having a front surface formed with a mobile electronic device connection system for detachably attaching to the mobile electronic device and a back surface formed with an accessory docking system for detachable attaching one or more docking accessories. Housed within some embodiments of the docking platform body are electronics including (1) non-transient memory for storing at least docking accessory initialization instructions and docking accessory related data, and (2) a processor subassembly for executing the docking accessory initialization instructions and processing the docking accessory related data. The detachable accessory docking platform may further include a first communication system connecting the electronics housed within the docking platform body and the accessory docking system for facilitating the communication of data and instructions between the electronics and the detachably attachable docking accessories. The detachable accessory docking platform may further include a second communication system connecting the electronics housed within the docking platform body and the mobile electronic device for facilitating the communication of data and instructions between the detachable accessory docking platform and the mobile electronic device.

In an embodiment, the docking platform's mobile electronic device connection system comprises a layer of sticky gel forming a detachable attachment to one of the two major faces of the docking platform.

In an embodiment, the docking platform's mobile electronic device connection system is selected from the group consisting of a sticky gel, a magnetic element cooperating with magnetic elements on the mobile electronic device, a snap fit structure cooperating with a mating span fit structure on the mobile electronic device, a suction cup, micro-suction tape, a spring-clip mechanism cooperating with a spring-clip mechanism on the mobile electronic device, slot-hole key mechanism cooperating with a mating slot-hole key mechanism on the mobile electronic device, reusable adhesive, slide-lock mechanisms cooperating with a mating slide-lock mechanism on the mobile electronic device, and screw/bolt cooperating with a matching hole on the mobile electronic device.

In an embodiment, the docking platform's mobile electronic device connection system includes a mechanical-magnetic attachment for both mechanically and magnetically securing the docking platform to the mobile electronic device.

In an embodiment, the docking platform's electronics are formed with a power subassembly having one or more of power storage components, power transmitting components, and power receiving component.

In an embodiment, the docking platform's power storage components include a battery and the power transmitting components and the power receiving components include a wireless charging interface and charging coil.

In an embodiment, the docking platform's electronics are formed with a signal processing subassembly for signal transfer, processing, and amplification.

In an embodiment, the docking platform's signal processing subassembly is configured to process digital and/or analog signals sent from one or more docking accessories or the mobile electronic device.

In an embodiment, the docking platform's electronics include a wireless communication subassembly for cooperating with one or both of the first and second communication system to provide wireless communication to one or both of the docking accessory and the mobile electronic device.

In an embodiment, the docking platform's processor subassembly executes instructions for offloading functionality from the detachable accessory docking platform to the mobile electronic device.

In an embodiment, the docking platform's offloaded functionality includes offloading communication functionality, processing functionality, display functionality, and data storage.

In an embodiment, the docking platform's processor subassembly and the mobile electronic device cooperate to offloading functionality from the mobile electronic device to the detachable accessory docking platform.

In an embodiment, the docking platform's offloaded functionality includes offloading communication functionality, processing functionality, signal processing functionality, data storage, and functionality specific to one or more docking accessories.

In an embodiment, the docking platform's accessory docking system comprises two accessory docking connectors configured to enable two docking accessories to simultaneously and independently attach to the docking platform.

In an embodiment, the docking platform's mobile electronic device connection system is formed to enable the docking platform to form detachable attachments to surfaces of objects other than mobile electronic devices.

In an embodiment, the docking platform's accessory docking system comprises two accessory docking connectors configured to enable two docking accessories to simultaneously attach to the docking platform and the processor subassembly executes instructions stored in the non-transient memory for cooperatively operating the two docking accessories.

In an embodiment, the docking platform's power subassembly is configured to transfer power between the docking platform and one or both of the mobile electronic device and one of more attached docking accessories.

In an embodiment, the docking platform includes at least two electrical contacts within the accessory docking system, the contacts electrically connected to the electronics via the first communication system and constructed and arranged to allow electrical communication between the docking accessory and the electronics of the docking platform.

In an embodiment, the docking platform's docking accessory comprises one of the following: a speaker, a battery, an electrophysiology sensor, a game controller, a solar charger, a supplemental lens, a camera, a supplemental flash, a supplemental keyboard, or a weather sensor.

In an embodiment, the docking platform's accessory docking system is configured to enable docking accessories to be attached in more than one orientation relative to the accessory docking system and the processor subassembly executes instructions stored in non-transient memory for selecting one of plurality of docking accessory capable functionalities based on the attached orientation of the docking accessory.

In an embodiment, the accessory docking platform performs the method of establishing an authenticated communication link between one or more docking accessories to a docking platform. The method includes the steps of determining a docking accessory is attached to the docking platform and if the attached docking accessory is electrically attached to the docking platform. The method then determines if the attached docking accessory is a wireless docking accessory. An authenticated communication link between the docking platform and the docking accessory is then established. The method then determines the type and functionality of the linked docking accessory and determining the inter-operability and/or intra-operability of attached accessories if more than two accessories are attached. A similar method may be utilized to establish an authenticated communication link between the accessory docking platform and a mobile electronic device.

In certain embodiment, a docking accessory system for a mobile electronic device include a platform that comprises (i) a docking-connector magnetic-attachment system formed beneath an external back surface of the platform, wherein the docking-connector magnetic-attachment system has an annular shape and comprises a magnetic element, (ii) an internal back portion opposite the external back surface of the platform, wherein the internal back portion faces a back surface of the mobile electronic device when coupled to the mobile electronic device, and (iii) a side portion that extends around at least a portion of a side of the mobile electronic device adjacent to the back surface of the mobile electronic device when the platform is coupled to the mobile electronic device. The system may further comprise an accessory operable as a stand for the mobile electronic device, and a power accessory configured to wirelessly transfer power to the mobile electronic device.

In certain embodiments, the mobile electronic device is configured to identify the power accessory based on accessory information that is wirelessly received from the power accessory.

In certain embodiments, the mobile electronic device is configured to perform a function based on the accessory information.

In certain embodiments, the function is specific to a type of the power accessory.

In certain embodiments, the mobile electronic device is configured to make a determination as to whether the power accessory is magnetically attached to the mobile electronic device before performing the function based on the accessory information provided by the power accessory.

In certain embodiments, the power accessory is configured to detachably attach to the platform.

In certain embodiments, the power accessory comprises a first magnetic docking-connector portion operable to form a detachable attachment with the docking-connector magnetic-attachment system of the platform.

In certain embodiments, the stand accessory is an extendable accessory configured to selectively extend outward from the platform and to retract back to the platform.

In certain embodiments, the stand accessory is configured to detachably attach to the platform.

In certain embodiments, the stand accessory comprises a second magnetic docking-connector portion operable to form a detachable attachment with the docking-connector magnetic-attachment system of the platform.

In certain embodiments, the mobile electronic device is configured to make the determination as to whether the power accessory is magnetically attached to the mobile electronic device based on wireless communication with the power accessory using a wireless communication standard having a range of no greater than 4 cm.

In certain embodiments, the power accessory comprises an accessory body, and wherein the detachable attachment of the first magnetic docking-connector portion to the docking connector magnetic attachment system is radially inward from outer edges of the accessory body.

In certain embodiments, the docking-connector magnetic-attachment system comprises an aligning element distinct from the magnetic element, wherein the aligning element and the magnetic element are configured to jointly orient one or more compatible docking accessories on the external back surface of the platform.

In certain embodiments, the docking-connector magnetic-attachment system comprises an aligning element distinct from the magnetic element, wherein the aligning element and the magnetic element are configured to jointly orient compatible docking accessories on the external back surface of the platform.

In certain embodiments, the docking-connector magnetic-attachment system comprises an aligning element distinct from the magnetic element, wherein the aligning element and the magnetic element are configured to jointly orient compatible docking accessories on the external back surface of the platform.

In certain embodiments, a docking-accessory platform is configured to couple to a mobile electronic device. The platform includes a front surface and a back surface opposite the front surface of the platform. The back surface of the platform faces a back of the mobile electronic device when the platform is coupled to the mobile electronic device. The platform also includes a docking connector that comprises a cavity, where the docking connector comprises an annular magnetic attachment system formed beneath the front surface of the platform. The annular magnetic attachment system comprises a magnet and is (i) centered laterally on the platform and (ii) configured to form detachable magnetic attachments to compatible docking accessories.

BRIEF DESCRIPTION OF THE DRAWINGS

FIG. 1B shows a prior art device with an end connector and a rigid partial-case accessory.

FIG. 1C shows a prior art device with an end connector and a rigid full-case accessory.

FIG. 9E is an exploded, top perspective view of the expandable accessory of FIG. 9A, according to an embodiment.

FIG. 9F is a detail view of a flex circuit of the expandable accessory of FIG. 9E, in an embodiment.

FIG. 9G is a perspective view of the female connector of FIG. 9D.

FIG. 12A is a back perspective view of the mobile electronic device of FIG. 2A with a docked supplemental battery accessory, according to one embodiment.

FIG. 12B is a top view of the supplemental battery accessory of FIG. 12A.

FIG. 12C is a bottom view of the supplemental battery accessory of FIG. 12A, in an embodiment.

DETAILED DESCRIPTION OF THE INVENTION

Figure 1A:
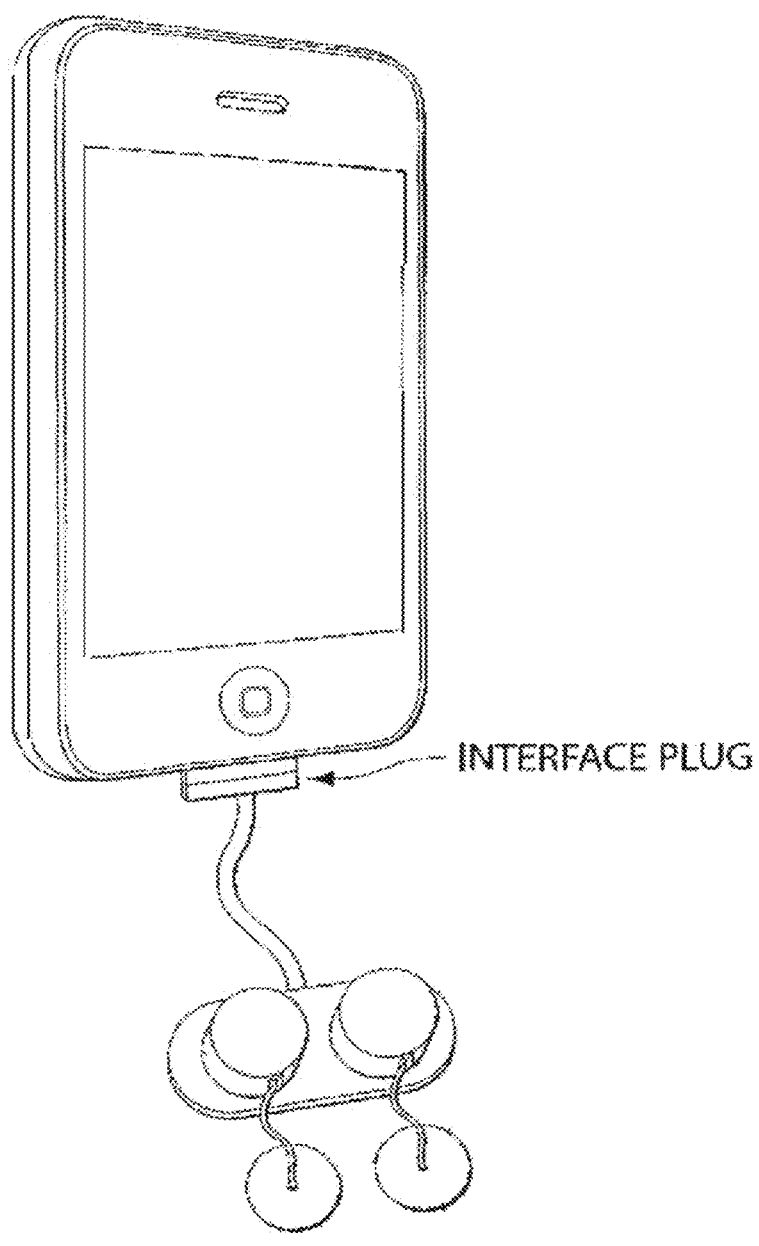
FIG. 1A shows a prior art cell phone device with a typical end connector and a cable-connected accessory.
Figure 1D:
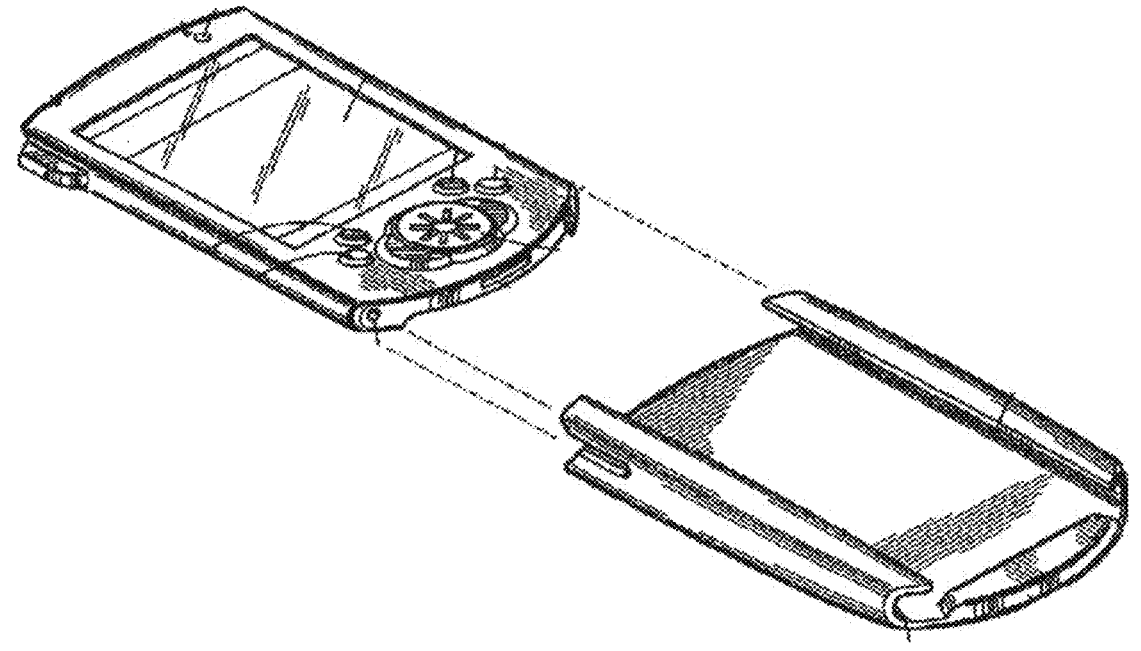
FIG. 1D shows a prior art device and associated docking sleeve, which are specially adapted to mate with each other.
Figure 1E:
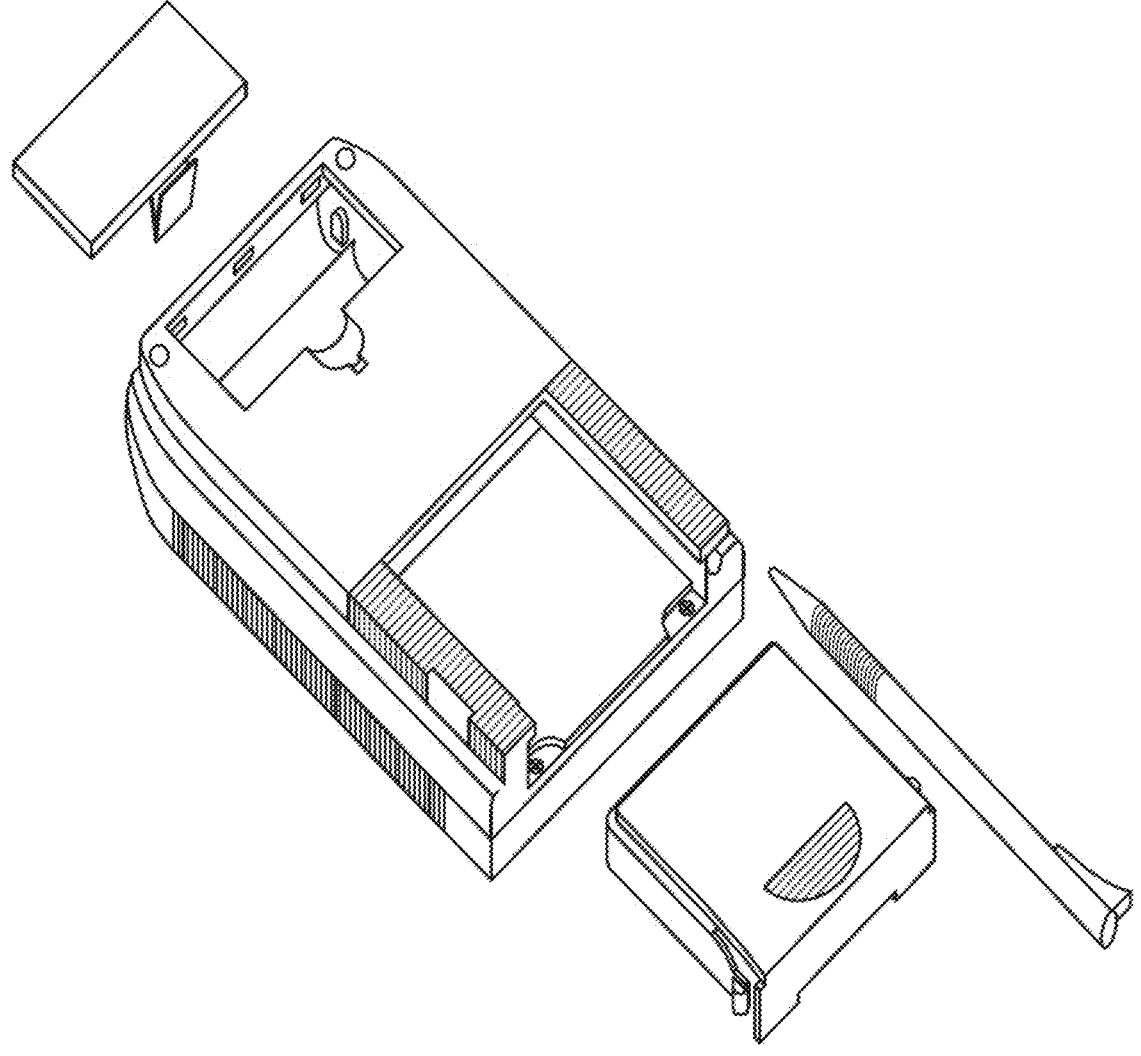
FIG. 1E shows a prior art device and a rectangular dummy accessory.

One advantage of the present invention is that it allows multiple docking accessories to attach to a mobile electronic device. It will be appreciated that mobile electronic devices include but are not limited to those devices that can be handheld, worn, carried, etc. Some docking accessories, such as supplemental camera lenses and flashes, stereo speakers, and electrophysiology sensors, naturally work together in pairs. As such, certain embodiments also fulfill the need for enabling multiple docking accessories to attach simultaneously to the mobile electronic device. Furthermore, a first accessory may be paired with a second partner accessory in one circumstance and a different, third partner accessory in a second circumstance. For instance, a daytime circumstance might call for a supplemental camera lens accessory to be combined with a supplemental battery accessory, whereas a nighttime circumstance might call for the same camera lens to be combined instead with a supplemental flash accessory. One or more embodiments enable multiple docking accessories to attach both simultaneously and independently to the mobile electronic device.

Some embodiments of the present invention, as shown herein, are directed to mobile electronic devices having docking connectors. One of these embodiments includes a docking platform formed at one of the largest-surface-area surfaces, i.e., a selected surface, of the mobile electronic device. In the present embodiment, the selected surface is the back surface of the device. In a separate embodiment, the selected surface may be the front, screen supporting surface. The docking platform is formed with a docking connection system which includes one or more docking connectors generally disposed in a recessed docking accessory cavity. The docking connection system is configured to enable the recessed docking accessory cavity to be open only at the selected surface.

In some embodiments, the recessed docking accessory cavity enables one or more docking accessories to be attached to the docking connectors without significantly increasing the effective carrying size of the mobile electronic device. Docking accessories are manufactured to couple with the recessed docking accessory cavity such that, when the docking accessory is in at least one mode of operation, the outer surface of the docking accessory is generally co-planar with the selected surface of the mobile device.

In one embodiment, the docking connection system is formed to accommodate a broad range of docking accessories. In the same or separate embodiment, the docking connection system is operable to form a detachable attachment to multiple independent docking accessories simultaneously. In the same or separate embodiment, the docking connection system is operable to form a detachable attachment to one docking accessory via two or more recessed docking accessory cavities. In the same or separate embodiment, the docking connection system may be operable to form a detachable attachment radially inward from the outer edges of a circular accessory, to allow the body of the accessory to temporarily expand away from the docking platform by way of an expandable conical accordion mechanism, whereby the foot, or narrowest part of the accordion, which is located radially inward from the edges of the accordion, forms the attachment point to the docking connection system, and the mouth, or widest part of the accordion, forms an attachment to the body of the accessory. The range of docking accessories that may cooperate with the docking platform includes, by way of example, batteries, solar panels, game controls, LED lights, hand-crank chargers, weather sensors, camera flashes, camera lenses, electrophysiology sensors, memory cards, keyboards, massage paddles, glucose monitors, body fat monitors, breathalyzers, ultrasound transducers, and pulse oximeters. This list of possible docking accessories in not meant to be limiting in any way, but is merely meant to demonstrate the wide range of possible devices and technologies that may functionally cooperate with the present docking platform.

In one or more embodiments, the docking platform is integrally formed with the body of the mobile electronic device. In a related embodiment, the docking platform is integrally formed with one aspect of the mobile electronic device, e.g., the back cover. The docking platform may be formed with an accessory cavity that has a generally oval shape. In one embodiment, the generally oval or capsule shaped accessory cavity (herein after, "oval shaped accessory cavity") supports two circular cavities formed at opposing ends of the oval shaped accessory cavity. Optionally, a depressed region constituting the middle portion of the oval cavity may be formed between the two circular cavities. Each of the two circular cavities may include a docking connector, for example, an annular docking connector disposed at its center. A docking connector may be formed with a connection mechanism, electrical contacts for communication one or both of data and power, and an optional alignment mechanism. For example, in the annular docking connector embodiment, each docking connector may be formed with (i) an annular female snap-fit feature, for attaching docking accessories securely to the docking platform; (ii) 30 electrical contacts disposed evenly around the inner edge of the female snap-fit feature, for transmission of power and data to and from docking accessories; and (iii) a male index key, to ensure that the electrical contacts on a docked accessory mate with the appropriate contacts on the docking connectors. The electrical contacts are formed of gold-plated nickel-plated copper, with copper pads, and the remainder of the platform is formed of the same hard material as the rest of the body of the mobile electronic device. Other connection mechanisms, electrical contacts for communication one or both of data and power, and alignment mechanism may be used without departing from the scope herein.

One skilled in the art will appreciate other possible embodiments, which vary in (i) shape of platform; (ii) size of platform; (iii) number of docking accessory cavities; (iv) shape of docking accessory cavities; (v) size of docking accessory cavities; (vi) number of docking connectors; (vii) shape of docking connectors; (viii) size of docking connectors; (ix) mode of attachment of docking connectors to docking accessories; (x) configuration of electrical contacts; (xi) number of electrical contacts (including zero); (xii) mode of attachment of platform to the body of the mobile electronic device; and (xiii) materials of the platform and its components. These variations are merely that, possible variations of the present invention, which exemplify only some of the possible alternative forms the present invention may take. In addition, these variations are not meant to be limiting in any way.

An embodiment of the docking platform is formed in a selected one of two largest-surface-area surfaces of a mobile electronic device and comprises a primary recess formed within the selected surface. The primary recess forms a docking accessory cavity and may further support one or more further recesses. The docking accessory cavity supports a docking connection system, which houses one or more docking connectors. One or both of the docking accessory cavity and the docking connectors releasably connect to at least two independent docking accessories simultaneously, the docking connection system constructed to enable the docking accessory cavity to be open only at the selected surface.

In one or more embodiments, the docking connection system is operable to form a detachable attachment to a docking accessory without fixing the outer edges of the accessory.

In one or more embodiments, the docking platform may be formed with two or more electrical contacts within the docking accessory cavity. One or more of the electrical contacts electrically connected to electronics within the mobile electronic device and constructed and arranged to allow electrical communication to the docking accessory when the docking accessory is attached to the docking connector.

In one or more embodiments, the docking platform may be configured to enable power and data transmission between the mobile electronic device and the docking accessories by electrical connection to the docking accessories. Alternatively, the mobile electronic device may enable at least one of power or data to be transmitted between the mobile device and the accessories through wireless technology.

In one or more embodiments, the docking connection system may be configured to form a detachable mechanical bond with docking accessories. Alternative, the docking connection system may be configured to form a detachable magnetic bond with docking accessories. In addition, micro friction surfaces, high friction surfaces, or protrusions and/or cutouts can be integrated into one or both of a magnetically attached accessory and its mating surface to inhibit motion in the perpendicular and rotational directions, relative to the normal force direction, thus further securing the accessory to the docking platform. These features can also be used to enable one of a plurality of accessory mounting orientations. In a further embodiment, switchable magnet may be used to selective attach an accessory to a docking platform or other magnetic/metal surface.

In one or more embodiments, the docking connection system may be configured to support a single docking connector operable to form a detachable attachment to two or more independent docking accessories simultaneously. In one example, the docking connection system might comprise a single magnetic element operable to form a detachable magnetic attachment to two or more independent docking accessories simultaneously. Alternatively, the docking connection system may be configured to support more than one docking connector jointly operable to form a detachable attachment to two or more independent docking accessories simultaneously.

In one or more embodiments, the docking connector may be generally circular.

In one or more embodiments, the docking accessory cavity might be elongated.

In one or more embodiments, docking accessories may operate in a first mode of operation when connected to the docking platform and in a second mode of operation when remote from the mobile electronic device. The modes of operation depend on the type and functionality of the docking accessory.

In one or more embodiments, the selected surface in which the docking platform and an outwardly facing surface of the docking accessory are substantially flush when the docking accessory is attached to the docking connection system.

In one or more embodiments, the selected surface in which the docking platform and an outwardly facing surface of the docking accessory are substantially flush when the docking accessory is attached to the docking connection system and in one or a plurality of physical or operational modes.

In one or more embodiments, a docking system according to one or more embodiments includes a docking platform formed in a selected one of two largest-surface-area surfaces of a mobile electronic device. The docking system is formed with a recessed docking accessory cavity that supports a docking connection system. The docking connection system is configured to form a detachable attachment to at least two independent docking accessories simultaneously. The docking connection system manufactured such that the docking accessory cavity only opens at the selected surface. Optionally, two or more electrical contacts are formed within the docking accessory cavity and the electrical contacts are in electronic communication with electronics within the mobile electronic device. A docking accessory, constructed and arranged to form a detachable attachment to the docking connection system, is formed to facilitate the transmission of one or both of data and power between the mobile electronic device and the docking accessory.

In one or more embodiments, the docking connection system may be operable to form an attachment with a docking accessory without fixing the positions of the outer edges of the attached accessory.

In one or more embodiments, the docking accessory may be constructed and arranged to support an electrical connection with electrical contacts within the docking connection system when the docking accessory is attached to the docking connection system.

In one or more embodiments, the docking system is configured with an accordion structure extendable outwardly from the selected surface and retractable inwardly toward the selected surface. In some embodiments, the accordion's distal end supports a docking accessory body. The accordion structure may be manufactured with a flexible circuit, for example, a flat flex circuit or a flexible cable, disposed within the accordion structure to enable electrical connection between the docking accessory body and the mobile electronic device.

In one or more embodiments, the docking accessory body is domed-shaped and/or formed with outer edges that are eased edges or tapered edges. These shape characteristics may reduce the likelihood of catching the docking accessory on an objects or clothing.

In one or more embodiments, the docking accessory may be formed as a battery, a solar panel, a game control, an LED light, a hand-crank charger, a weather sensor, a camera flash, a camera lens, an electrophysiology sensor, a memory card, a keyboard, a massage paddle, a glucose monitor, a body fat monitor, a breathalyzer, an ultrasound transducer, or a pulse oximeter, among other docking accessories.

In one or more embodiments, a docking accessory system for a mobile electronic device according to one or more embodiments is formed with a docking accessory body, an accordion structure constructed to attach to a selected one of two largest-surface-area surfaces of the mobile electronic device. The accordion structure is capable of extending outward from the selected surface and retracting back toward the selected surface. The accordion's distal end may be attached to the docking accessory body, and the docking accessory includes electronics for transmitting at least one of data or power between the accessory and the mobile electronic device. In certain embodiments, the docking accessory system may additionally include a flexible circuit located within the accordion structure and configured to electrically connecting docking accessory body and the mobile electronic device.

In one or more embodiments, a method of providing attachment of a docking accessory to a mobile electronic device according to one or more embodiments may be accomplished by the following. A recessed docking accessory cavity is formed within a selected one of two largest-surface-area surfaces of the mobile electronic device. A docking connection system is formed within the docking accessory cavity. The connection system is constructed and arranged to form a detachable attachment to a docking accessory. The docking accessory cavity is formed to open only at the selected surface, and enables the attached docking accessory to temporarily extend away from, and articulate at various angles to, the selected surface of the mobile electronic device.

Those skilled in the art will appreciate that configurations similar to embodiments shown and described herein may be used without departing form the scope herein.

One or more embodiments of the present invention are directed to mobile electronic devices having docking connectors. A device according to one or more embodiments includes a docking platform formed at one of the largest-surface-area surfaces of the device, generally the back face of the device. The docking platform is formed with a docking connection system, which includes one or more docking connectors. In one example, each docking connector supports at least one element for releasably attaching to compatible docking accessories. The docking connection system may be formed to enable multiple docking accessories to attach simultaneously and independently to the mobile electronic device without fixing the outer edges of the accessories. The docking platform may also enable docking accessories to attach to the mobile device without significantly increasing the effective carrying size of the mobile device by enabling the volumes of the attached docking accessories to be distributed, for example, across a portion of or the entirety of the selected surface, and not by the formation of an accessory cavity in the mobile device. The docking platform is configured to accommodate a broad range of shapes and sizes of docking accessories. The range of docking accessories that might be accommodated by the docking platform includes, for example, batteries, solar panels, game controls, LED lights, hand-crank chargers, weather sensors, camera flashes, camera lenses, electrophysiology sensors, memory cards, keyboards, massage paddles, glucose monitors, infrared fat monitors, breathalyzers, ultrasound paddles, and pulse oximeters. This list is merely meant to show some of the many possible docking accessories, and is not meant to be limiting in any way.

In one embodiment, the docking platform is integrally formed with the body of a mobile electronic device. The docking platform includes a docking connection system, formed with a docking connector. The docking connector supports an elongated magnetic connection element formed, for example, beneath the outermost surface of a back face of the mobile electronic device, for temporarily attaching docking accessories securely to the docking platform. In one embodiment, the docking connector supports two sets of nine electrical contacts, which facilitate the transmission of power and data to and from docking accessories. The electrical contacts may be formed of gold-plated nickel-plated copper, with copper pads. Each set of nine contacts may be arranged in a generally circular fashion, with each contact disposed within a contact cavity for protecting the contact and for providing lateral stability to an attached docking accessory. In one or more present embodiments, the contact cavity is generally circular in shape. Optionally, one cavity may be oval in shape and serves as a female index key, to ensure that the electrical contacts on a docked accessory mate with the appropriate contacts on the docking connectors. The docking platform may be substantially formed of a hard material. In an embodiment, the docking platform is formed of the same material as the body of the mobile electronic device.

Other embodiments may include variations in (i) number of docking connectors; (ii) shape of docking connectors; (iii) size of docking connectors; (iv) number of electrical contacts (including zero); (v) configuration of electrical contacts; (vi) number and configuration of electrical contact cavities; (vii) mode of attachment of platform to the body of the mobile electronic device; (viii) materials of the platform and its components.

In one or more embodiments, the docking platform may be formed in a selected one of two largest-surface-area surfaces of a mobile electronic device and includes a docking area, a docking connection system formed therein. The docking connection system may be configured with either one or more docking connectors having a magnetic element for removably attaching docking accessories. The docking connection system may be configured to form a detachable attachment with at least two docking accessories independently and simultaneously. Optionally, the docking connection system utilizes two or more electrical contacts within the docking area to connect docking accessories to electronics within the mobile electronic device. The electrical contacts may be constructed and arranged to facilitate an electrical connection between the docking accessory and the docking connector.

In one or more embodiments, the docking connector system may include an electrical contact cavity formed to protect electrical contacts therein and for providing lateral stability to docked accessories. The electrical contact cavity may be formed and configured to house one electrical contact, or alternatively, may be formed and configured to house more than one electrical contact.

In one or more embodiments, the docking connector system may include a single docking connector configured to form a detachable attachment to two or more docking accessories simultaneously and independently. In a separate embodiment, the docking connector system may include more than one docking connector jointly operable to form a detachable attachment to two or more docking accessories simultaneously and independently. In a separate embodiment, the docking connector system may include more than one docking connector, for example, two docking connectors, formed to cooperatively form a detachable attachment to one docking accessories. In each case, the docking connector system may support the transmission of one or both of power and data between the docking connector system and the one or more docking accessories.

In one or more embodiments, the docking connection system may include an aligning element for aligning the docking accessory.

In one or more embodiments, electrical contacts may be biased to form an electrical connection with the docking accessory when the docking accessory is attached to the docking connector.

In one or more embodiments, the docking system according to one or more embodiments comprises a docking platform formed in a selected one of two largest-surface-area surfaces of a mobile electronic device (comprising a docking area, a docking connector formed within the docking area, the docking connector comprising a magnetic element for bonding with docking accessories, and optionally two (or more) electrical contacts within the docking area, the contacts electrically connected to electronics within the electronic device), and a docking accessory constructed and arranged to form a detachable attachment to the docking connector, the docking accessory further constructed to allow at least one of either data or power transmission between the mobile electronic device and the docking accessory, the docking accessory optionally further constructed and arranged to allow electrical connection to the electrical contacts of the docking connector when the docking accessory is attached to the docking connector.

In one or more embodiments, the docking system may further include an accordion formed to extend outwardly from the docking connector and retract back toward the docking connector. The accordion's distal end is attached to the docking accessory body. A flexible circuit, such as a flat flex circuit or a flexible cable), may be configured within the accordion and connected between the electrical contacts and the docking accessory body, to provide one or both of power transmission and data transmission between the docking system and the docking accessory.

Some possible docking accessories include, but are not limited to, a battery, a solar panel, a game control, an LED light, a hand-crank charger, a weather sensor, a camera flash, a camera lens, an electrophysiology sensor, a memory card, a keyboard, a massage paddle, a glucose monitor, an infrared fat monitor, a breathalyzer, an ultrasound paddle, and a pulse oximeter. This list is not meant to be exhaustive in any way, but is only meant to demonstrate some of the many possible accessories that may be adapted to present docking system.

In one or more embodiments, the detachable docking accessory system for a mobile electronic device according to one or more embodiments includes a docking accessory body, an accordion structure constructed to attach magnetically to a selected one of two largest-surface-area surfaces of the mobile electronic device configured to extend outwardly from the selected surface and retract back toward the selected surface. The accordion's distal end is attached to the docking accessory body. Optionally, a flexible circuit is configured within the accordion and provides electrical connection between the mobile electronic device and the docking accessory body.

In one or more embodiments, the detachable docking accessory system for the mobile electronic device according to one or more embodiments includes a docking accessory constructed, without an accordion, to attach magnetically to a selected one of two largest-surface-area surfaces of the mobile electronic device and optionally configured to electrically connect to the mobile electronic device.

One possible method of providing a docking accessory attachment for a mobile electronic device according to one or more embodiments may be accomplished by forming a docking connector with a magnetic element for detachably mating with a compatible docking accessory. The docking accessory is attached at a selected one of two largest-surface-area surfaces, for example the back surface, of the mobile electronic device.

The method of providing a docking accessory attachment for a mobile electronic device may further include forming two or more electrical contacts within the selected surface, and electrically connecting the contacts to electronics within the mobile electronic device. Additional step may include, forming an electrical contact cavity, forming a magnetic attachment for a docking accessory within the docking connector, and electrically connecting the docking accessory to the electrical contacts. Optionally, two or more docking connectors may be formed within the docking area.

Those skilled in the art will appreciate that configurations similar to embodiments shown and described herein may be used.

One or more embodiments of the present invention are directed to a docking platform system comprising a docking platform and compatible electronic and/or mechanical docking accessories, the docking platform configured to detachably attach to a mobile electronic device and further configured to enable detachable attachment of a variety of docking accessories to the docking platform.

The docking platform includes a mobile electronic device connection system for mechanically, and optionally electrically, temporarily mating the docking platform to a mobile electronic device. The docking platform and mobile electronic device connection system may be formed to attach to one of the largest-surface-area surfaces of the mobile electronic device, generally the back surface of the mobile electronic device. Portions of the docking platform may be formed to attach to the back surface of a mobile electronic device case (or partial case) or may be formed to attach to the sides or front edges of the mobile electronic device. Optional electrical contacts may be used to transfer power, data, and/or signals between the docking platform and the mobile electronic device. The docking platform may, in some embodiments, communicate wirelessly with the mobile electronic device. The docking platform may further wirelessly receive power from, or provide power to, a mobile electronic device or may receive power from a compatible wireless charging device.

The docking platform additionally includes an accessory docking system for mechanically, and optionally electrically, mating one or more docking accessories to the docking platform, and the accessory docking system may be configured to enable a plurality of docking accessories to attach simultaneously and independently to the docking platform. Optional electrical contacts may be used to transfer power, data, and/or signals between docking accessories and the docking platform. Docking accessories may, in some embodiments, communicate wirelessly with the docking platform and/or with a mobile electronic device. Docking accessories may wirelessly receive power from, or provide power to, the docking platform or mobile electronic device or may receive power from a compatible wireless charging device.

The docking platform may comprise a power transfer or power source for docking accessories and may house additional electronic subsystems.

In one embodiment, the docking platform may be formed as a thin and flat (or thin and gently contoured) platform. Such a docking platform, combined with docking accessories formed to be distributed across a significant portion of the back surface of the docking platform, enables accessory attachment without significantly increasing the effective carrying size of the mobile electronic device.

The docking platform may be formed to accommodate a broad range of shapes, sizes, and types of docking accessories. The range of docking accessories that might be accommodated by the docking platform includes, for example, batteries, solar panels, wireless chargers, wireless charging receivers, game controls, LED lights, hand-crank chargers, weather sensors, particulate sensors, chemical sensors, pressure and weight sensors, camera flashes, camera lenses, electrophysiology sensors, memory cards and storage devices, keyboards, robotic mechanisms, glucose monitors, infrared fat monitors, breathalyzers, massage paddles, ultrasound paddles, pulse oximeters, speakers, headphones, headphone cable interfaces, general cable interfaces, stands, surface attachment mechanisms (suction cups, clips, etc.), and authorization devices, among other accessories.

Robotic mechanisms include but are not limited to, ground, air, and water maneuverable devices wired or wirelessly linked to a docking platform or mobile electronic device of the present invention. Robotic mechanisms may even support their own docking accessories as disclosed herein.

In one embodiment, the docking platform comprises a layer of polyurethane sticky gel, the sticky gel attached permanently to one of the two major surfaces of the docking platform and configured to form detachable attachments to external smooth surfaces, including the back surfaces of typical mobile electronic devices and their cases.

In one embodiment, the accessory docking system of the docking platform comprises a docking connector comprising an elongated magnetic element (or magnetic attracting element) formed on or within the docking platform, for temporarily attaching docking accessories securely to the docking platform, and two sets of nine electrical contacts, for transmission of power and data to and from docking accessories. The electrical contacts are formed of gold-plated nickel-plated copper, with copper pads. Each set of nine contacts is arranged in a generally circular fashion, with each contact disposed within a contact cavity for protecting the contact and for providing lateral stability to attached docking accessories. The contact cavities are generally circular in shape, except for one that is oval and serves also as a female index key, to ensure that the electrical contacts on a docked accessory mate with the appropriate contacts on the docking connectors. The remainder of the docking platform is formed of plastic or aluminum. The docking platform is constructed to allow (i) wireless transmission of data between the mobile electronic device and attached docking accessories and (ii) power transmission between the platform and attached docking accessories.

In one embodiment, the detachable docking platform is attached to the body of the mobile electronic device during the manufacture and assembly of the mobile electronic device.

In some embodiments, the detachable docking platform comprises a mobile electronic device case and/or comprises elements that extend over the narrow sides and/or front edges of the mobile electronic device (or portions of sides and edges, thereof). In one embodiment, the detachable docking platform extends along one or more sides or corners of the mobile electronic device as a means of attachment and optionally as a means of protecting the device.

In some embodiments, the detachable docking platform body may cover the entire back surface of the mobile electronic device or only part of the back surface of the device.

In one embodiment, the detachable docking platform is configured to conform to a cavity formed on the back surface of a compatible mobile electronic device. In one embodiment, the detachable docking platform body includes cut-outs corresponding to features of compatible mobile electronic devices, such as lenses, flashes, and logos.

In some embodiments, the mechanism for attaching the docking platform to the mobile electronic device is designed to prevent unintended or unauthorized release of the platform from the device; examples of such mechanisms include tamper-resistant screws, snap-fits, slot-releases, hole-releases, or key-releases.

Other embodiments include variations in (i) number of accessory docking system attachment areas; (ii) number of electronic mobile device connection system attachment areas; (iii) shape of connectors; (iv) size of connectors; (v) number of electrical contacts (including zero); (vi) configuration of electrical contacts; (vii) number and configuration of electrical contact cavities; (viii) mode of detachable attachment of the docking platform to the mobile electronic device (for example, snap-fit, magnetic bond, suction cup, micro-suction tape, spring-clip mechanism, slot-hole key release, reusable adhesive, slide-lock, or screw); (ix) mode of attachment of docking accessories to the docking platform; (x) materials of the docking platform and its components; and (xi) types of electronic functions housed within the docking platform; among other variations.

The docking-connector system may comprise an electrical contact cavity for protecting an electrical contact and for providing lateral stability to attached docking accessories, among other purposes. The electrical contact cavity may be formed and configured to house one electrical contact, or it may be formed and configured to house more than one electrical contact.

The docking-connector system may comprise a single docking connector operable to form a detachable attachment to two or more docking accessories simultaneously and independently, or the docking-connector system may comprise more than one docking connector jointly operable to form a detachable attachment to two or more docking accessories simultaneously and independently.

The docking-connector system may include an aligning element for aligning the docking accessory.

The electrical contacts may be biased to form an electrical connection with the docking accessory when the docking accessory is attached to the docking connector.

A docking platform system according to one or more embodiments comprises an accessory docking system and a docking accessory constructed and arranged to form a detachable attachment to the docking platform, the docking platform further constructed to form a detachable attachment to the back surface of a mobile electronic device, the docking platform further constructed to allow wireless transmission of data between the mobile electronic device and attached docking accessories, the docking platform further constructed to allow power transmission between the platform and attached docking accessories, the docking accessory optionally further constructed and arranged to allow electrical connection to the electrical contacts of the docking platform when the docking accessory is attached to the docking platform.

The docking accessory may comprise a docking accessory body further comprising a docking connector, the docking connector formed and configured to mechanically, and optionally electrically, mate with the docking platform. The docking accessory may optionally include an extending element of any type or may be formed without any such extending element.

The docking system may further include an accordion capable of extending outward from the accessory docking system connector and retracting back toward the connector, the accordion distal end attached to the docking accessory body. A flexible circuit (such as a flat flex circuit or a flexible cable) may be formed within the accordion and connected between the electrical contacts and the docking accessory body.

A detachable docking accessory system for a docking platform according to one or more embodiments comprises a docking accessory body, an accordion constructed to attach magnetically to a selected one of two largest-surface-area surfaces of the docking platform and capable of extending outward from the selected surface and retracting back toward the selected surface, the accordion distal end attached to the docking accessory body, and optionally a flexible circuit formed within the accordion and configured to electrically connect to the docking platform and the docking accessory body. A second detachable docking accessory system for a mobile electronic device according to one or more embodiments comprises a docking accessory constructed, without an accordion, to attach magnetically to a selected one of two largest-surface-area surfaces of the docking platform and configured to electrically connect to the docking platform.

The method of allowing attachment of a docking accessory to a docking platform according to one or more embodiments comprises the steps of:

(a) forming a docking platform comprising a docking platform body, a connection system, operable to form a detachable bond with a compatible docking accessory;

The method may further include the steps of:

(b) forming two (or more) electrical contacts within a selected largest-surface-area surface of the docking platform, and electrically connecting the contacts to electronics within the docking platform, the electronic configured for wireless communication of data to and from the mobile electronic device;

(c) forming an electrical contact cavity;

(d) attaching a docking accessory to the docking platform; and (e) electrically connecting the docking accessory to the electrical contacts.

Step (a) may form two or more docking connectors within the docking area.

Those skilled in the art will appreciate that configurations similar to embodiments shown and described herein may be used.

Figure 2A:
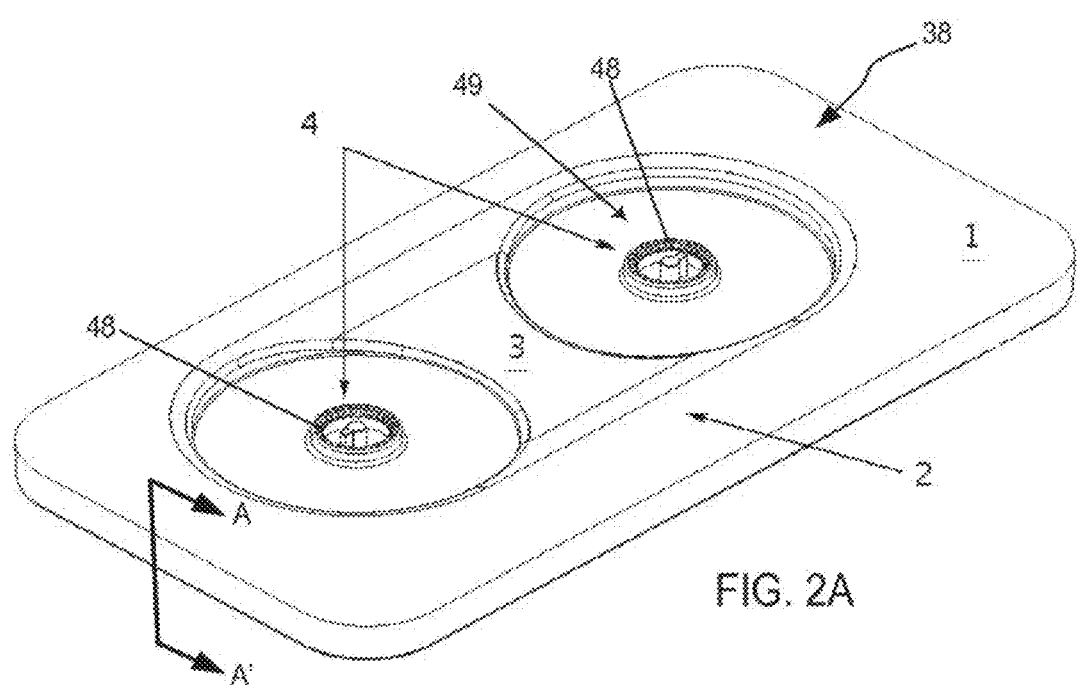
FIG. 2A is a back, perspective view of a mobile electronic device with a docking platform having docking connectors with electrical contacts disposed evenly around an inner edge of a female snap-fit feature, according to an embodiment.
Figure 2B:
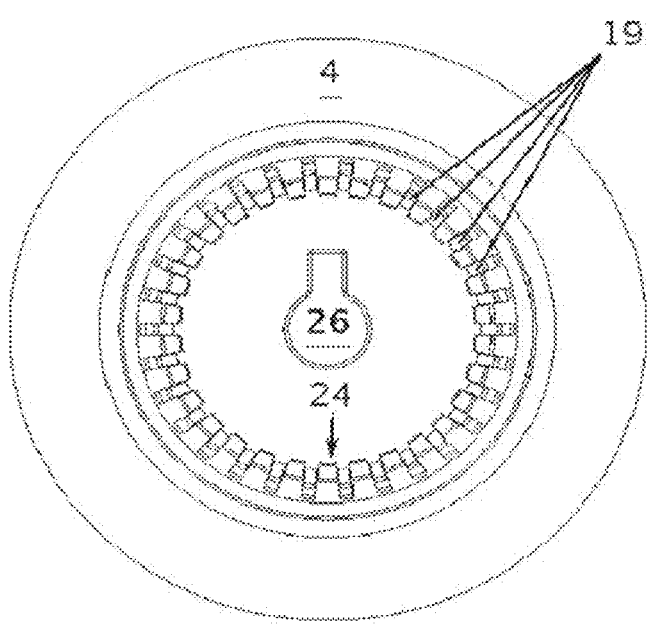
FIG. 2B is a front view of a docking connector of FIG. 2A.
Figure 2C:
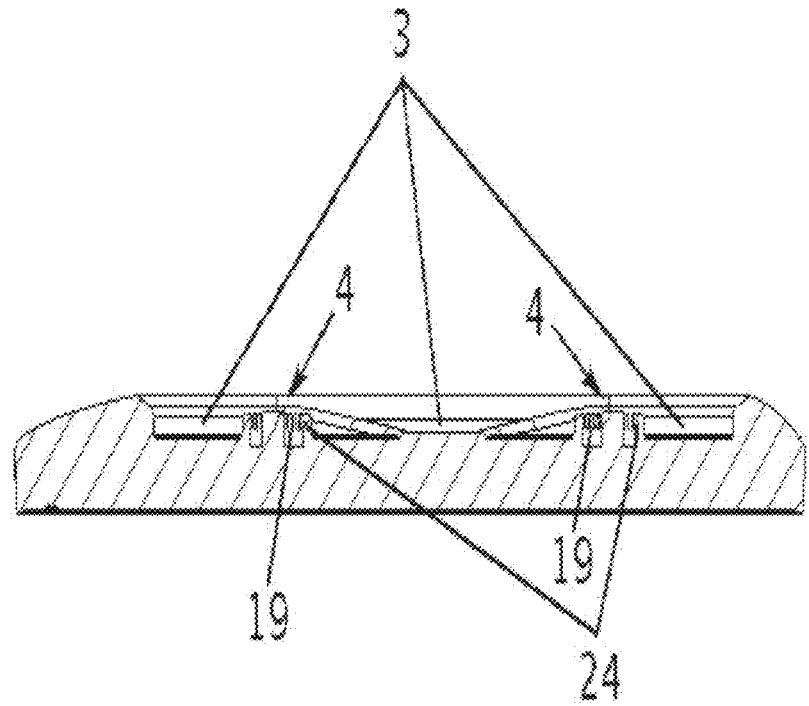
FIG. 2C is a sectional view along line A-A of FIG. 2A.
Figures 3A, 3B:
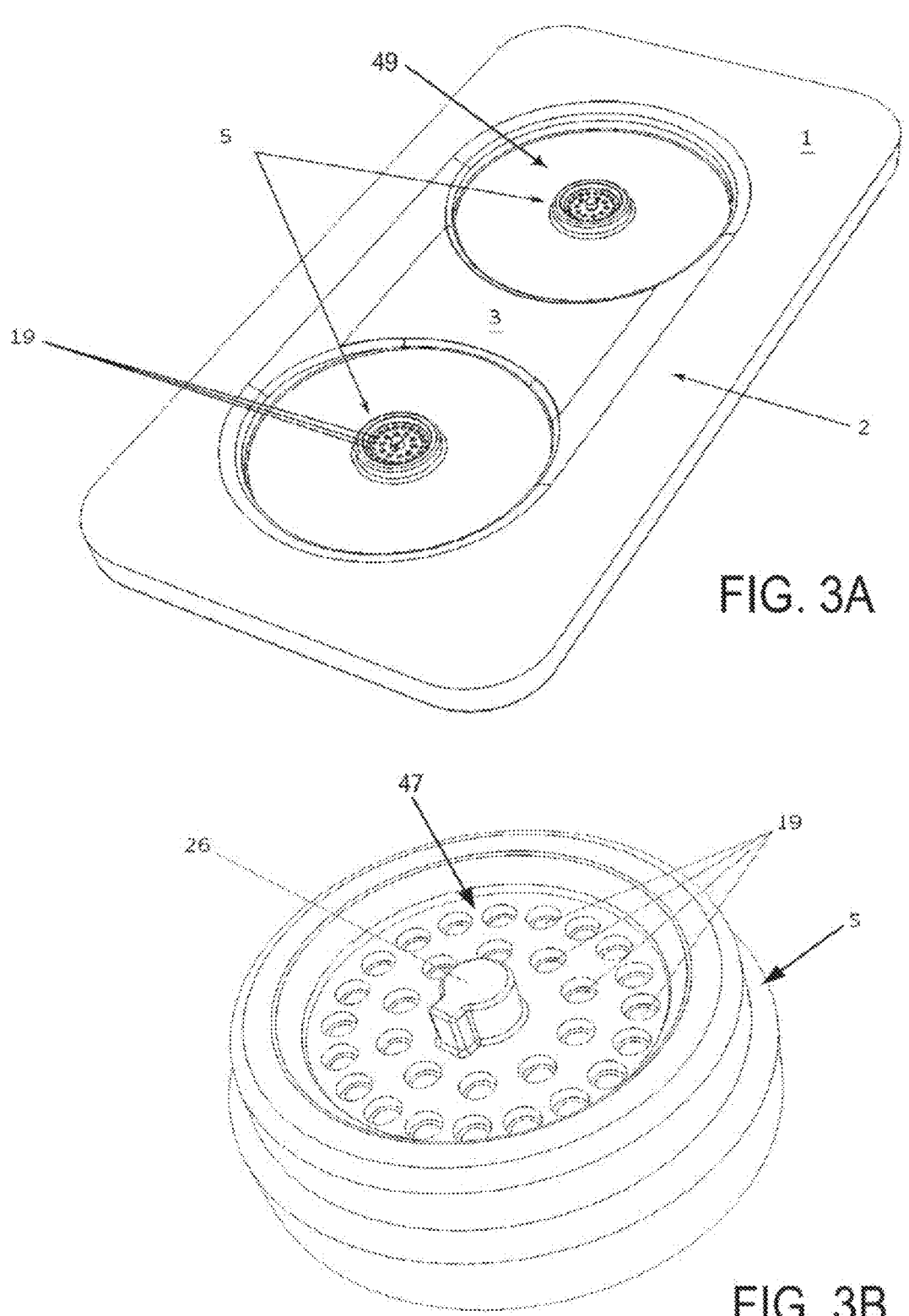
FIG. 3A is a perspective view of a mobile electronic device with a docking platform having electrical contacts disposed in sockets at the base of docking connectors, according to an embodiment.
FIG. 3B is an enlarged perspective view of a docking connector of FIG. 3A.

FIGS. 2A-C illustrate one embodiment of docking connectors 4. FIGS. 3A and 3B illustrate one possible alternative embodiment of docking connectors 5. In both embodiments a plurality of electrical contacts 19 are arranged in a circular pattern about the docking connectors. It will be appreciated that other patterns, shapes, and numbers of connectors may be used without departing from the scope herein. By way of example, pins of an exemplary docking connector are arranged as shown in Table 1. The same contacts could be arranged in various circular patterns to form, for example, the connector patterns as shown in FIGS. 2A-C and FIG. 3A-B. Depending on the specific docking connector configuration of the mobile electronic device and what accessory is to be used, various pins are connected and active.

TABLE 1

| Pin | Name | Description |
| --- | --- | --- |
| 1 | GND | Ground |
| 2 | V + Out | Power Out (to docking accessory) |
| 3 | V + In | Power In (from docking accessory) |
| 4 | D+ | Data Positive |
| 5 | D− | Data Negative |
| 6 | Detection/Identification/Configuration | (optional) |
| 7 | Clock | (optional) |
| 8 and greater | Expansion | (optional) |

FIG. 2A shows a mobile electronic device 1 with a docking platform 2 on a rear device face 38, in an embodiment. Docking platform 2 is formed with a docking connection system 49 having two docking connectors 4 situated in an accessory cavity 3. FIG. 2B shows a back view of mobile electronic device 1 with docking platform 2 and a detailed view of one of docking connectors 4. Docking connector 4 is shown with a circular female snap-fit 24, male index key 26, and docking connector electrical contacts 19. FIG. 2C is a sectional view through line A-A of FIG. 2A. Circular arrays of docking connector electrical contacts 19 are disposed evenly around an inner rim 48 of female snap-fit 24 of each docking connector 4.

FIG. 3A shows an isometric view of mobile electronic device 1 having docking connectors 4 replaced with docking connectors 5. In FIG. 3A, electrical contacts 19 of docking connectors 5 are arranged in concentric circles to form a socket within each docking connector 5. FIG. 3B shows a detailed view of one of docking connectors 5 of FIG. 3A. Rather than being arranged about an inner rim of a female snap-fit feature (see connectors 4 of FIGS. 2A-C), electrical contacts 19 are formed within an inner base 47 of each connector 5. Although electrical contacts 19 are shown forming concentric circles within base 47, it will be appreciated that alternate arrangements of contacts 19 are possible.

Connectors 5 are shown to include optional male index keys 26. All connectors discussed herein, including those shown in FIGS. 2A-C and 3A-B, should not be considered limiting in any way, but merely examples of possible connectors that can be utilized with the present invention.

Figure 4A:
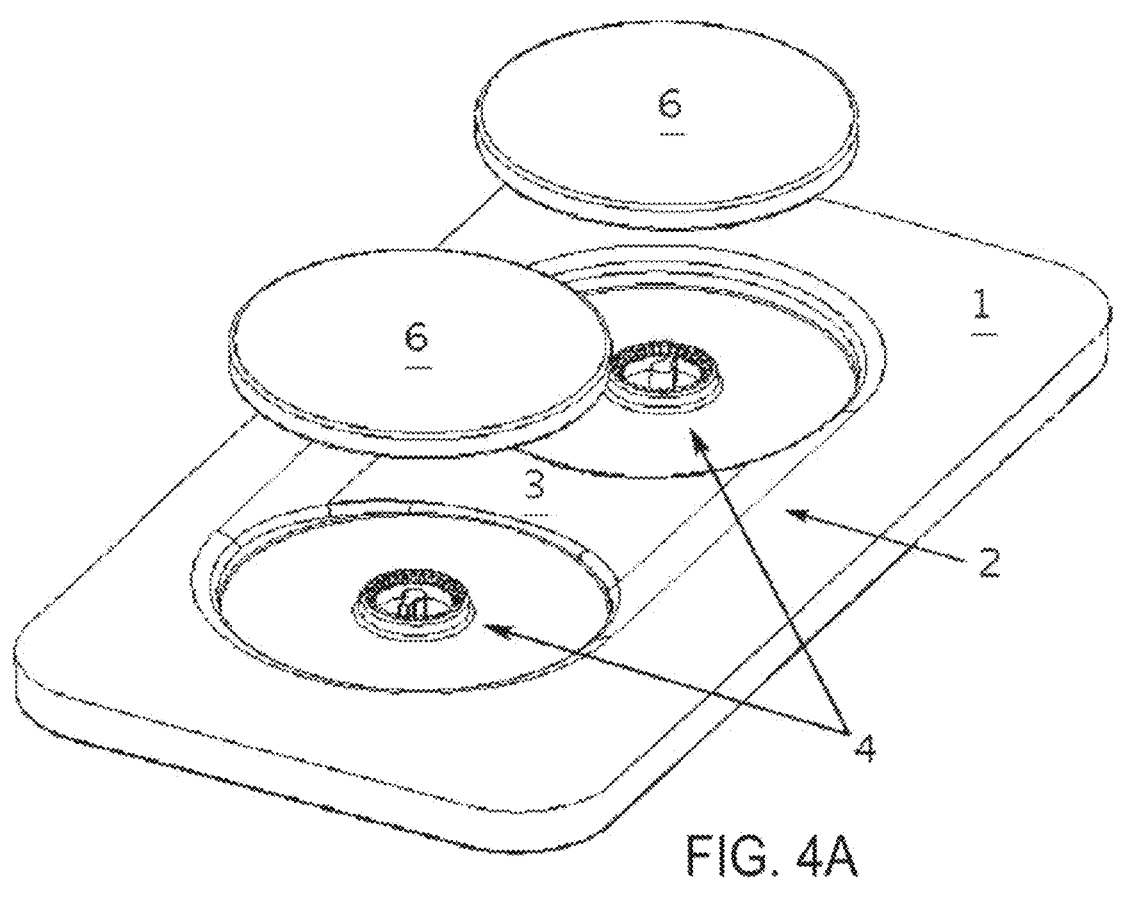
FIG. 4A is a perspective view of the mobile electronic device with docking platform of FIG. 2A, further illustrating two unattached docking accessories, in an embodiment.
Figure 4B:
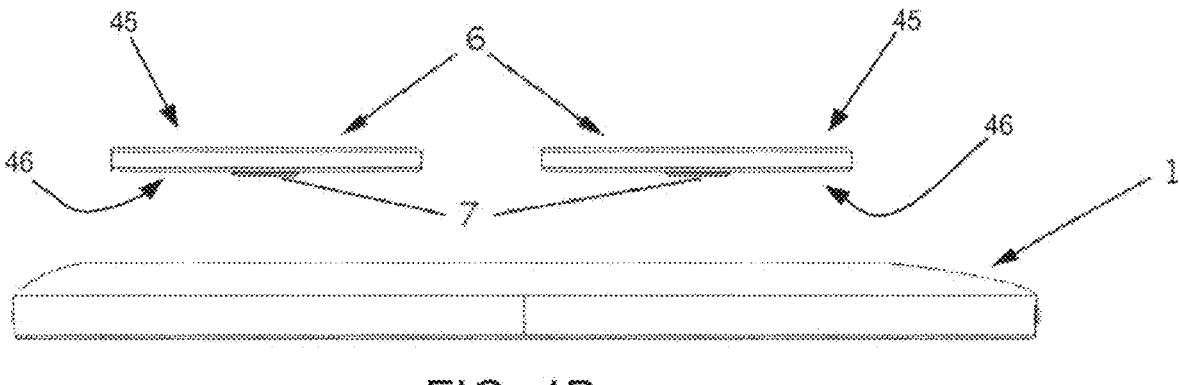
FIG. 4B is a side view of FIG. 4A.
Figure 4C:
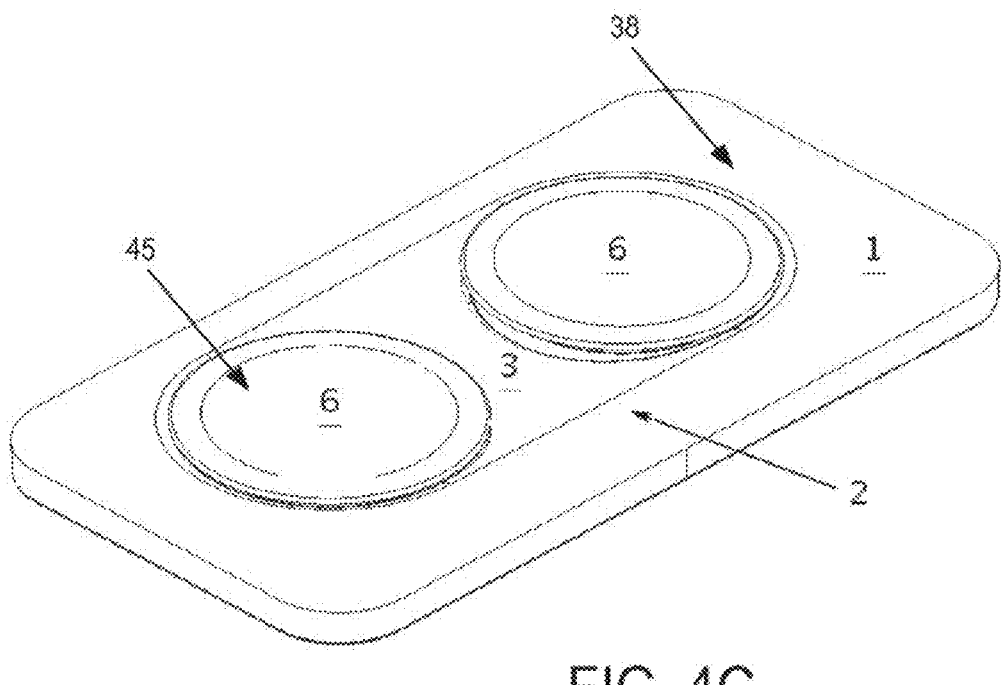
FIG. 4C is a perspective view of the device with platform of FIG. 4A, showing the two docking accessories attached to the docking connectors of the docking platform.

FIG. 4A is a perspective view of mobile electronic device 1 of FIG. 2A with two unattached basic generic docking accessories 6. FIG. 4B is a side view of the arrangement of FIG. 4A, illustrating a docking accessory male snap-fit 7 extending from a docking side 46 of each docking accessory 6. FIG. 4C is a perspective view of mobile electronic device 1 of FIG. 4A, with docking accessories 6 attached with docking connectors 4 of docking platform 2. It should be understood that in this embodiment, docking accessory cavity 3 may be sized to facilitate flat, level and even substantially coplanar alignment of visible/operating surfaces 45 of accessories 6 with rear device surface 38 of device 1, when accessories 6 are secured as shown in FIG. 4C. This beneficial arrangement of accessories 6 may not increase, or may insignificantly increase, overall thickness of device 1 (with accessories 6 attached), and reduces the chance of catching an accessory on clothing or the like. If an accessory is too thick to sit flush with the back surface of device 1, cavity 3 still beneficially minimizes the combined thickness of mobile electronic device 1 and the accessory, and also reduces interference caused by the thicker accessory's exposed portions catching on other objects, surfaces, edges, etc. It will be appreciated that docking accessories may be formed to couple with both recessed and non-recessed accessory docking systems, the latter of which are discussed below with reference to FIGS. 21-40.

Figure 5:
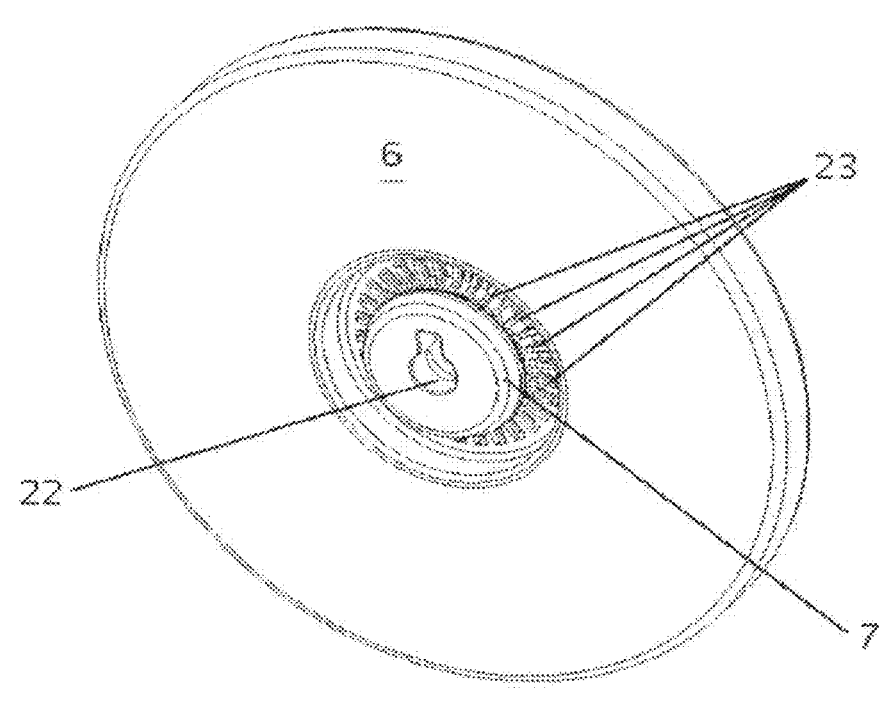
FIG. 5 is a bottom, perspective view of a basic generic docking accessory such as the accessories of FIG. 4A, in an embodiment.

FIG. 5 is a bottom, perspective view of basic generic docking accessory 6. Docking accessory 6 of FIG. 5 is configured for removably attaching to docking connector 4, FIG. 2A. A female index key 22, shown formed within male snap-fit connector 7, facilitates in aligning and mating accessory 6 with connector 4. When mated, accessory connector electrical contacts 23 make contact with docking connector electrical contacts 19 to provide transmission of one or more of power, signals, and data.

FIGS. 6A-F illustrate an extendable docking accessory assembly 8 formed of a docking accessory body 9 attached to or formed with a docking accessory accordion 10. Expandable docking accessory assembly 8 may adjustably extend outward from back surface 38 of device 1 by expanding accessory accordion 10. Accessory assembly 8 is very similar to the sockets (comprising in general an accordion and an end cap) as taught in U.S. Pat. No. 8,560,031 (incorporated herein by reference). For example, the accessory assembly 8 may comprise a grip that allows a user to securely hold and manipulate the device 1 with one hand, and in an expanded state act as a comfortable grip for gaming, data entry, and searching the Internet. Moreover, the accessory assembly 8 may act as a stand for propping the device 1 in various tilted or upright positions for viewing, data entry, video conferencing, etc.

Accessory body 9 may be configured with any of the docking accessory functionality disclosed herein, for example, audio speakers, camera, a camera flash, a light, electrophysiological sensors, to name only a few.

Figure 6A:
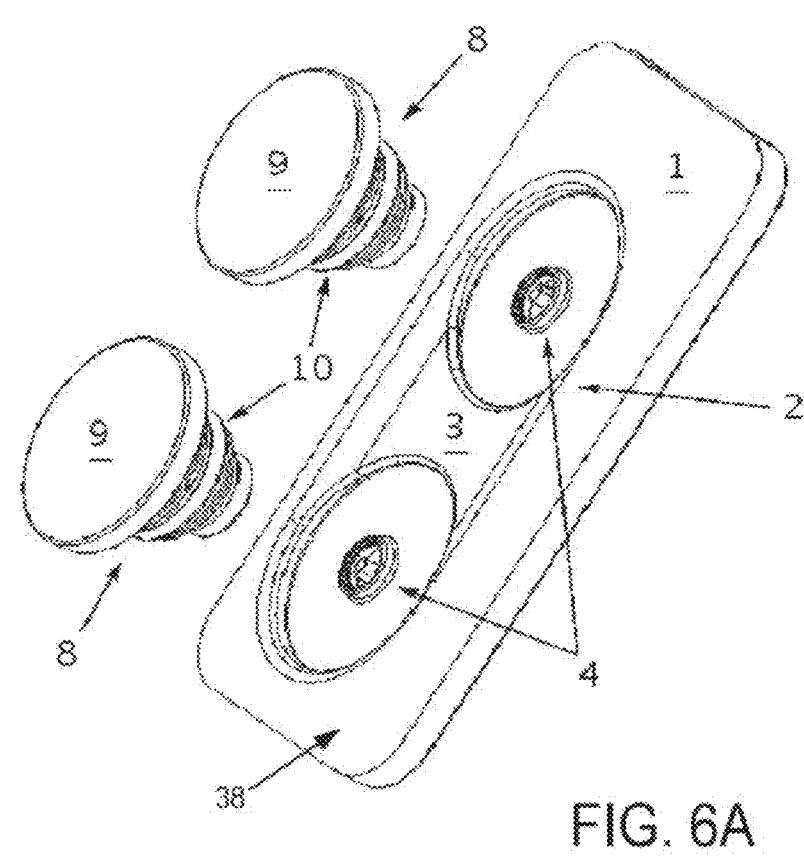
FIG. 6A is a perspective view of the device with platform of FIG. 2A, showing two unattached expandable docking accessories in their expanded states, in an embodiment.
Figure 6B:
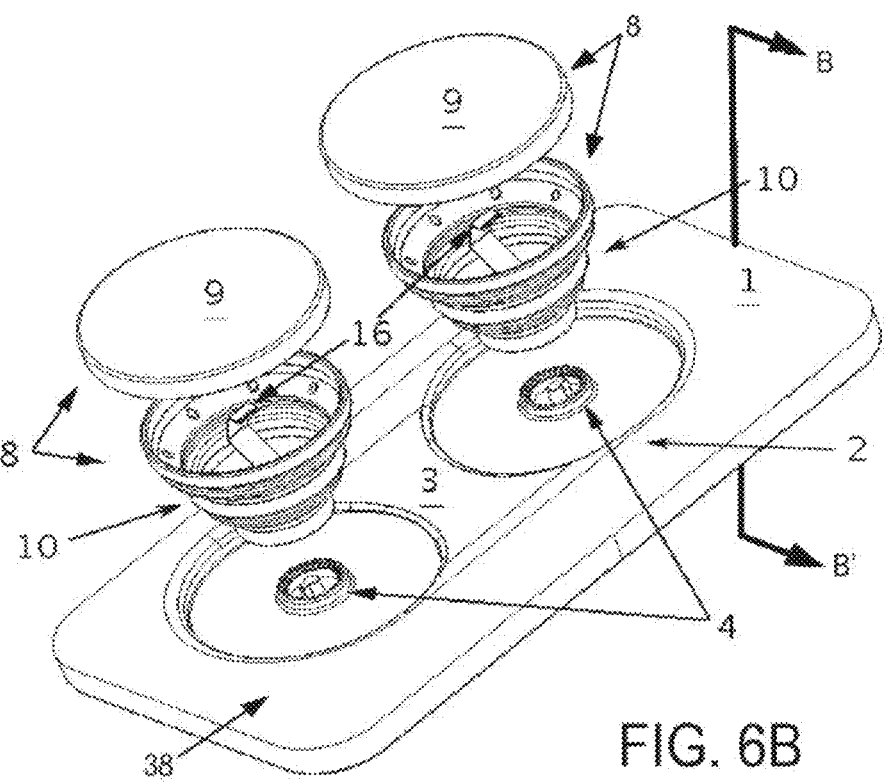
FIG. 6B is an exploded perspective view of the device with platform and expandable accessories of FIG. 6A, in an embodiment.

In particular, FIG. 6A shows mobile electronic device 1 proximate two unattached docking accessory assemblies 8 in their expanded states. FIG. 6B shows docking accessory bodies 9 separated from accordions 10. Flex circuits 16 are shown disposed within accordions 10.

Figure 6C:
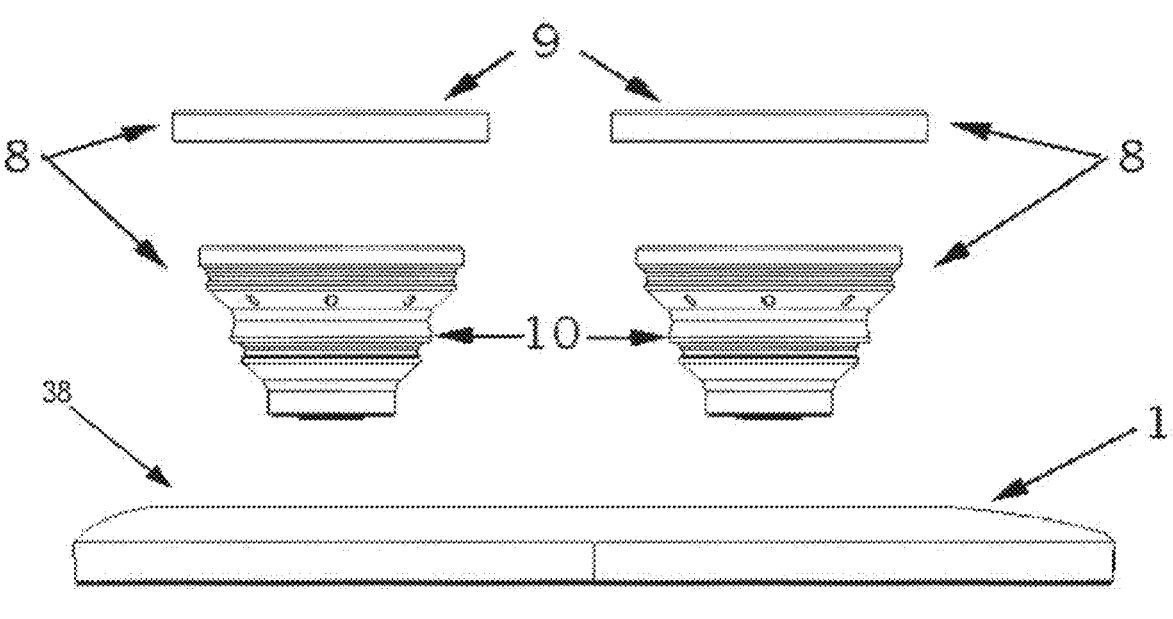
FIG. 6C is a side view of FIG. 6B.
Figure 6D:
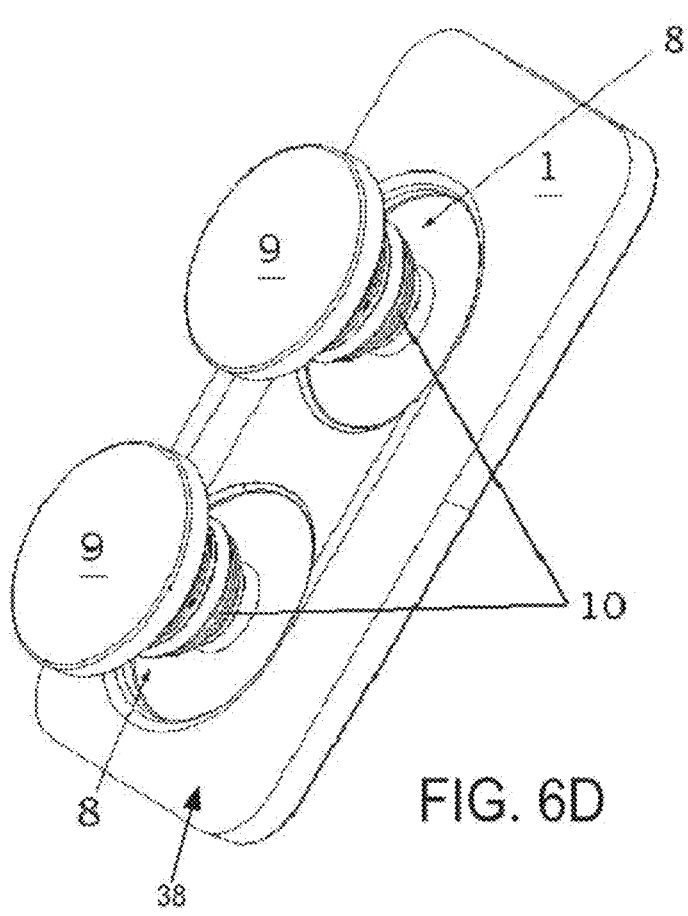
FIG. 6D is a perspective view of the device with platform of FIG. 6A, showing the two expandable accessories attached with the docking platform, in an embodiment.

FIG. 6C is a side view of the arrangement of FIG. 6B. FIG. 6D schematically illustrates accessory assemblies 8 attached to docking connectors 4.

Figure 6E:
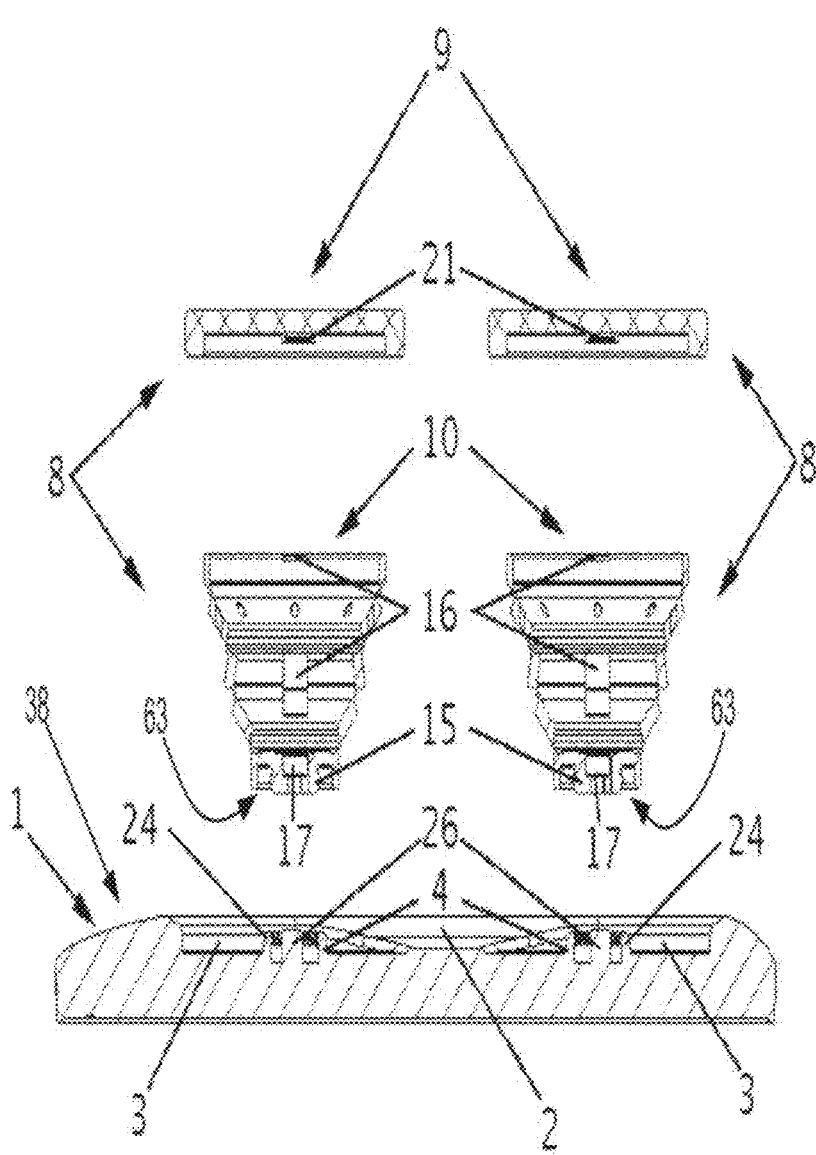
FIG. 6E is a sectional view along line B-B of FIG. 6B.
Figure 6F:
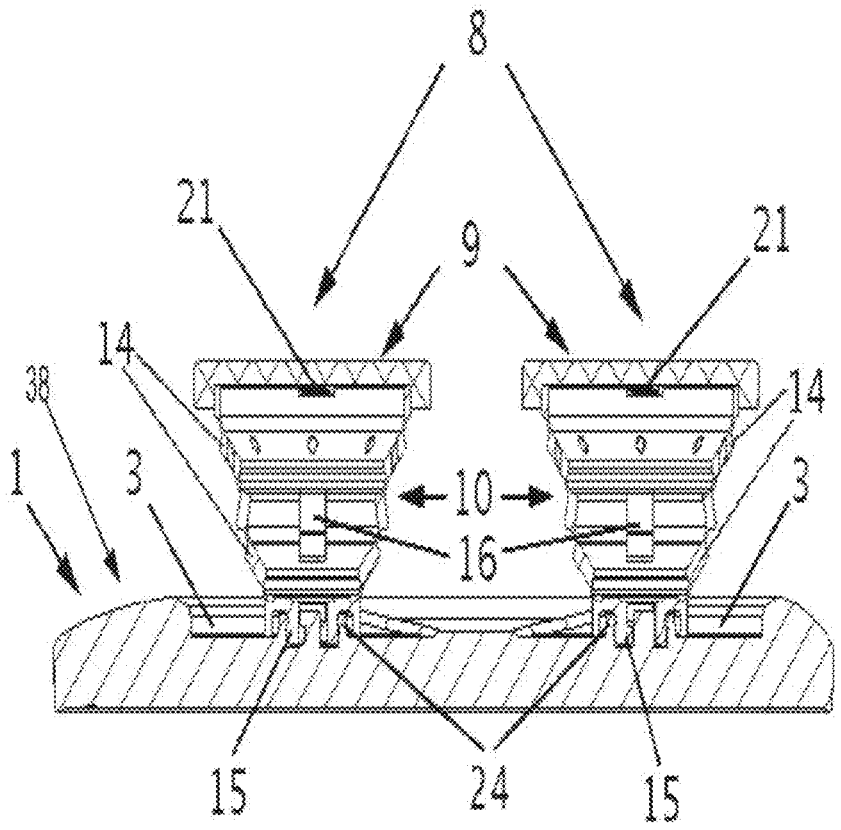
FIG. 6F is a sectional view of an assembled version of the device with platform and expandable accessories of FIG. 6E.

FIG. 6E is a sectional view of the exploded arrangement of FIGS. 6B and 6C, taken along line B-B of FIG. 6B. A female connector 21 is shown configured with accessory 9. Accordions 10 are formed with flex circuits 16, which do not inhibit accordions 10 when accordions 10 are collapsed substantially flush with or proximate back surface 38 of device 1, within cavity 3. A female index key 17 formed within a docking surface 63 of accordion 10 (similar to female index key 22 of docking surface of accessory 6) aligns with male index key 26 of docking connector 4 to ensure proper connection. FIG. 6F is a sectional view through line C-C of FIG. 6D, showing docking accessory assemblies 8 attached to mobile electronic device 1. Male snap-fit connector 15 attaches to docking connector 4 female snap-fit 24. Bi-stable accordion flipper walls 14 are in their upward states.

Figure 7:
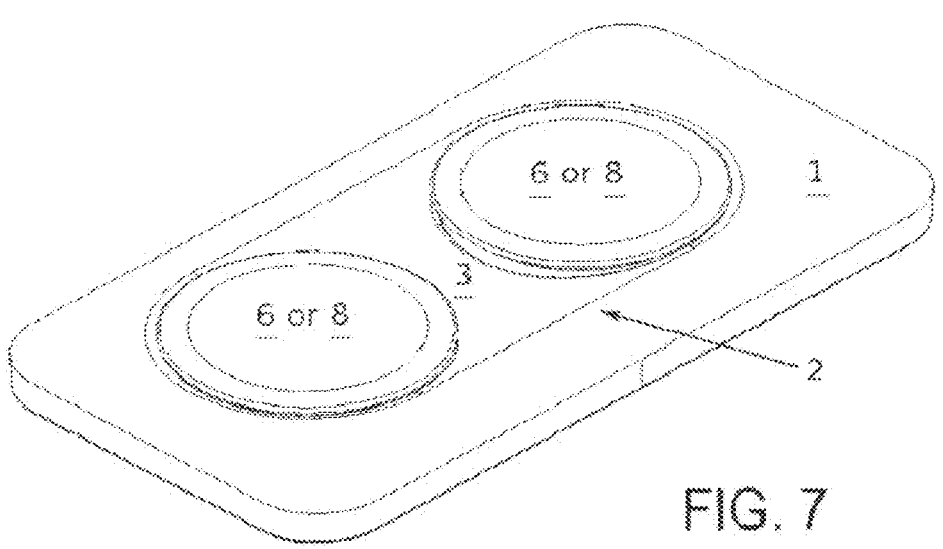
FIG. 7 is a perspective view of the mobile electronic device with a docking platform of FIG. 6A with attached docking accessories, in an embodiment.

FIG. 7 shows mobile electronic device 1 with the docking platform of FIG. 2 or FIG. 3, with attached generic docking accessories that may be basic accessories 6, expandable docking accessory assemblies 8 in their collapsed states, or some other accessory.

Figure 8:
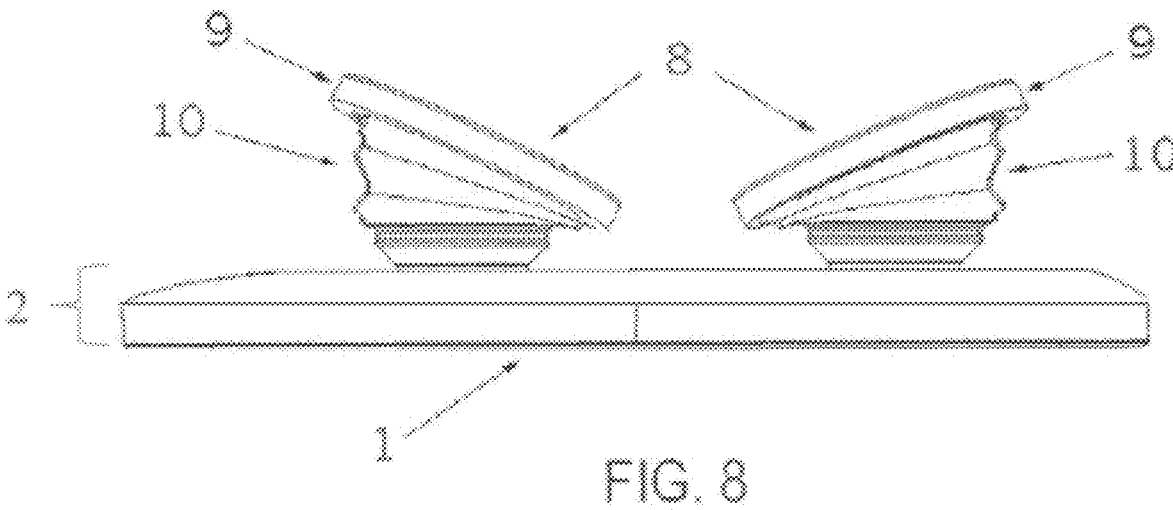
FIG. 8 is a side view of the mobile electronic device with platform of FIG. 6A configured as a case attached to the mobile electronic device, showing attached expandable docking accessories in a partially collapsed and rotated state, according to an embodiment.

FIG. 8 shows a side view of mobile electronic device 1 with platform 2 configured as a case attached to the mobile electronic device 1, and with expandable docking accessory assemblies 8 in one of its many partially collapsed states. This configuration is useful for orienting the faces of certain docking accessories, for example electrophysiology devices such as ECG accessories, for optimal functioning.

Figure 9A:
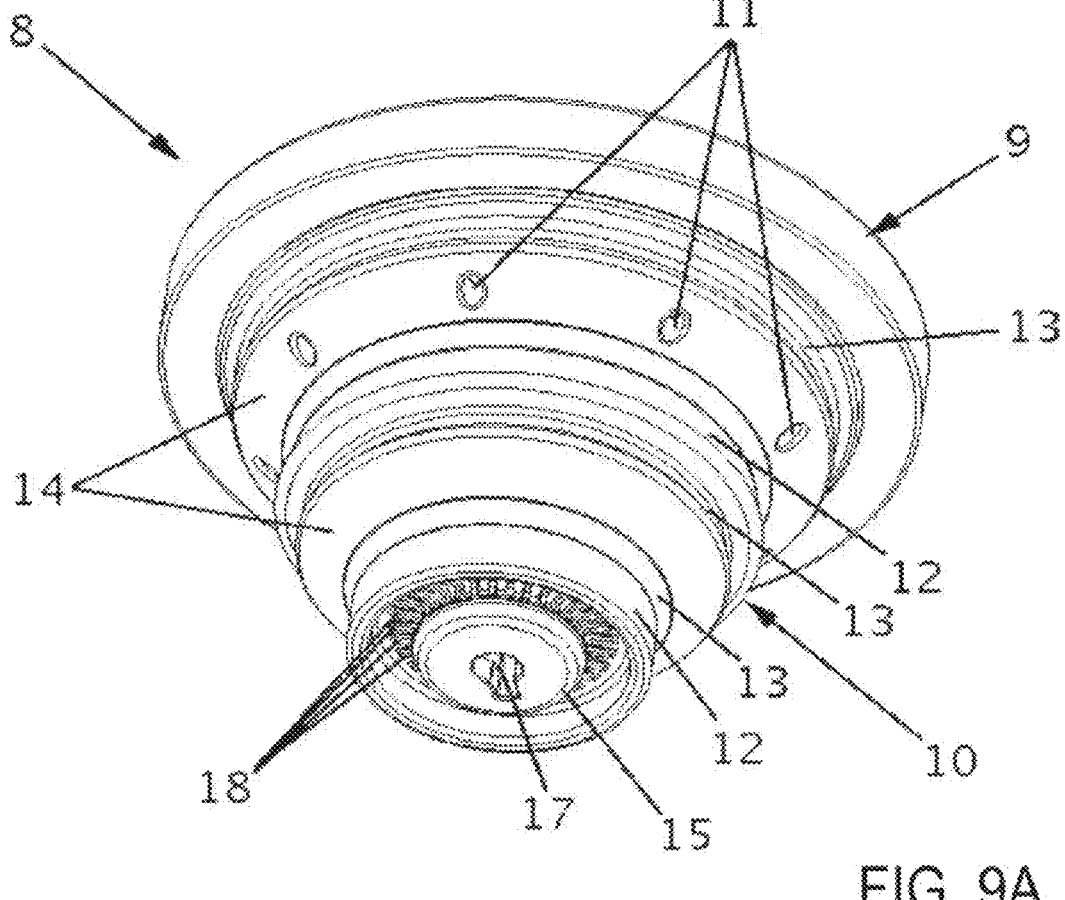
FIG. 9A is a perspective bottom or docking-side view of an expandable generic docking accessory in a fully expanded state, in an embodiment.

FIG. 9A shows one embodiment of an isometric bottom view of an extendable docking accessory assembly 8 in its fully expanded state. Male electrical contacts 18 are configured to engage with female electrical contacts 19 of docking connector 4 as shown in FIG. 2A. Female index key 17 aligns with male index key 26 to facilitate proper orientation when attaching extendable docking accessory assembly 8 to docking platform 2. When accessory assembly 8 moves from an expanded state to a collapsed state, flexural hinges 13 flex to facilitate vertical walls 12 of accessory 8 to move into a stable concentric configuration as accordion 10's flipper walls 14 move from a stable upward state, with the outer edges above their inner edges, to a stable downward state, whereby the outer edges are below the inner edges. Vents 11 facilitate the exchange of air through flipper wall 14 when expanding and compressing the extendable docking accessory assembly 8.

Figures 9B, 9C, 9D:
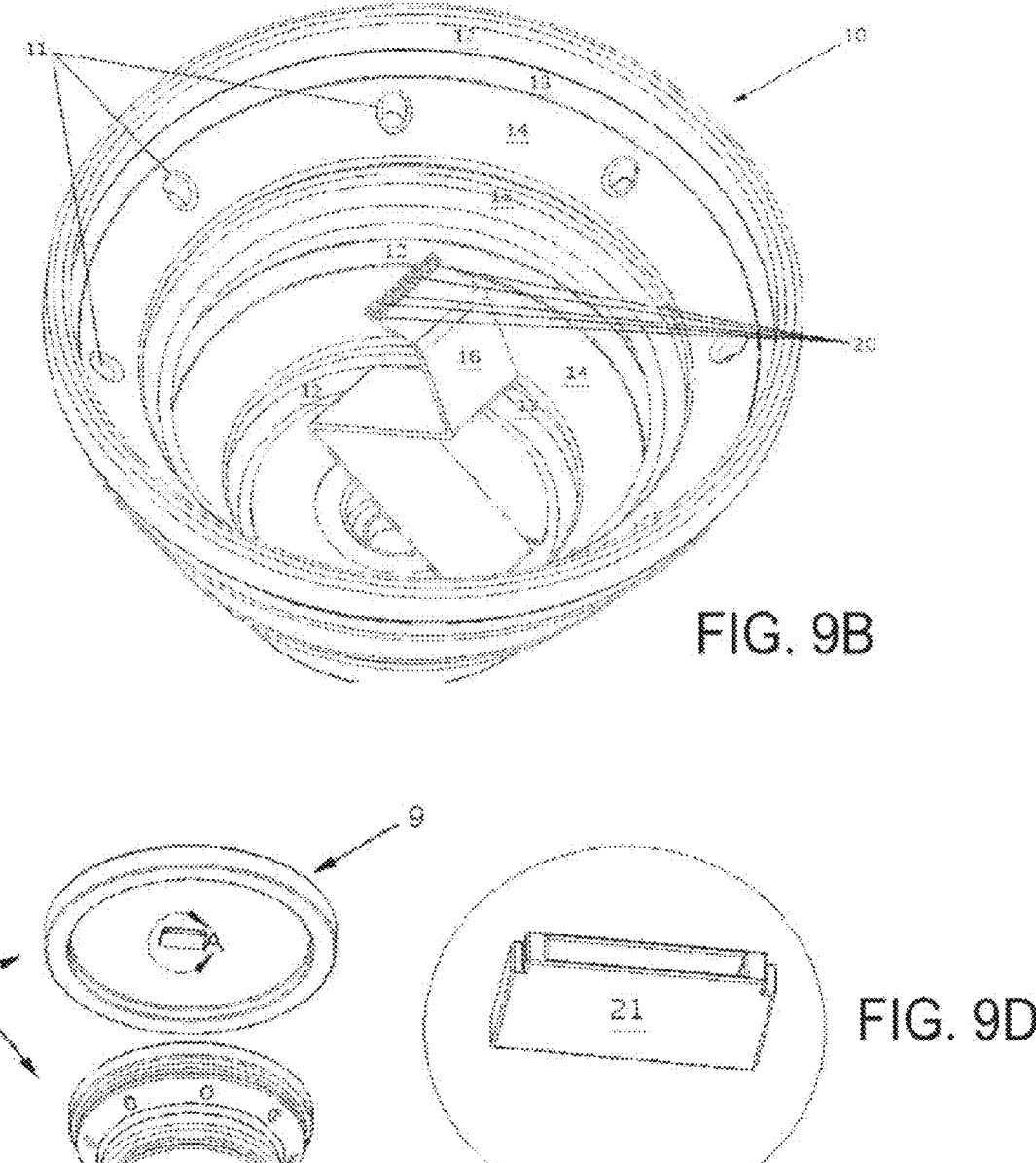
FIG. 9B is a perspective top view of the expandable accessory of FIG. 9A.
FIG. 9C is an exploded, bottom perspective view of the expandable accessory of FIG. 9A in its fully expanded state, according to an embodiment.
FIG. 9D is a detail view of a female flex-circuit connector of the accessory of FIG. 9A.

FIG. 9B shows an isometric top view of accordion 10 of FIG. 9A. FIG. 9C shows an exploded, isometric, bottom view of accessory 8 and accordion 10 with an expanded view of accessory connector 21. FIG. 9D shows a top view of the same arrangement with an expanded view of flex circuit 16. Accordion flex circuit 16 is disposed within accordion 10, and provides electrical connection between device 1, via contacts 19 shown in FIG. 2B, and male electrical contact 18 shown in FIG. 9A, and accessory body 9, via connector 21. FIG. 9E shows an isometric view of accessory connector 21. Contacts 20 are inserted into port 25 to connect accessory body 9. As an option, accessory body 9 may be detachable from accordion 10.

Figures 10A, 10B, 10C, 10D:
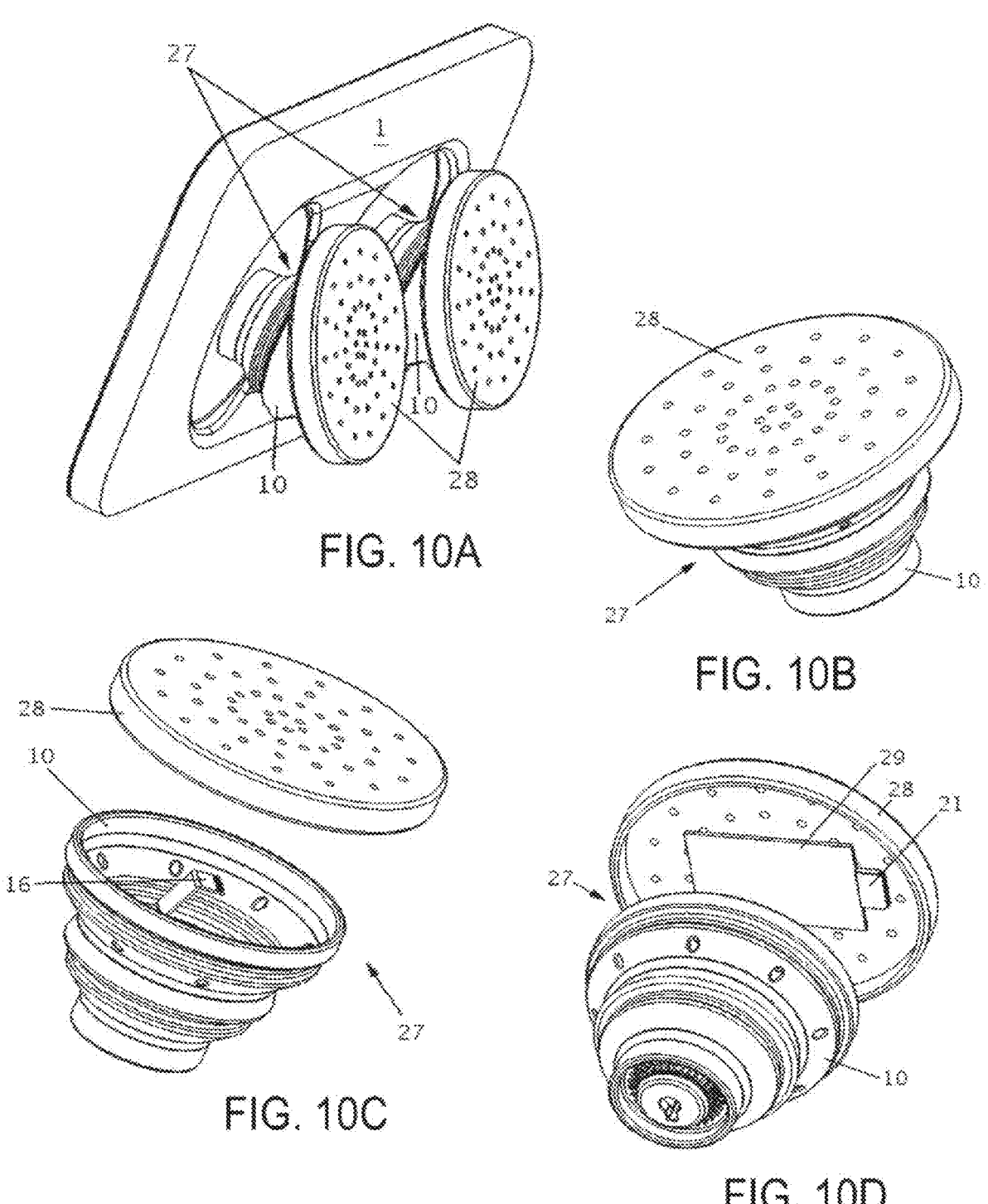
FIG. 10A is a perspective view of the mobile electronic device of FIG. 2A with two docked speaker accessories, according to an embodiment.
FIG. 10B is a top perspective view of one of the speaker accessories of FIG. 10A.
FIG. 10C is an exploded, top perspective view of the speaker accessory of FIG. 10A.
FIG. 10D is an exploded, bottom perspective view of the speaker accessory of FIG. 10A.

FIGS. 10A-D show one example of a set of speaker accessories 27 used in conjunction with accordions 10. FIG. 10A is an isometric view of mobile electronic device 1 with two docked speaker accessories 27, in one expanded mode for resting one edge of device 1 and one edge each of speaker accessory bodies 28 on a surface, such as a table top. This extension configuration is useful for holding the device in a near-vertical position without blocking speaker accessories 27.

FIG. 10B shows an isometric top view of speaker accessory 27, comprising speaker accessory body 28 and accordion 10. FIG. 10C shows an isometric side exploded view of the speaker accessory 27 of FIG. 10B. Accordion flex circuit 16 can be seen within accordion 10, detached from speaker accessory body 28. FIG. 10D is an exploded, isometric, bottom view of speaker accessory 27. Speaker 29, which may be for example a piezoelectric speaker, connects to accessory connector 21. Accessory connector 21 connects to flex circuit 16 via port 25 as shown in FIG. 9. By way of example, given the device pin-out shown in Table 1, speaker 29 may use pins 1, 2, 4, and 5, which are Ground, Power Out, Data Positive, and Data Negative, respectively. With this pin-out arrangement, encoded data may be used for accessory detection. In another example, speaker 29 may use pins 1, 2, 6, 8, and 9, which are Ground, Power Out, Detection, left channel analog audio, and right channel analog audio, respectively. Those skilled in the art will appreciate that many other pin-out arrangements are possible, including arrangements for a self-powered speaker accessory, without departing from the scope herein.

In one embodiment, speaker accessory speaker 29 is a Murata VSLBF series speaker; size 0.5 mm thick, 13 mm wide, 19 mm long; frequency range 200 Hz to 20 kHz; sound pressure level 93.5 dB+/−3.0 dB; resonant frequency 1150 Hz+/−20%; capacitance 1.5 µF+/−30%; maximal sinusoidal voltage 5.0 Vrms; operating temperature range −20 to 70° C.

Figures 11A, 11B, 11C:
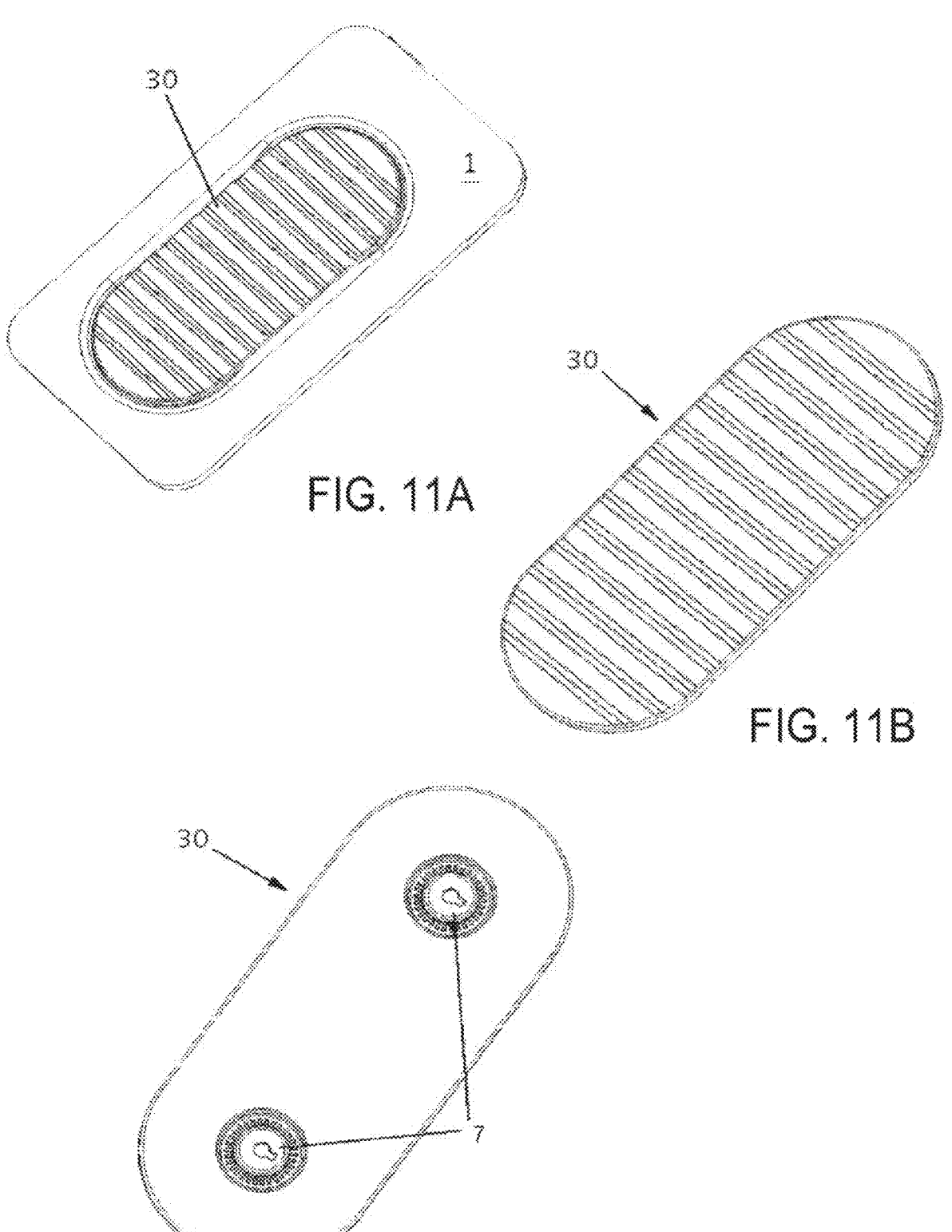
FIG. 11A is a perspective view of the mobile electronic device of FIG. 2A with a docked solar charging accessory, according to one embodiment.
FIG. 11B is an isometric top view of the solar charging accessory of FIG. 11A.
FIG. 11C is a bottom, perspective view of the solar charging accessory of FIG. 11A, according to an embodiment.

FIGS. 11A-C show one embodiment of a solar charging accessory 30. FIG. 11A shows an isometric view of mobile electronic device 1 with docked solar charging accessory 30. FIG. 11B shows an isometric top view of solar charging accessory 30. FIG. 11C shows a bottom view of solar charging accessory 30. In this embodiment, docking connects are docking connectors 4 as shown in FIG. 2. As an alternative, docking connectors may be docking connectors 5 as shown in FIG. 3 or other arrangements described or not described herein. Taking the pin-out arrangement of Table 1 as an example, charging accessory 30 might connect to pins 1, 3, and 6, comprising Ground, Power In, and Detection/Configuration, respectively.

In one embodiment, solar charger accessory 30 is a custom monocrystalline silicon solar cell encapsulated in epoxy resin; 5.5V; 60 mA; maximum power (Pm) 0.33 W.

FIGS. 12A-C show one embodiment of a supplemental battery accessory 31. FIG. 12A shows an isometric view of mobile electronic device 1 with docked supplemental battery accessory 31. FIG. 12B shows a top view of supplemental battery accessory 31. FIG. 12C shows a bottom view of supplemental battery accessory 31.

Similar to the solar charging accessory 30 of FIG. 11A-C, battery accessory 31 may use docking connectors 4, docking connectors 5 or some other docking connector described or not described herein. Again, taking the pin-out arrangement of Table 1 as an example, supplemental battery accessory 31 might connect to pins 1, 3, and 6, comprising Ground, Power In, and Detection/Configuration, respectively.

As one embodiment, supplemental battery accessory 31 is a custom polymer Li-Ion, 3.7V, 800 mAh, 2.96 wh, UN approved.

Figures 13A, 13B, 13C:
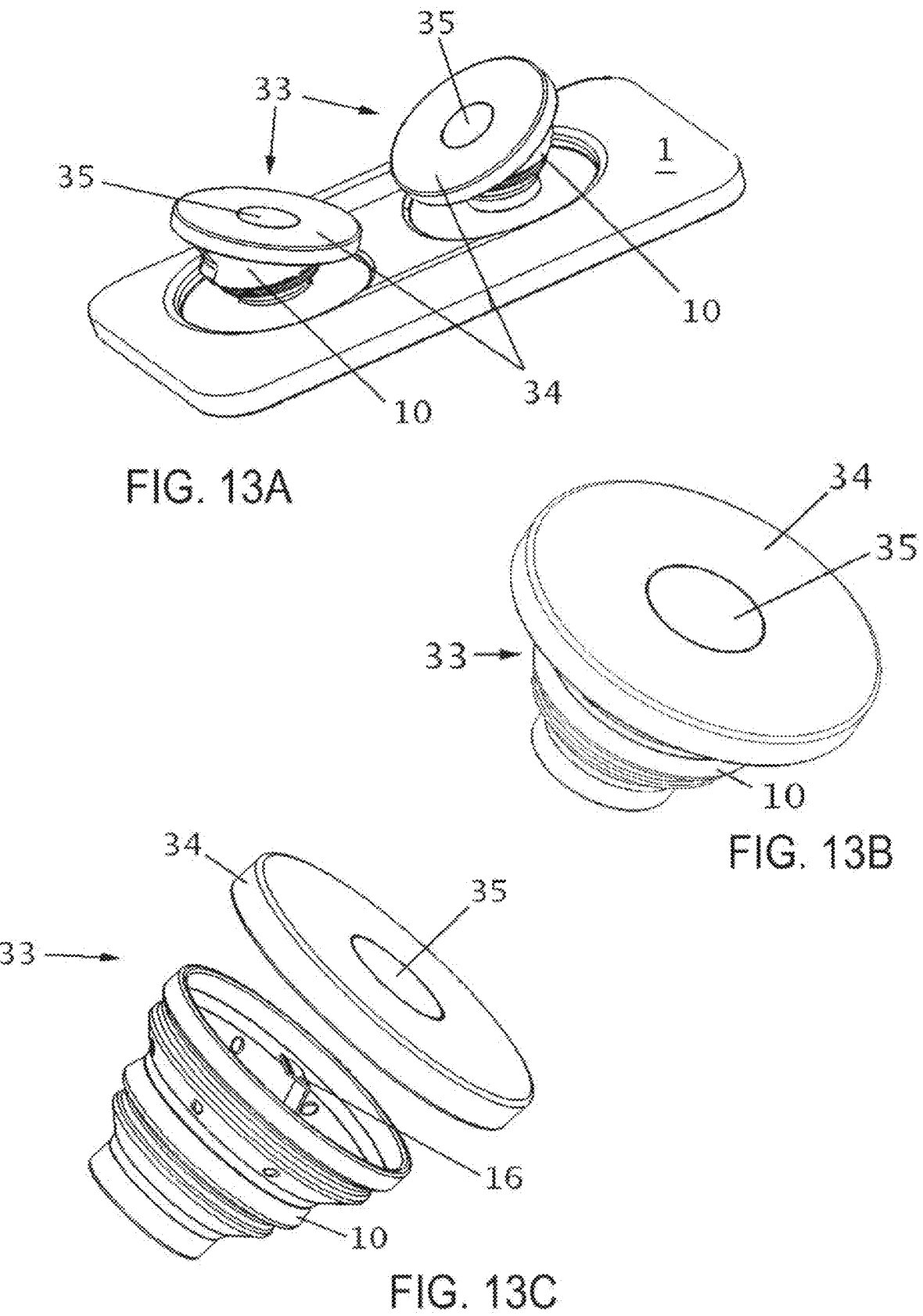
FIG. 13A is a back perspective view of the mobile electronic device of FIG. 2A with two docked electrophysiology accessories in a partially collapsed states, according to one embodiment of the invention.
FIG. 13B is a top perspective view of one electrophysiology sensor accessory of FIG. 13A.
FIG. 13C is an exploded, side perspective view of the electrophysiology sensor accessory of FIG. 13A, in an embodiment.

FIGS. 13A-C shows one embodiment of a set of electro-physiology sensor accessories used in conjunction with accordions 10. In a separate embodiment, electrophysiology sensor accessories may be used with a docking accessory similar to docking accessory 6 of FIGS. 4-5. FIG. 13A is an isometric view of mobile electronic device 1 with two docked electrophysiology sensor accessories 33, in one expanded mode. This extension configuration is useful, for example, for maintaining good sensor contact when the sensors are held against a person's skin, such as the varying curvatures of the chest, for gathering electrophysiological data.

FIG. 13B shows an isometric top view of electrophysiology sensor accessory 33 with fully expanded accordion 10.

FIG. 13C shows an exploded, isometric, side view of electrophysiology sensor accessory 33 with fully expanded accordion 10. Accordion flex circuit 16 can be seen within accordion 10, detached from electrophysiology sensor accessory body 34. Electrophysiology sensor electrode 35 connects to accessory connector 21 (shown in FIG. 9C), which will connect to flex circuit 16 via port 25 as shown in FIG. 9. In one embodiment which uses the device pin-out shown in Table 1, electrophysiology sensor 33 might use pins 1, 2, 4, and 5, comprising Ground, Power Out, Data Positive, and Data Negative, respectively, in conjunction with accessory-mounted isolation or other safety components. Under this pin-out arrangement, encoded data may be used for accessory identification. Those skilled in the art will appreciate that many other pin-out arrangements are possible, including arrangements for a self-powered electrophysiology sensor accessory.

In one embodiment, electrophysiology sensor accessory 33 is an electrocardiograph (ECG) sensor consisting of a silver chloride electrode, analog front end, digital-to-analog converter, microprocessor, and USB controller.

Figures 14A, 14B, 14C, 14D:
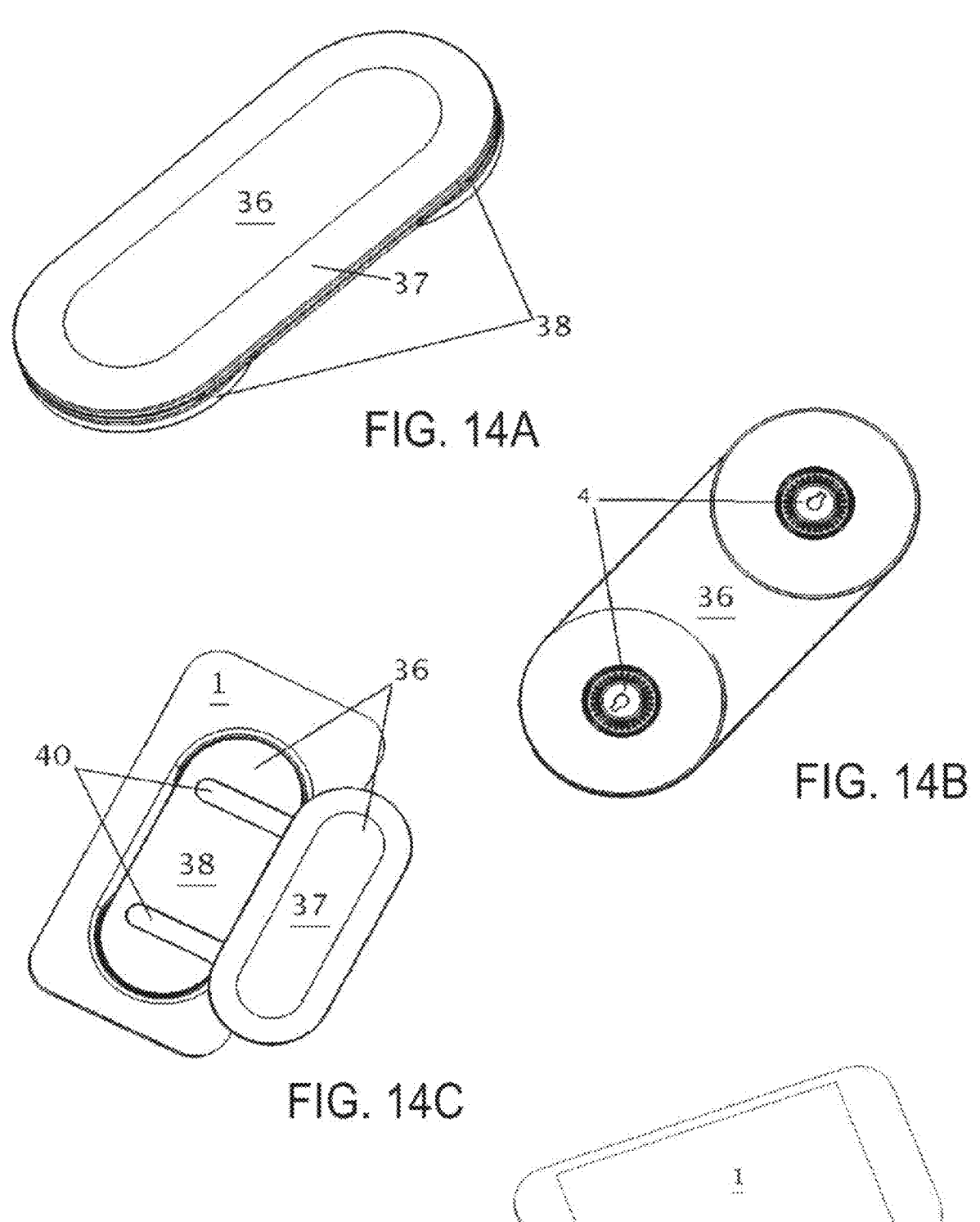
FIG. 14A is a top perspective view of a game controller accessory in a closed state, according to one embodiment.
FIG. 14B is a bottom view of the game controller accessory of FIG. 14A.
FIG. 14C is a back view of the mobile electronic device of FIG. 2A with the game controller accessory of FIG. 14A docked in a partially open state, in an embodiment.
FIG. 14D is a front view of the device and controller accessory of FIG. 14C, with the controller accessory shown in an open state, in an embodiment.

FIGS. 14A-D show one embodiment of a game controller accessory 36. FIG. 14A shows an isometric top view of game controller accessory 36 in its closed state. FIG. 14B shows a bottom view of game controller accessory 36 of FIG. 14A. Similar to the solar charging accessory 30 of FIG. 11A-C, game controller accessory 36 may use docking connectors 4, docking connectors 5, or some other docking connector described or not described herein.

FIG. 14C shows a back view of mobile electronic device 1 with docked game controller accessory 36 in one of its partially open states. Game controller base tracks 40 provide functionality for game controller accessory sliding control panel 37 to slide into open states, as shown in FIG. 14C-D.

FIG. 14D shows a front view of mobile electronic device 1 with docked game controller accessory 36 in its fully open state. This state is convenient for holding the mobile electronic device 1 while operating the game controller accessory buttons 39. This also removes controls from the provided screen, such that full screen may be used for visual interaction with a game without losing valuable screen space to controls. In one embodiment, given the device pin-out shown in Table 1, game controller accessory 36 might use pins 1, 2, 4, and 5, comprising Ground, Power Out, Data Positive, and Data Negative, respectively. Under this pin-out arrangement, encoded data may be used for accessory identification. Those skilled in the art will appreciate that many other pin-out arrangements are possible.

As an example, game controller accessory 36 is a thumb-operated keypad consisting of a mechanical-slide subassembly, user interface switches, a microcontroller, and a USB controller.

It will be appreciated that the embodiments disclosed above describe multiple levels of cooperation between docking connectors, for example docking connectors 4 and 5, and docking accessories. Some docking accessories are configured operate independently, whiles other accessories cooperate, for example a camera accessory and a camera flash accessory, left and right stereo speakers accessories 27, and electrophysiology sensor 33, while still others are formed as a single accessory that utilizes two or more docking connectors, for example solar charging accessory 30, battery accessory 31, and game controller 36. Functionality for recognizing, facilitating, and otherwise providing these multiple levels of cooperation between docking accessories and docking connectors is also provided herein.

Figures 15A, 15B, 16:
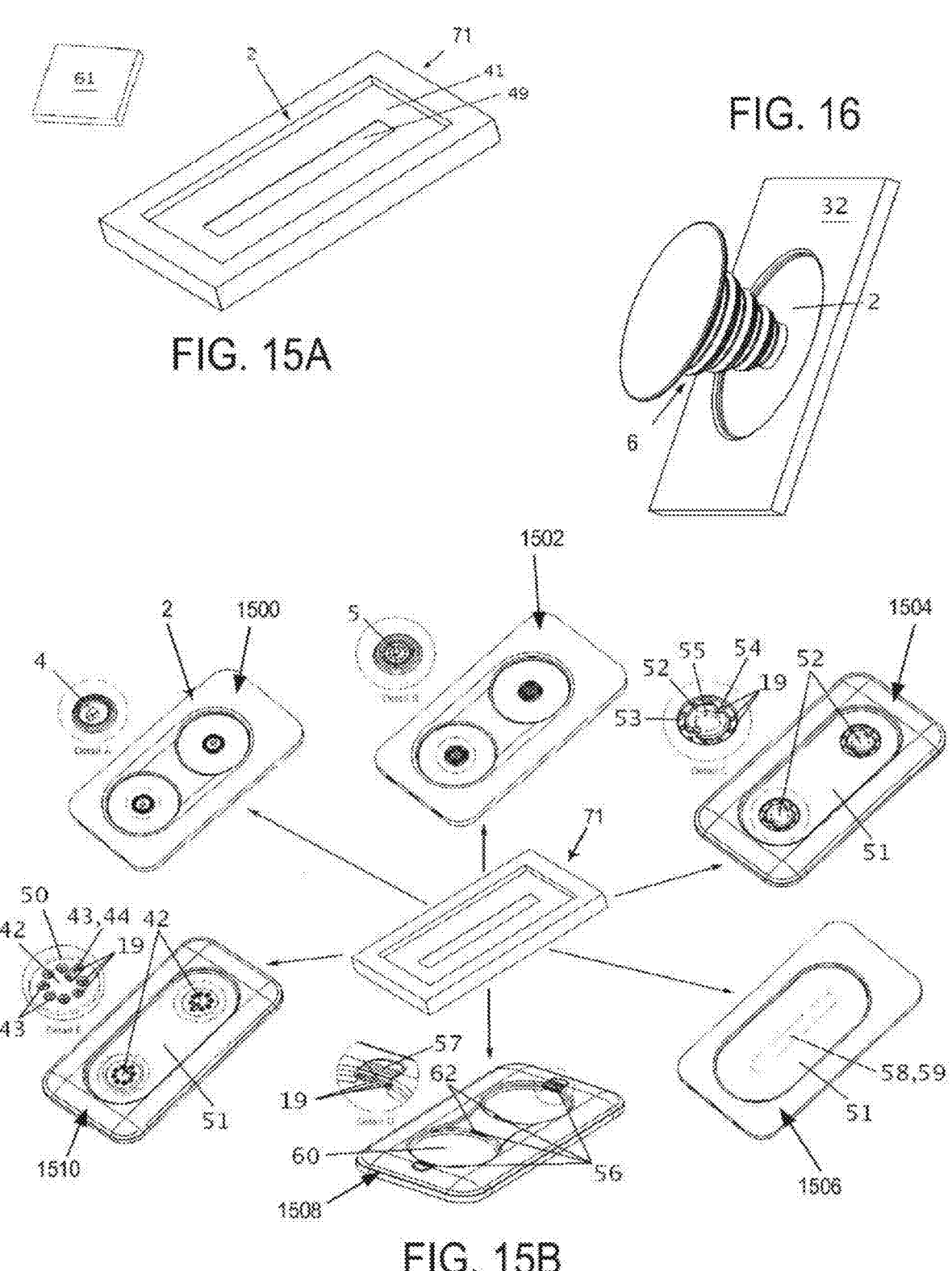
FIG. 15A is a back perspective view of a docking system including a generic docking accessory and a mobile electronic device with a generic docking platform formed on its back face, in an embodiment.
FIG. 15B is a back perspective view of the mobile electronic device of FIG. 15A and six possible docking platform, in embodiments.
FIG. 16 is a perspective view of a tablet device having a platform and docked accessory, according to an embodiment.

FIG. 15A shows an isometric view of a generic docking system, which includes a generic docking accessory 61 and mobile electronic device 71, similar to mobile electronic device 1. Device 71 is formed with docking platform having a generic docking accessory cavity 41 and docking connection system 49. Docking accessory 61 may be, for example, a battery, breathalyzer, massage paddle, LED light, camera flash, radio-frequency identification (RFID) tag, RFID reader, hand crank charger, hand pump charger, game controller, laser level, laser water purifier, scent generator, self-defense taser, lie detector device, credit card reader, robotic foot, a display such as a low-energy display, thermometer, power adaptor, halitosis detector, hygrometer, digital scale, anemometer, water analysis tool, altimeter, barometer, wireless headset, mechanical keyboard, optical projection keyboard, proximity sensor, video projector, DJ control/mixing functionality, remote control, memory card, headphones connector, accelerometer, pedometer, 3D motion tracking device, security perimeter, electrophysiology sensor, biofeedback device, diagnostic ultrasound device, therapeutic ultrasound, defibrillator, blood glucose monitor, pulse oximeter, finger print ID, laptop data lock, speaker, solar panel, walkie talkie, laser hair removal device, laser hair stimulator, or UV disinfector. The docking platform of device 71 is formed such that it may accept more than one docking accessory with the generic docking accessory cavity 41, as can be seen by viewing both FIGS. 15A and 15B.

FIG. 15B shows an isometric view of the mobile electronic devices 1500-1510 similar to mobile electronic devices 71 of FIG. 15A with isometric views of at least six embodiments of docking platform 2. It will be appreciated that views shown in FIGS. 15A-8 may be isometric front view or isometric back views. Clockwise from the upper left corner of FIG. 15B, an embodiment 1500 of docking platform 2 is the platform of FIG. 2, with Detail A view of docking connector 4.

An embodiment 1502 of docking platform 2, center top of FIG. 15B, is the platform of FIG. 3, with Detail 8 view of docking connector 5.

An embodiment 1504 of docking platform 2, top right of FIG. 15B, includes oval docking accessory cavity 51 and two docking connectors 52, each formed at one of the centers of the two circular ends of oval accessory cavity 51. Detail C is a detailed view of docking connector 52, connector 52 comprising annular connector cavity 53, cavity 53 further comprising a set of ten docking connector electrical contacts 19, this set of ten contacts comprising two duplicate sets of five electrical contacts 19, this pair of duplicate sets of contacts, together with two female aligning elements 54, enable attached docking accessories to be oriented in either of two positions separated by 180 degrees of rotation, connector 52 further comprising annular magnetic attachment system 55, attachment system 55 comprising a disc-shaped magnetic element formed beneath the surface of connector 52 to enable compatible docking accessories to form detachable magnetic attachments to connector 52.

An embodiment 1506 of docking platform 2, bottom right of FIG. 15B, includes oval docking accessory cavity 51 and docking connector 58, connector 58 comprising magnetic attachment system 59, magnetic system 59 comprising a single elongated magnetic element formed beneath the bottom face of accessory cavity 51 to enable docking connector 58 to form a detachable attachment to multiple independent docking accessories, the docking accessories operable to wirelessly transmit and/or receive at least one of data or power with mobile device 1. Note that docking connector 58 includes no electrical contacts. Also, it will be understood that although magnetic attachment system 59 is shown as a single elongated attached system, more than one magnetic attachment system may be used and different shaped attachment systems may be used without departing from the scope herein.

An embodiment 1508 of docking platform 2, bottom center of FIG. 15B, includes hourglass docking accessory cavity 60 and two docking connectors 56, connectors 56 each comprising fixed tab 62, spring tab 57, and docking connector electrical contacts 19. Detail D is a detailed view of spring tab 57 and five electrical contacts 19. Docking connector 56 is operable to form a detachable attachment to compatible docking accessories that are wedged between fixed tab 62 and spring tab 57. To release the docking accessories, spring tab 57 slides in the direction opposite the docking accessory.

An embodiment 1510 of docking platform 2, bottom left of FIG. 15B, includes oval docking accessory cavity 51 and docking connector 42. Detail E is a detailed view of docking connector 42, connector 42 comprising eight docking connector cavities 43, nine electrical contacts 19, one female aligning element 44, docking connector magnetic attachment system 50, attachment system 50 comprising a single annular magnetic element formed beneath the surface of accessory cavity 51, for forming detachable attachments with compatible docking accessories.

FIG. 16 shows an isometric view of one embodiment implemented with a tablet device 32. In this embodiment, tablet device 32 is shown with one attached generic expanding docking accessory, similar to attached generic expanding docking accessory 6. In one embodiment, the expanding docking accessory body measures roughly five inches in diameter, with an expanding docking accessory accordion that expands roughly three inches away from the backside of tablet device 32. Tablet device 32 may be configured with any and all above described docking platforms, docking connectors, docking accessories, etc. without departing from the scope herein. The size, shape, and number of docking connectors, docking platforms, docking cavities, docking accessories, etc. may vary without departing form the scope herein.

Figure 17A:
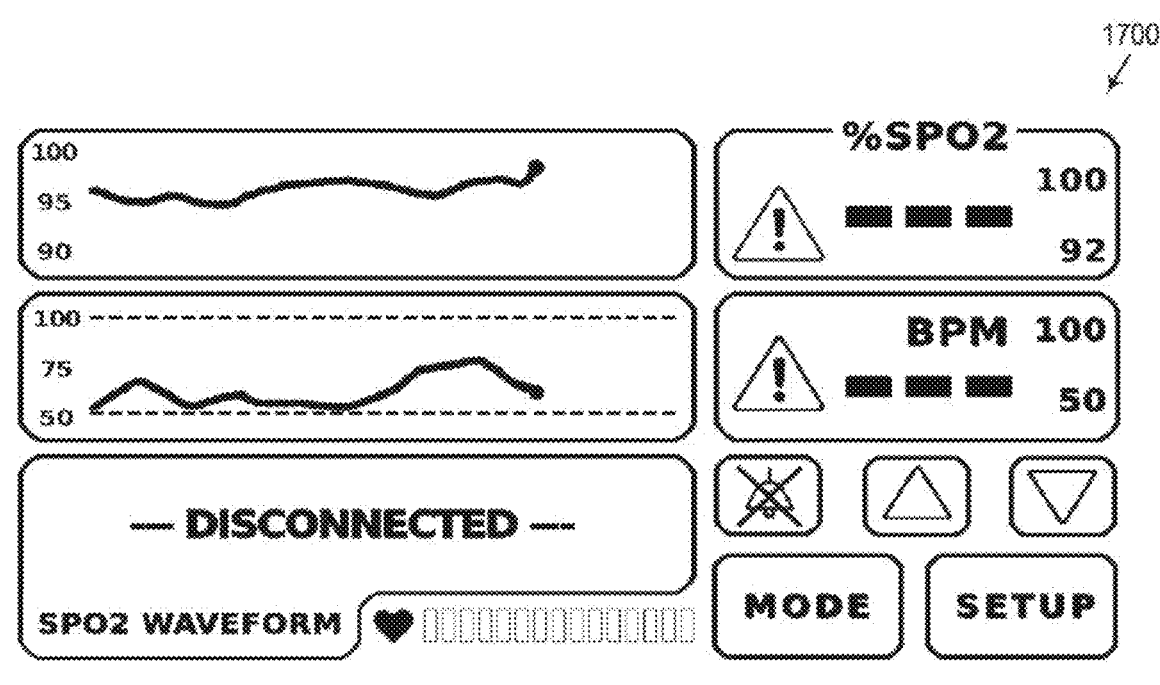
FIGS. 17A and 17B illustrate displays of physiological data as may be sensed by accessories attached with a mobile electronic device and presented on a screen of the mobile device, according to an embodiment.
Figure 17B:
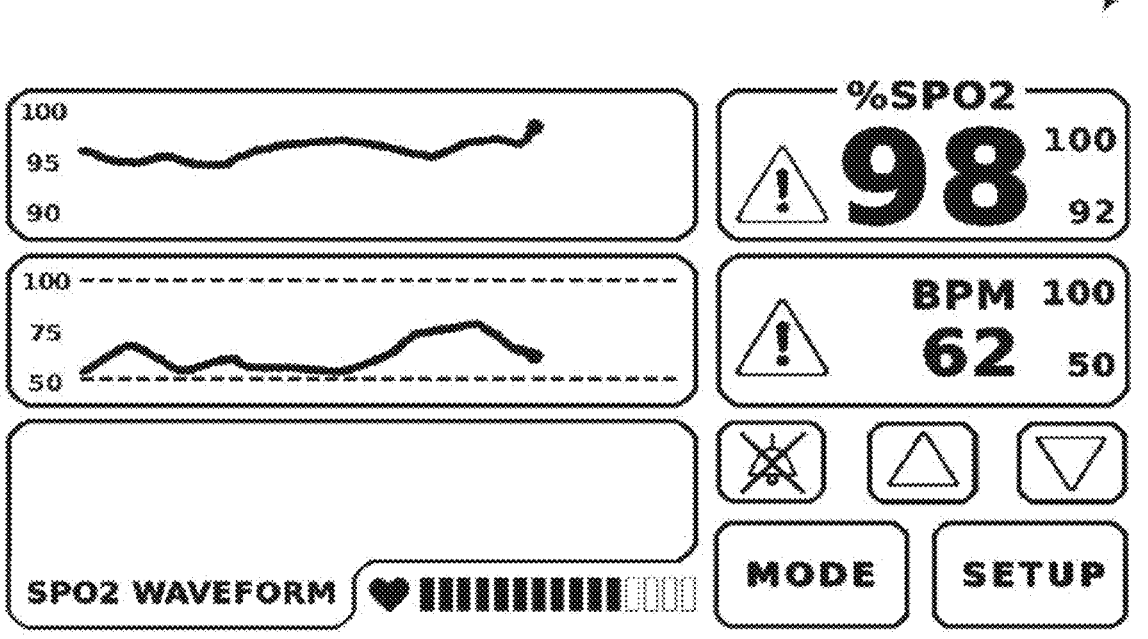

FIG. 17A shows one embodiment of a physiological/biometric function 1700 performed and displayed by, for example, mobile electronic device 1, 180 in cooperation with electrophysiology sensor electrode 35. After docking platform 2, 300 or mobile electronic device 1, 180 establishes authenticated communications with a pulse oximeter docking accessory, biological data may be displayed on a screen of mobile electronic device 1, 180, as shown in FIG. 17B.

Figure 18:
FIG. 18 illustrates a camera display, in an embodiment.

FIG. 18 shows an exemplary camera display function 250 performed by mobile electronic device 1, 180. After docking platform 2, 200, 300 or mobile electronic device 1, 180 establishes authenticated communications with cooperating accessories like lens accessory 170B, 222, 362 and supplemental flash accessory 170A, 220, 360, mobile electronic device 1, 180 may display camera display function 250.

Figure 19:
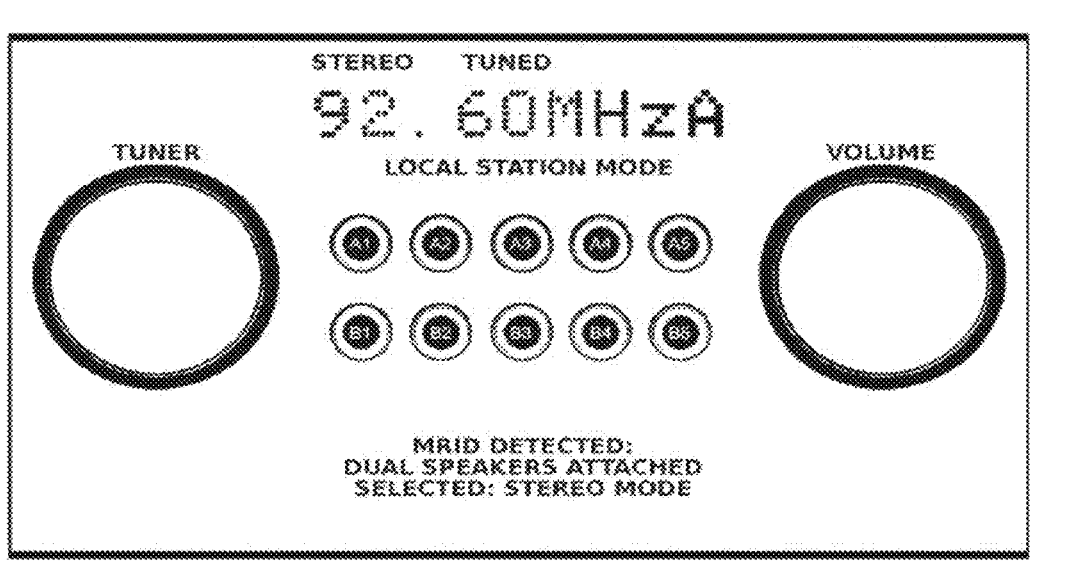
FIG. 19 shows an audio display, in an embodiment.

FIG. 19 shows an example audio display function 252 performed by docking platform 2, 300 or mobile electronic device 1, 180 in association with a sound or music application function. After docking platform 2, 300 or mobile electronic device 1, 180 establishes authenticated communications with cooperating accessories, like left and right stereo speaker accessories 28, mobile electronic device 1, 180 may display audio display function 252.

Figure 20:
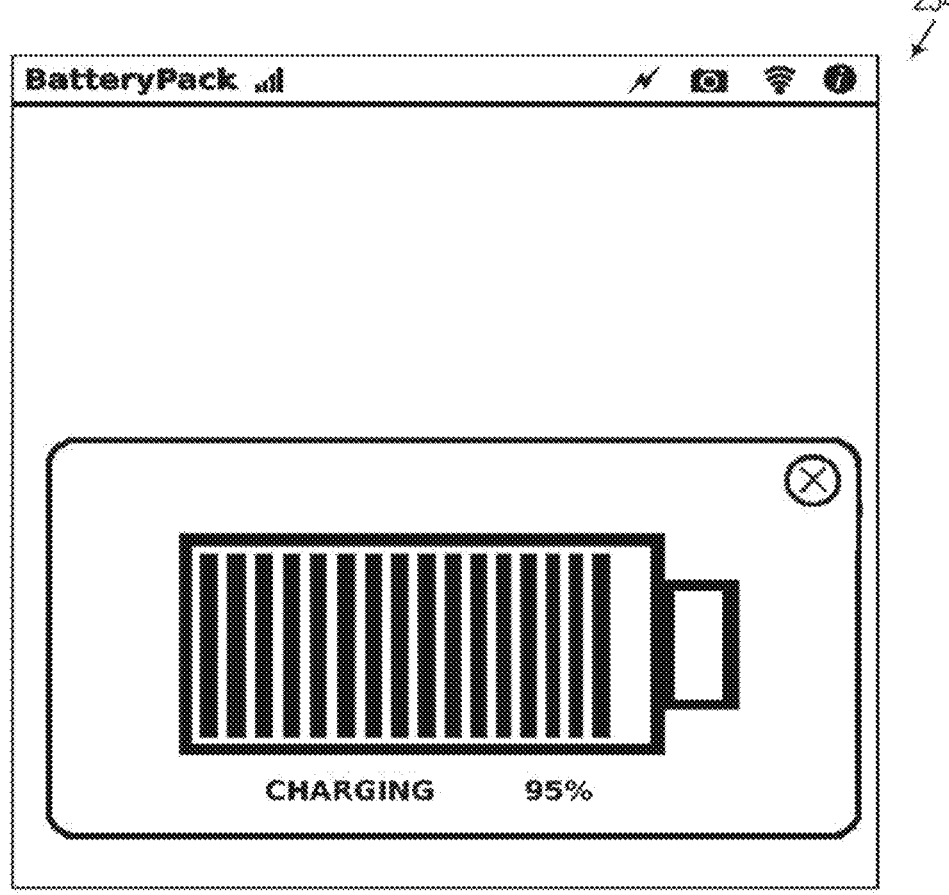
FIG. 20 shows a battery display, in an embodiment.

FIG. 20 shows an exemplary battery function 254 performed by docking platform 2 or mobile electronic device 1, 180. After docking platform 2, 200, 300 or mobile electronic device 1, 180 establishes communications with supplemental battery accessory 31, docking platform 2, 300 or mobile electronic device 1, 180 may display battery function 254.

Figure 21:
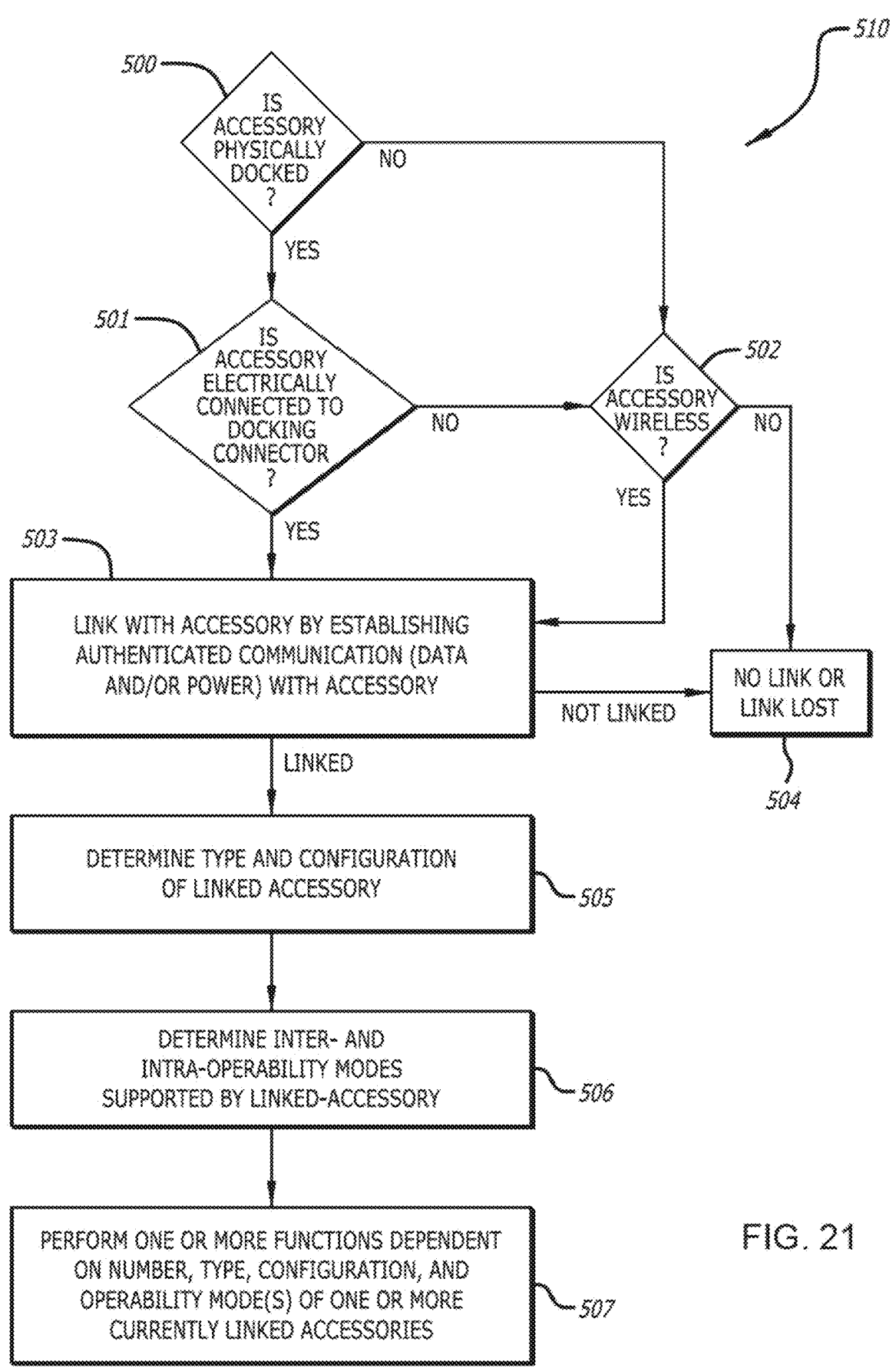
FIG. 21 is a flow chart detailing functionality associated with docking accessories to a docking system/docking platform.

FIG. 21 shows a flowchart 510 detailing a method of establishing a link between one or more docking accessories and a docking platform. The following description is directed to establishing a suitable link between one or more accessories and a docking platform. It will be understood that the same method may be applied to linking one or more accessories and a mobile electronic device. In addition, with only minor modifications the present method could be adapted to (1) link a docking platform to a mobile electronic device or (2) directly or indirectly linking one or more accessories, a docking platform, and a mobile electronic device to each other. In addition, the present method may be utilized for both recesses and flush mounted accessory systems, such as docking platform 2 and docking platform 300.

At step 500, method 510 determines if a docking accessory is physically docked to a compatible docking platform. One example of step 500 is controller/processor subassembly 320 of docking platform 300 registering a physical connection to one or more accessories 360, 362. If controller/processor subassembly 320 determines docking accessory 360, 362 is physically docked, method 510 moves to step 501, otherwise method 510 moves to step 502.

At step 501, method 510 determines if the docking accessory is electrically connected to an electrical contact-compatible docking platform. In one example of step 501, controller/processor subassembly 320 of docking platform 300 determines that accessory 360, 362 is electrically connected. Electrical connection may be for purposes of communication or the transfer of power. If method 510 determines that there is no electrical contact made, method 510 moves to step 502, otherwise method 510 moves to step 503.

At step 502, method 510 determines if the docking accessory supports one or more of wireless communication and wireless power transfer. If in step 502, method 510 determines the docking accessory is not a wireless accessory, method 510 moves to step 504, where no data or power link is formed and no further action is taken. If in step 502, method 510 determines that the docking accessory is a wireless docking accessory, step 502 moves to step 503. In one example of step 502, controller/processor subassembly 320 of docking platform 300 determines that accessory 360, 362 is a wireless accessory such as a wireless camera accessory.

At step 503, method 510 attempts to establish an authenticated communication link with the docking accessory. If no link can be established, method 510 moves to step 504, and no further action takes place, otherwise, once linked, method 510 moves to step 505. In one example of step 503, wireless communication subassembly 330 of docking platform 300 establishes a communication link between docking platform 300 and accessory 360, 362 by any one of know methods. It will be appreciated by one skilled in the art that docking accessories and docking platforms, such as docking accessories 6, 360, 362 and docking platforms 2, 200, 300, may be wireless linked to more than one other device (e.g., a computer, a docking accessory, a mobile device, a different docking platform, etc.), for example, to act as an intermediary, for purposes of coordination, cooperation, and/or communication, or for unrelated communications.

At step 505 of method 510, a determination is made regarding the type and configuration of the linked docking accessory. In one example, controller/processor subassembly 320 of docking platform 300 determines that a docking accessory is one version of camera accessory 362, such as a camera accessory 362 having a 28 mm F/1.8 lens that does not include an integrated flash. Determining the type and configuration of a linked docking accessory may be done by, for example, a message passing protocol between the docking accessory 362 and docking platform 300. Method 505 then moves to step 506.

At step 506, method 510 determines, for example by utilizing a message passing protocol, the types and level of cooperation/operability between the docking platform and the one or more docking accessories. In one example, docking platform 300 determines that a docking accessory 360, 362 supports one or more interoperability modes, for example a camera accessory 362 that interoperates with a flash accessory 360. In another example, docking platform 2 determines that docked speaker accessory 28 can interoperate with another docked speaker accessory 28 to form a left and right stereo speaker pair or a bass and treble speaker pair. In still another example, docking platform 100 determines the docking accessory is a single docking accessory that utilizes two or more docking connectors, like game controller accessory 124, battery accessory 31, or solar charger accessory 30. Method 510 then moves to step 507. Alternative, docking platform 100 determines there is not cooperation/interoperability between the attached docking accessories, such as hygrometer/barometer/thermometer docking accessory 120 and flashlight docking accessory 122.

Figure 29:
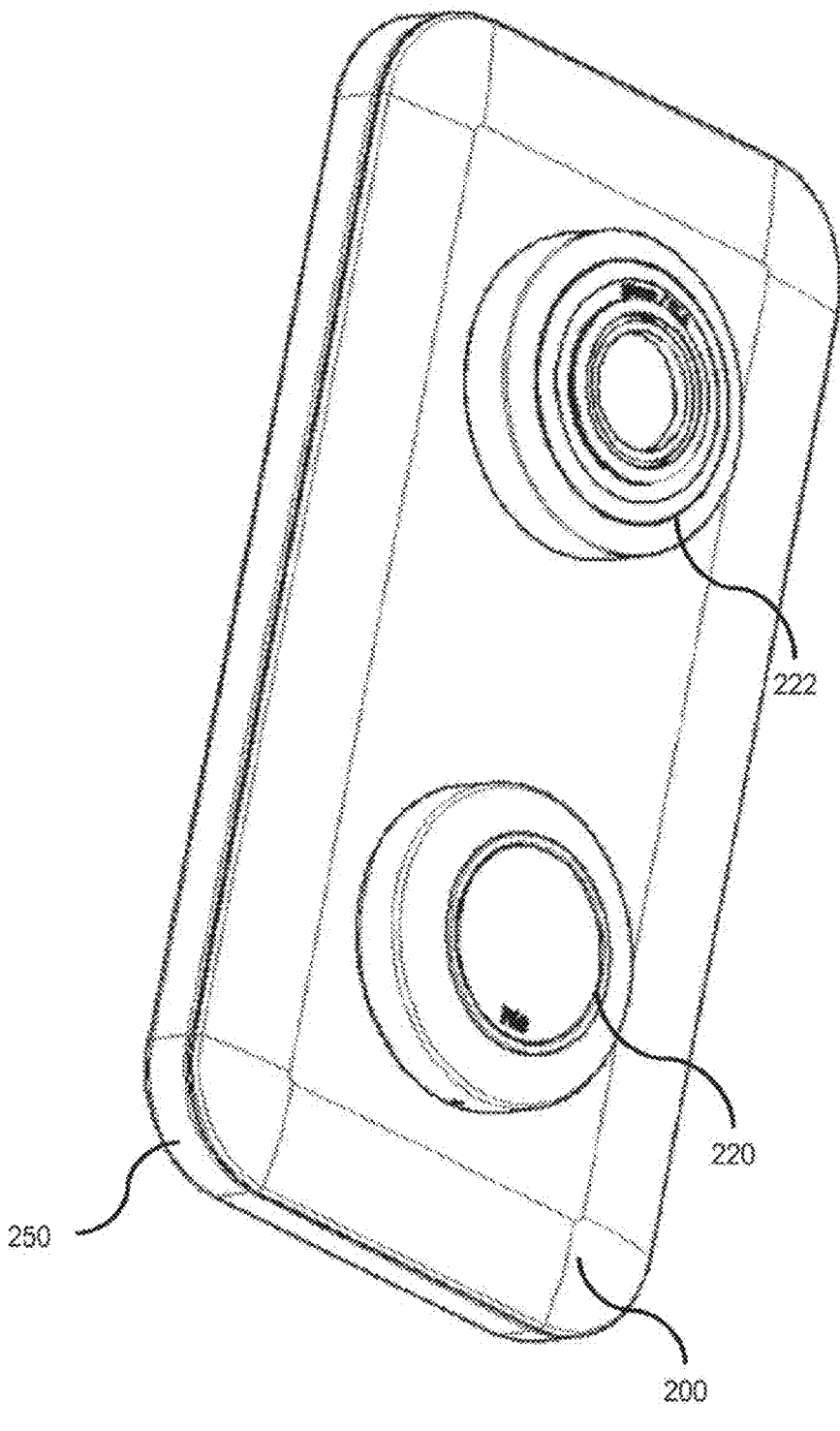
FIG. 29 is a perspective view of the platform, docking accessories and mobile electronic device of FIG. 28, with the docking accessories attached.

At step 507, method 510 performs one or more functions, depending on the number, type, configuration, and operability mode(s) of one or more currently docked docking accessories. In one example of step 507, docking platform 2 initializes functionality to enable speaker accessories 28 to cooperate by designating one speaker accessory 28 as a right speaker and the other speaker accessory 28 as a left speaker and transmitting left and right channel amplified signals so speaker accessories 28 function as a stereo speaker system. In another example, docking platform 300 includes functionality to enable camera accessory 362 and flash accessory 360 to coordinate such that a flash is delivered under low light conditions when an image capture event is signaled, as depicted in FIG. 29. In still another example, a wireless link is established at step 503, and a wireless scale may operate, in one embodiment, independently of any docked accessories.

It will be understood that a linked accessory does not need to be continuously connected to its docking platform or mobile electronic device, but can, after linking, be located a position spaced away from the linked docking platform or mobile electronic device. Some examples of locating a linked accessory at a position spaced from the linked docking platform or mobile electronic device include, but are not limited to cameras accessories, audio speaker accessories, physiological sensing accessories, motion detector accessories, GPS accessories, etc.

Platform Embodiments

Figure 22A:
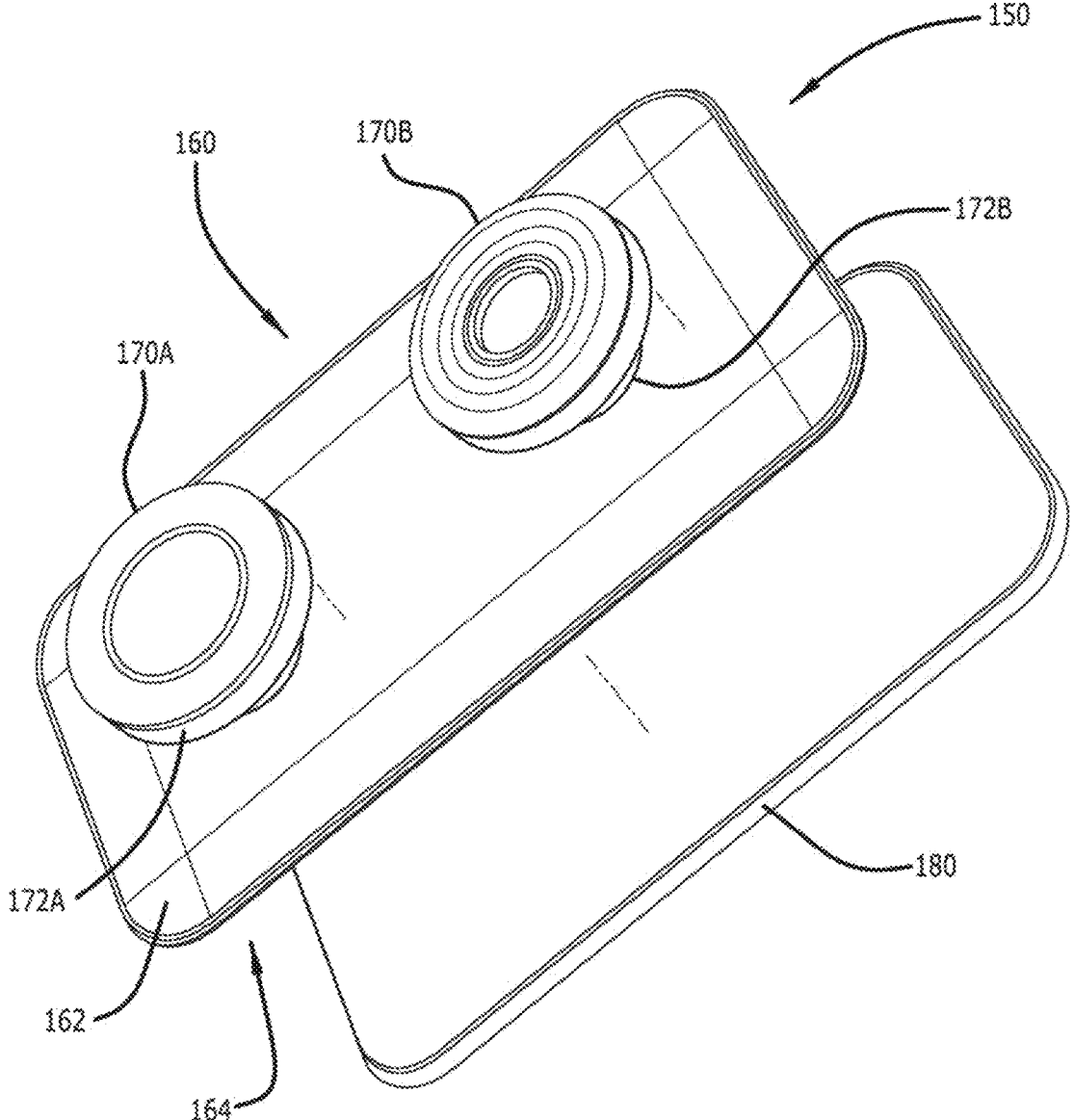
FIG. 22A is a simplified, exploded perspective view of a docking platform system, including a docking platform and two docking accessories with a mobile electronic device, according to an embodiment.

One embodiment of the docking platform system, docking platform system 150, is shown in a partial exploded view in FIG. 22A and comprises a docking platform 160 and one or more docking accessories. Example docking accessories 170A, 170B are shown in FIG. 22A aligned with and detached from docking platform 160. Also shown in FIG. 22A is a mobile electronic device 180 (shown detached), which is compatible with docking platform system 150. Mobile electronic device 180 may be a mobile phone, smartphone, electronic tablet, portable media player, or other mobile electronic device.

Docking platform 160 is formed to detachably attach to mobile electronic devices at its front surface 164 and to enable detachable attachment of docking accessories to the docking platform at its back surface 162. Docking platform 160 may be made generally thin in one dimension and, as discussed immediately above, includes two primary attachment surfaces: a docking platform back surface 162 and a docking platform front surface 164.

Docking accessories 170A, 170B may attach to docking platform 160's back surface 162, or to cavities or protrusions thereon, by way of an accessory docking system, an example of which is depicted as accessory docking system 172A, 172B. Docking platform 160 may include a mobile electronic device connection system (not shown in FIG. 22A) on docking platform front surface 164 that enables detachable attachment of docking platform 160 to mobile electronic device 180.

In alternative embodiments, mating connections of a docking platform to a mobile electronic device may be formed and located, for example, on edges, sides, and/or rims of the docking platform and/or edges, sides, and/or rims of the mobile electronic device.

In additional embodiments, mating connections of a docking platform to a mobile electronic device may be formed to encase the front edges, back, and sides (or portions thereof) of the mobile electronic device, thereby forming a case or partial case.

In still further embodiments, the docking platform may include a mobile electronic device encasing or non-encasing side portion and a back portion configured to form a detachable attachment with the side portion.

The mobile electronic device connection system may include one or more mechanical mating mechanisms for detachably attaching docking platform 160 to mobile electronic device 180. Mechanical mating mechanisms may take the form of a reusable adhesive, sticky gel, snap-fit, magnetic bond, suction cup, micro-suction tape, spring-clip, key release, slide-lock, slot release, hole release, interlocking mechanism, and/or screw, among other forms.

In an embodiment, the mobile electronic device connection system includes mechanical and/or electrical mating mechanisms formed on both the docking platform and the mobile electronic device. Mechanical and electrical mating mechanisms facilitate fixing the docking platform to the mobile electronic device and facility electrical communication between the two.

In one embodiment, the mobile electronic device connection system includes one or more electrical contacts for transferring electrical power, data, and/or signals between the mobile electronic device and docking platform.

In some embodiments, the mobile electronic device connection system includes mechanical mating mechanisms formed solely on docking platform 160. In one embodiment, the electronic device connection system includes a sticky gel permanently attached on front surface 164 of docking platform 160. The sticky gel may further include a first adhesive surface formulated for permanent or semi-permanent attachment to docking platform 160 and a second adhesive surface formulated to enable, for example, tool-less and chemical-less detachment from mobile electronic device 180, the second adhesive surface further formulated to prevent residue formation on mobile electronic device 180 after detachment of docking platform 160 from mobile electronic device 180.

The accessory docking system, an example of which is accessory docking system 172A, 172B (also see other docking systems, such as 103A, 103B of FIG. 22B) may include one or more mechanical mating mechanisms for detachably attaching docking accessories to docking platform 160. Mechanical mating mechanisms may be formed on docking platform 160 and/or on docking accessories 170A, 170B. Alternatively or additionally, the mating mechanisms may also be formed as a snap-fit, magnetic bond, reusable adhesive, sticky gel, suction cup, micro-suction tape, spring-clip mechanism, slot-hole key release, reusable adhesive, slide-lock, and/or screw, for example.

In some embodiments, the accessory docking system includes one or more electrical contacts for transferring electrical power, data, and/or signals between docking accessories and the docking platform.

Figure 22B:
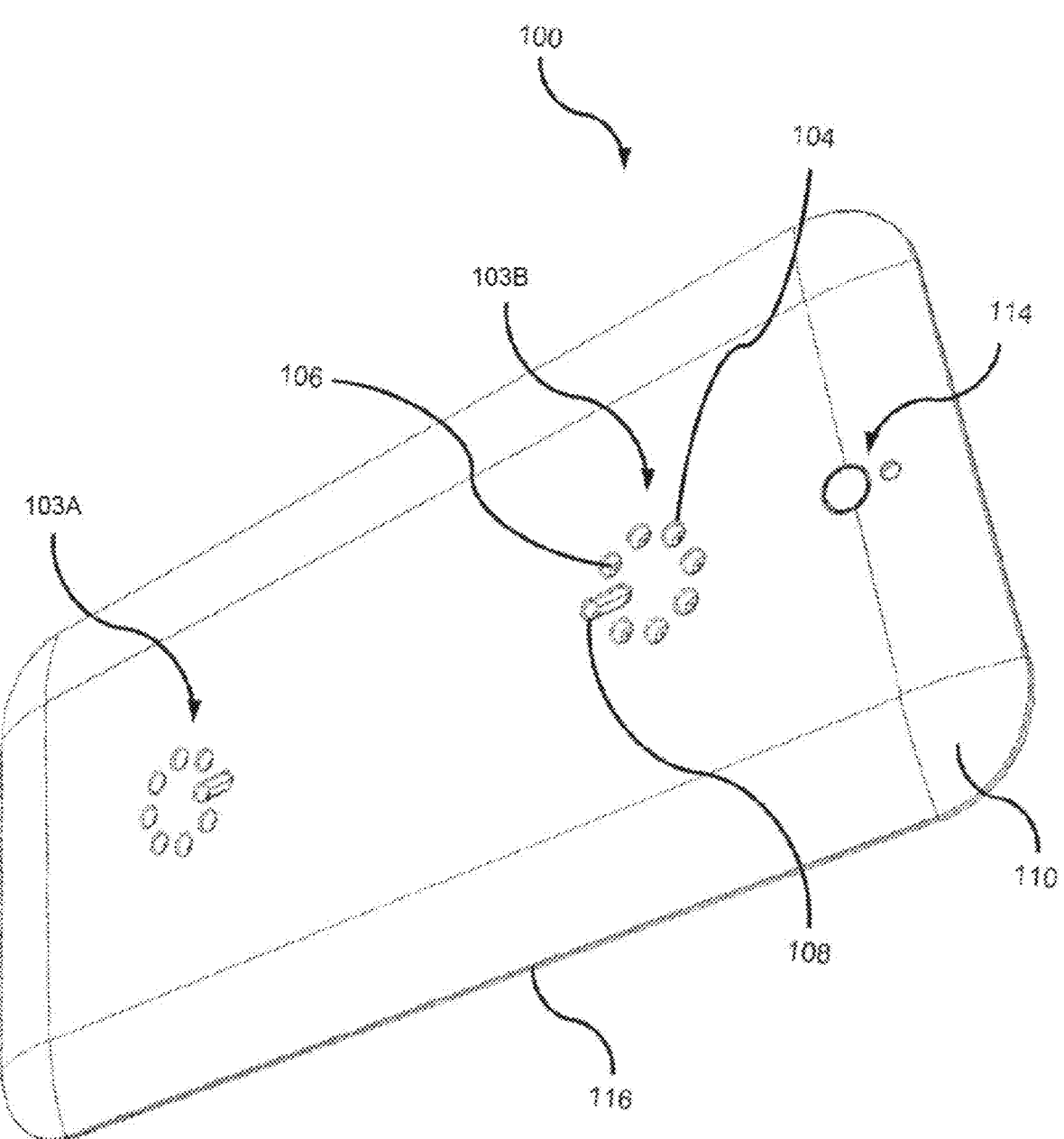
FIG. 22B is a perspective view of a docking platform, according to an embodiment.

An additional embodiment of the docking platform, docking platform 100, is shown in FIG. 22B. Docking platform 100 is similar to docking platform 160, with some changes to the accessory docking system and other elements, such as window elements 114 (see below). Docking platform 100 includes accessory docking system 103A, 103B (docking platform external portions shown), formed on a back surface of docking platform 100. Accessory docking system 103A, 103B, as depicted, include one or more connection cavities (examples of which include connection cavities 104, 108) and one or more electrical contacts (an example of which is electrical contact 106). Electrical contact 106 may enable power, data, and/or signal transfer between docking platform 100 and docking accessories.

The accessory docking system may be formed to optionally facilitate orientation of docking accessories in one or more mating directions. For example, a portion of accessory docking system 103B includes connection cavity 108 in the form of a keying slot. As such, if a docking accessory is formed to include a mating protrusion, connection cavity 103B acts to ensure the docking accessory mates in a single orientation. Alternatively, if a docking accessory is formed to include, for example, no slot protrusion, the docking accessory may mate in a plurality of orientations.

The accessory docking system may also be formed without keying slots (as in FIG. 24A) or with cavities or slots that facilitate orientation of docking accessories in a fixed number of directions. For example, the four directions enabled by the accessory docking systems cavities 310A and 310B of docking platform 300, as shown in in FIG. 32. Such orientation may be used as a mechanical way of selecting docking accessory functionality for accessories with a plurality of functions or operations. For example, rotating a camera flash docking accessory 90 degrees may be used to change the flash from white light to infrared light. Such rotation of a flash may also communicate to a cooperating camera accessory to switch to infrared imaging, such that the rotation of one accessory may be used to select the operation of a cooperating accessory.

Figure 23:
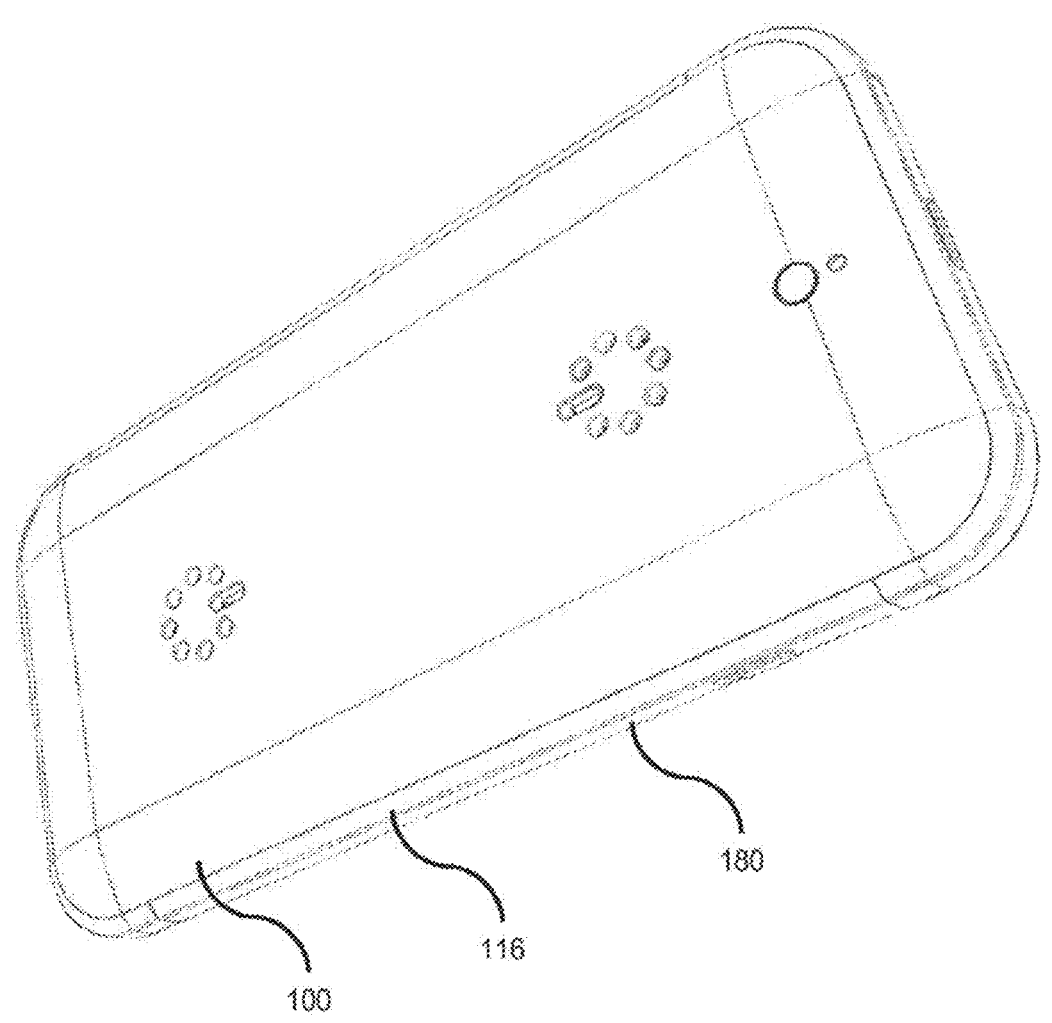
FIG. 23 is a perspective view of the docking platform of FIG. 22B attached to a mobile electronic device.
Figures 24A, 24B, 24C:
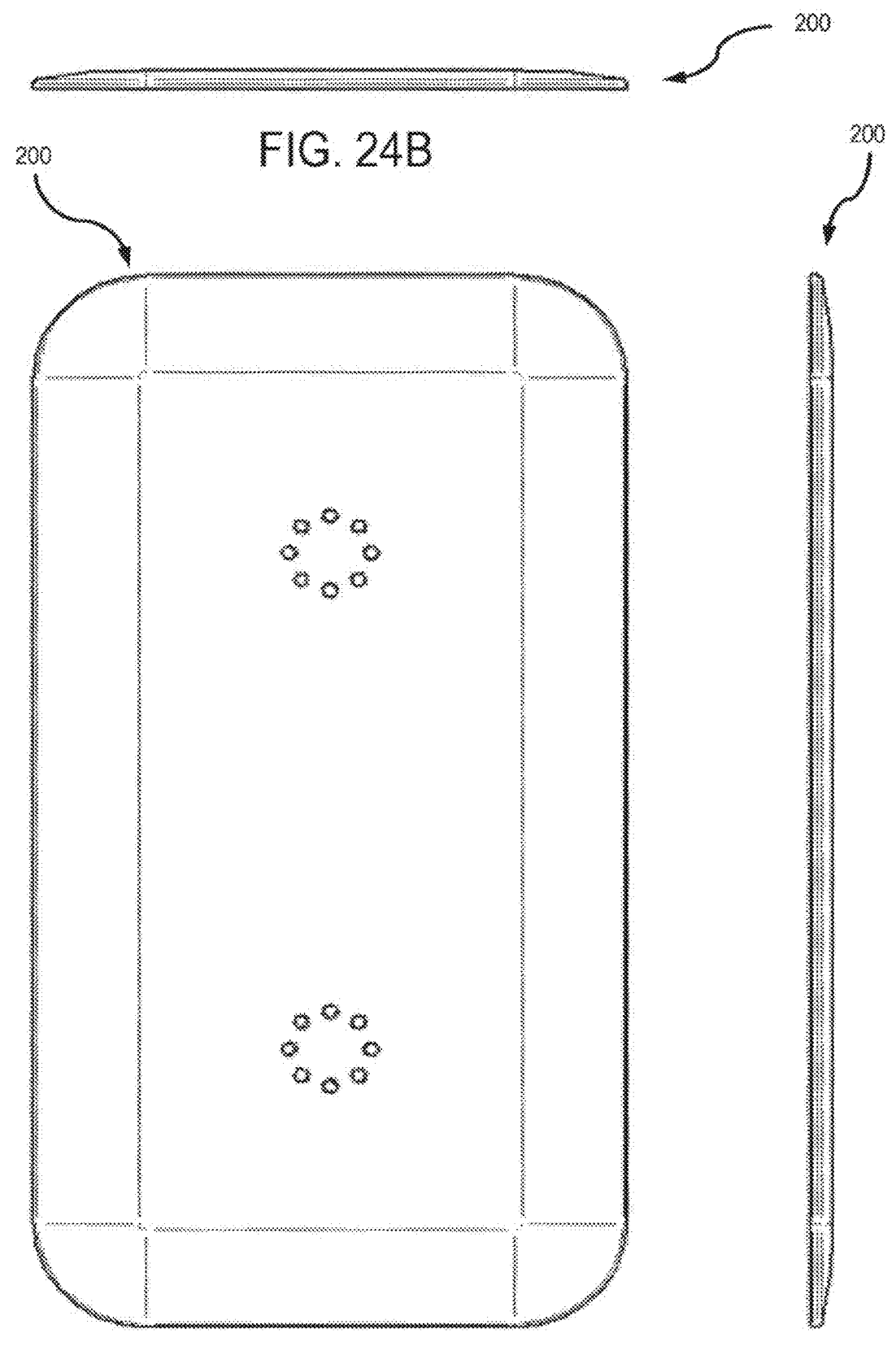
FIGS. 24A, 24B, and 24C are back, bottom, and side views, respectively, of a docking platform, according to an embodiment.
Figures 25A, 25B:
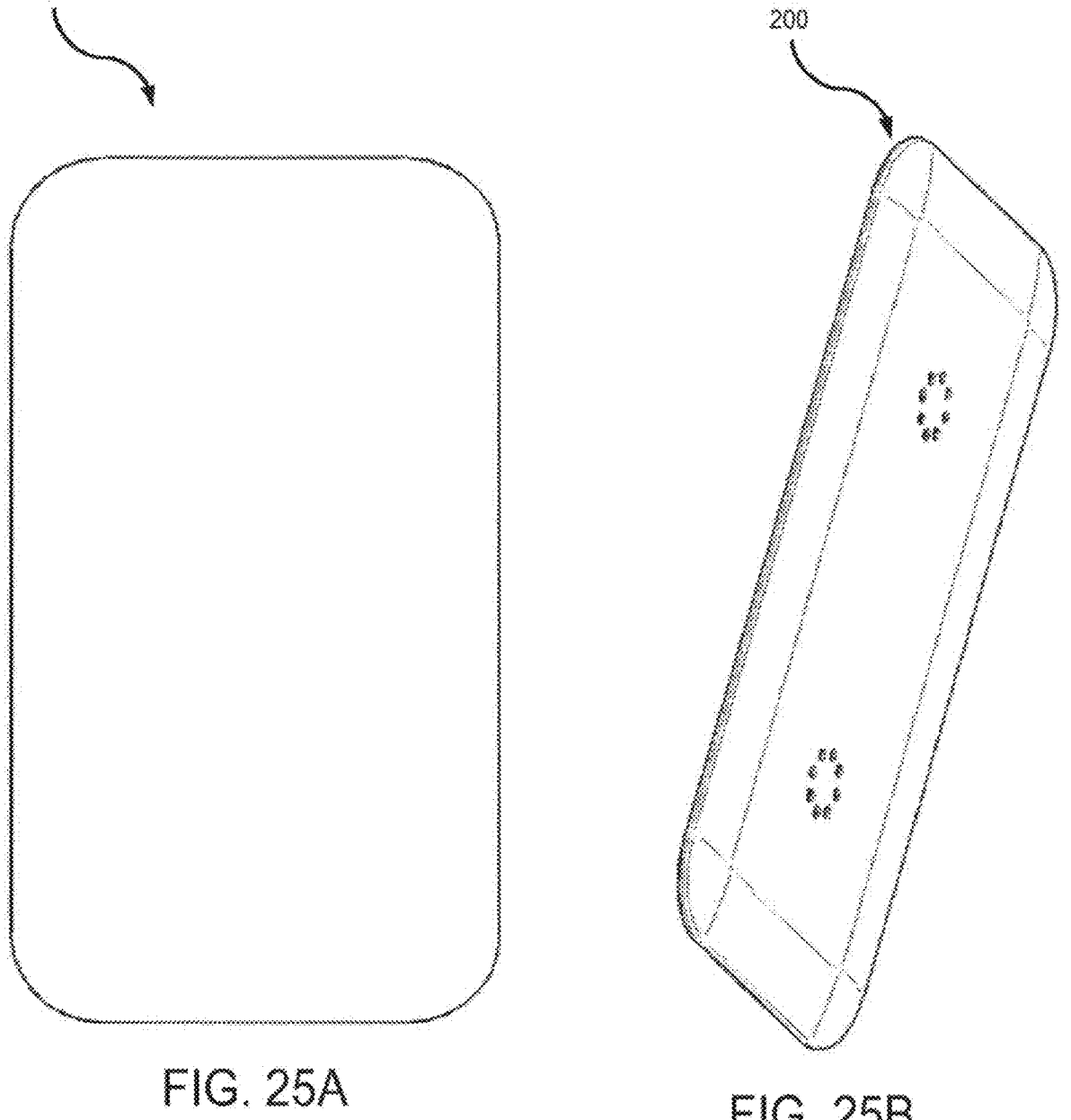
FIG. 25A is a front view of the docking platform of FIG. 24A.
FIG. 25B is a rear perspective view of the docking platform of FIG. 24A.

Also depicted in FIG. 22B are window elements 114, which are formed as cavities to prevent functional or physical impediment of mobile electronic device elements (such as lenses, flashes, microphones, speakers, and other elements) located on a back surface of the mobile electronic device. Window elements 114 may optionally include transparent and/or perforated material layers or covers to improve cosmetics, protection, and/or tactility, among other purposes. FIG. 22B additionally depicts an example curvature, curvature 110, applied along edges of docking platform 100 to improve tactility and cosmetics, improve integration between docking platform 100 and a mobile electronic device, and reduce perceived thickness of docking platform 100. Further depicted in FIG. 22B is a mating perimeter 116 defining a mating surface outer boundary. In FIG. 23, docking platform 100 is shown detachably attached to a mobile electronic device 180. The mating surface outer boundary is shown in FIG. 23 as mating perimeter 116.

Figures 30A, 30B, 30C:
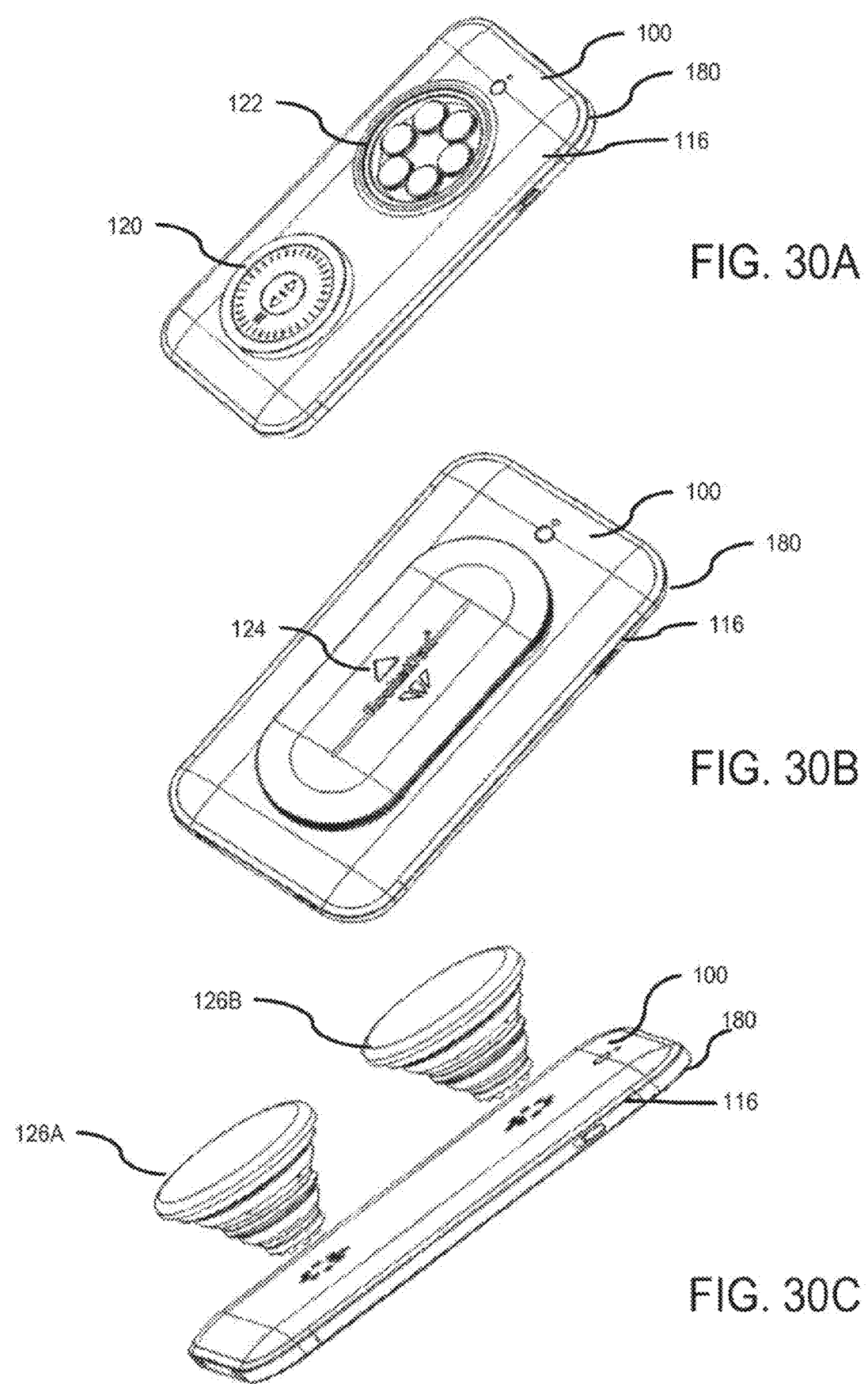
FIGS. 30A, 30B, and 30C are perspective views of the docking platform of FIG. 22B attached to a mobile electronic device and mated and/or aligned with alternative, exemplary docking accessories.

Docking platform 100 is shown detachably attached to mobile electronic device 180 in FIGS. 30A, 30B, and 30C. Also illustrated in FIGS. 30A, 30B, and 30C is mating perimeter 116 and additional examples of docking accessories. In FIG. 30A, a hygrometer/barometer/thermometer docking accessory 120 and light docking accessory 122 are shown detachably attached to docking platform 100. In FIG. 30B, a game controller docking accessory 124 is shown detachably attached to docking platform 100. In FIG. 30C, expandable speaker docking accessories 126A, 126B are shown, in an expanded state, aligned and detached from docking platform 100. Docking accessories compatible with docking platform 100 include but are not limited to batteries, solar panels, wireless chargers, wireless charging receivers, LED lights, disco lights, hand-crank chargers, weather sensors, particulate sensors, chemical sensors (e.g., a chemical or material analyzer accessory that may be used for health, environmental, or materials monitoring or analysis. Such as a smoke detector, radon detector, blood analyzer, urine analyzer, breathalyzer (mentioned), mold detector, food analyzer, freshness analyzer, lead detector, etc.), pressure and weight sensors, camera flashes, camera lenses, camera monopod or tripod, a DAC, an ADC, a digital audio power amplifier, secondary display screen (e.g., E-Ink, LED, OLEO, LCD, etc.) electrophysiology sensors, memory cards and storage devices, keyboards, optical character reader, robotic mechanisms, glucose monitors, infrared fat monitors, breathalyzers, massage paddles, ultrasound paddles, pulse oximeters, headphones, headphone cable interfaces, general cable interfaces, stands, surface and object attachment mechanisms (suction cups, clips, etc.), and authorization devices, among other accessories. It will be appreciated that some accessories may be configured with a plurality of related or unrelated functionalities.

Figure 26:
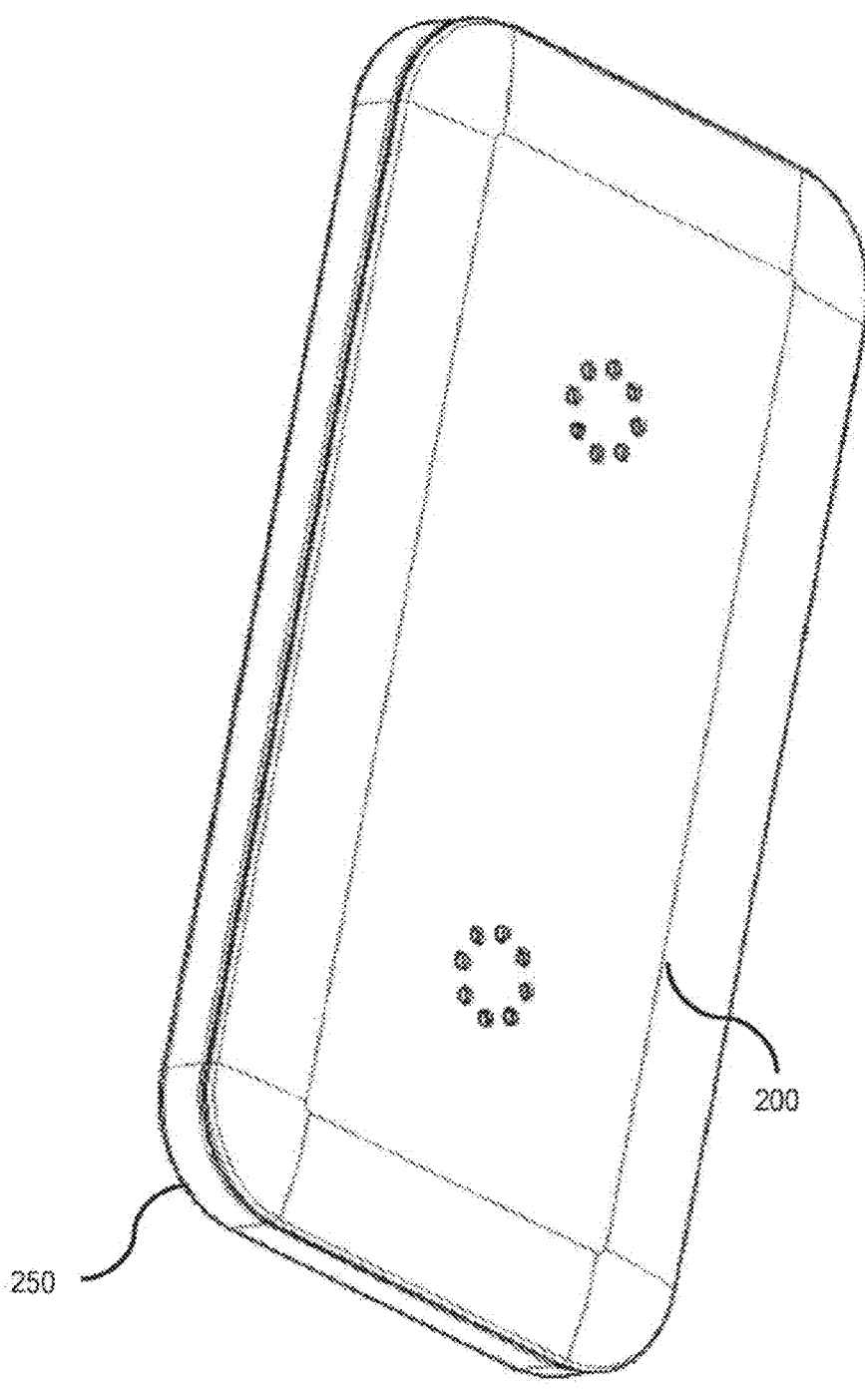
FIG. 26 is a perspective view of the docking platform of FIG. 24A, shown attached to a mobile electronic device.

Docking platform 200, shown in back view (FIG. 24A), bottom view (FIG. 24B), side view (FIG. 24C), front view (FIG. 25A), and isometric back view (FIG. 25B), is an example of a wireless docking platform with no front-side electrical contacts. In FIG. 26, docking platform 200 is shown detachably attached to a mobile electronic device 250. Docking platform 200 may, for example, detachably attach to mobile electronic device 250 by the inclusion of magnetic or magnetic attracting elements, a layer of sticky gel or micro-suction tape on the front surface of docking platform 200, or other mechanical fastening mechanisms.

Figure 27:
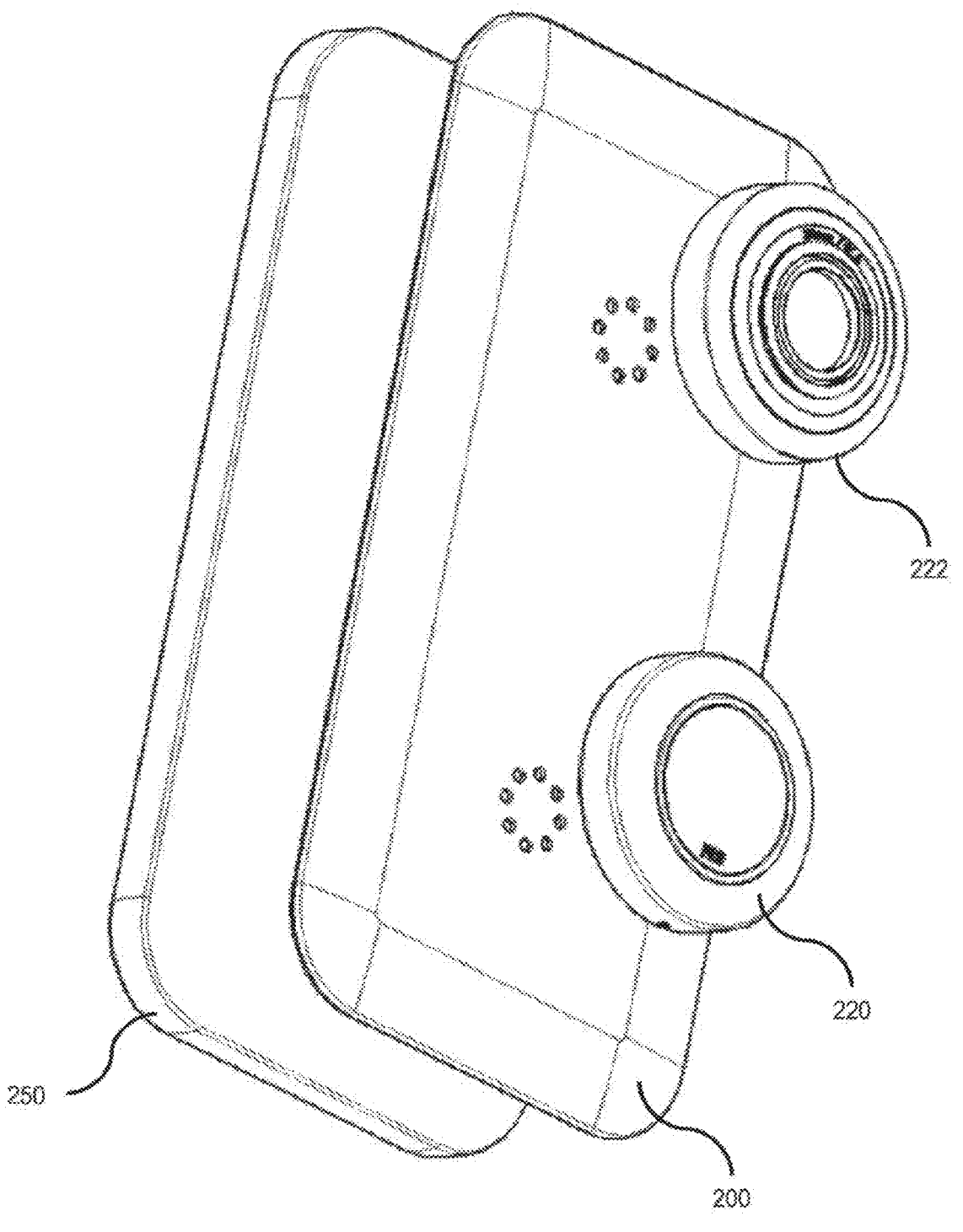
FIG. 27 is a perspective view of the docking platform of FIG. 24A, shown aligned with and detached from docking accessories and a compatible mobile electronic device.
Figure 28:
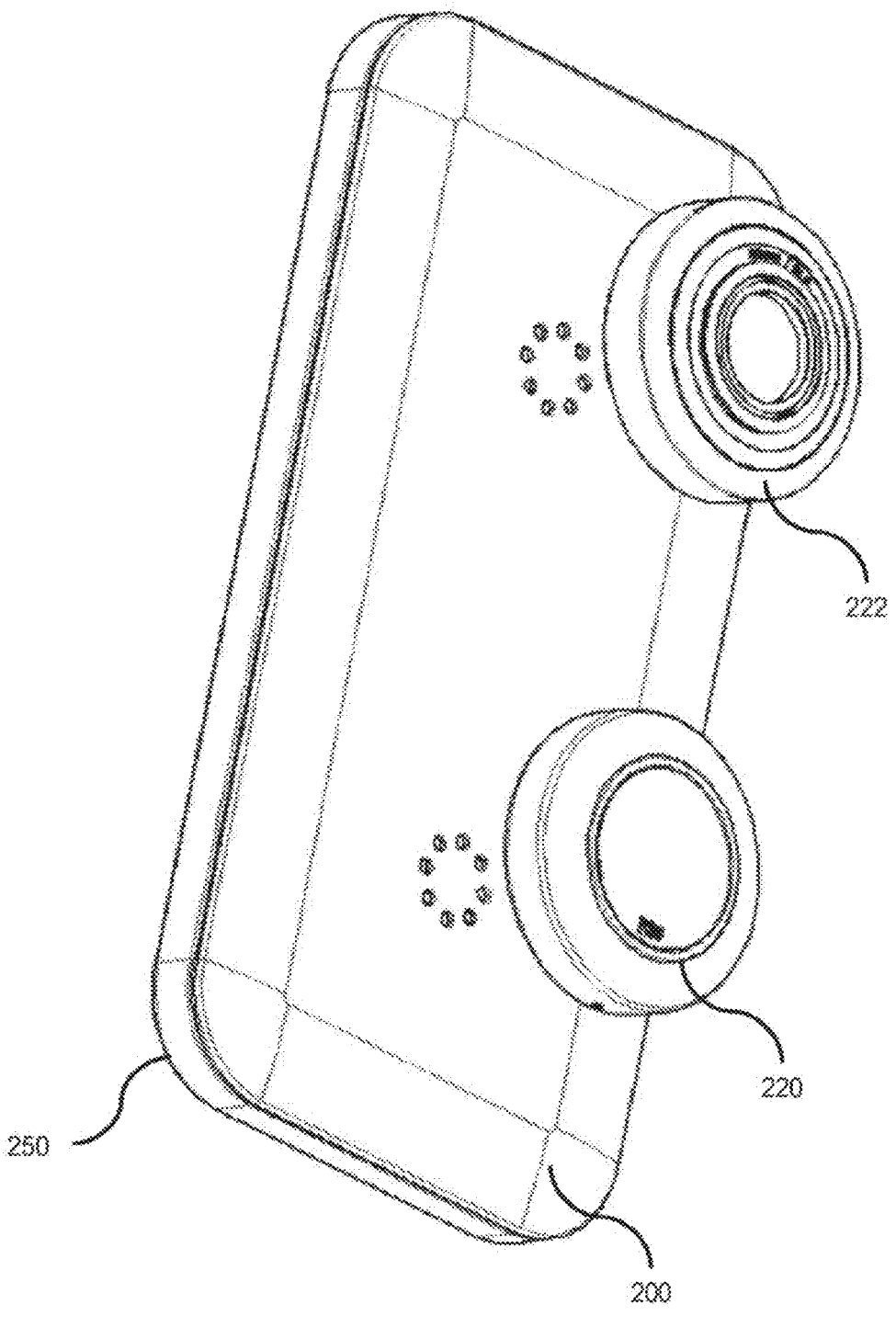
FIG. 28 is a perspective view of the docking platform of FIG. 24A, shown attached to a mobile electronic device and aligned with and detached from two docking accessories.

Docking platform 200, docking accessories 220, 222, and mobile electronic device 250 are shown in various attached and detached states in FIGS. 27, 28, and 29. In FIG. 27, docking platform 200, docking accessories 220, 222, and mobile electronic device 250 are shown in an aligned and detached configuration. In FIG. 28, docking platform 200 is shown detachably attached to mobile electronic device 250 and aligned with and detached from docking accessories 220, 222. In FIG. 29, docking platform 200, docking accessories 220, 222, and mobile electronic device 250 are shown in a fully attached configuration.

Figure 31:
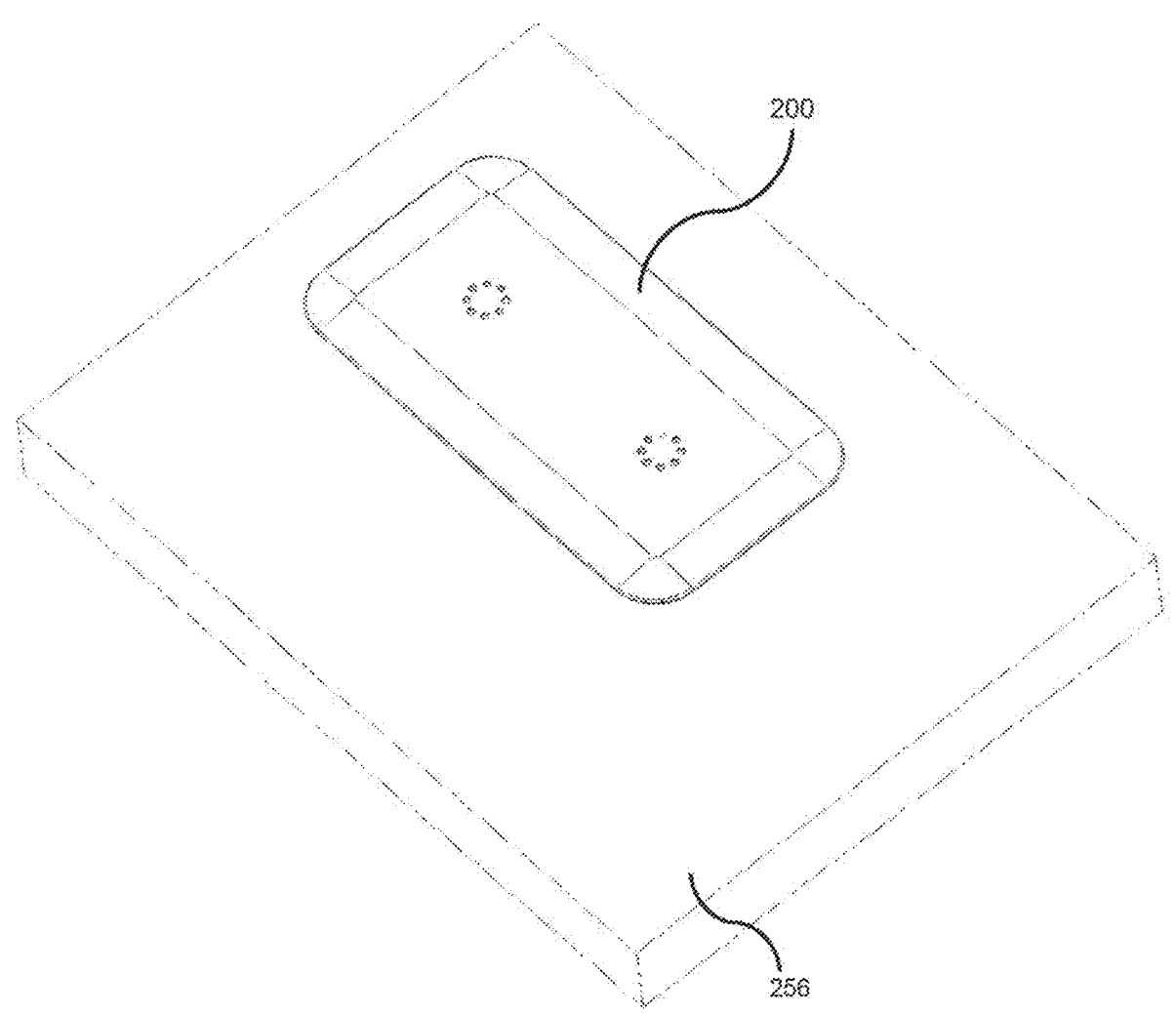
FIG. 31 is a perspective view of the docking platform of FIG. 24A, shown attached to an object or surface.

In FIG. 31, docking platform 200 is shown detached from mobile electronic device 250 and detachably attached to an object/surface 256. Mechanisms of detachable attachment of docking platform 200 to object/surface 256 may include sticky gel, micro-suction tape, suction, magnet, clip, hook, and hook and loop fastener, among other mechanisms.

Figure 32:
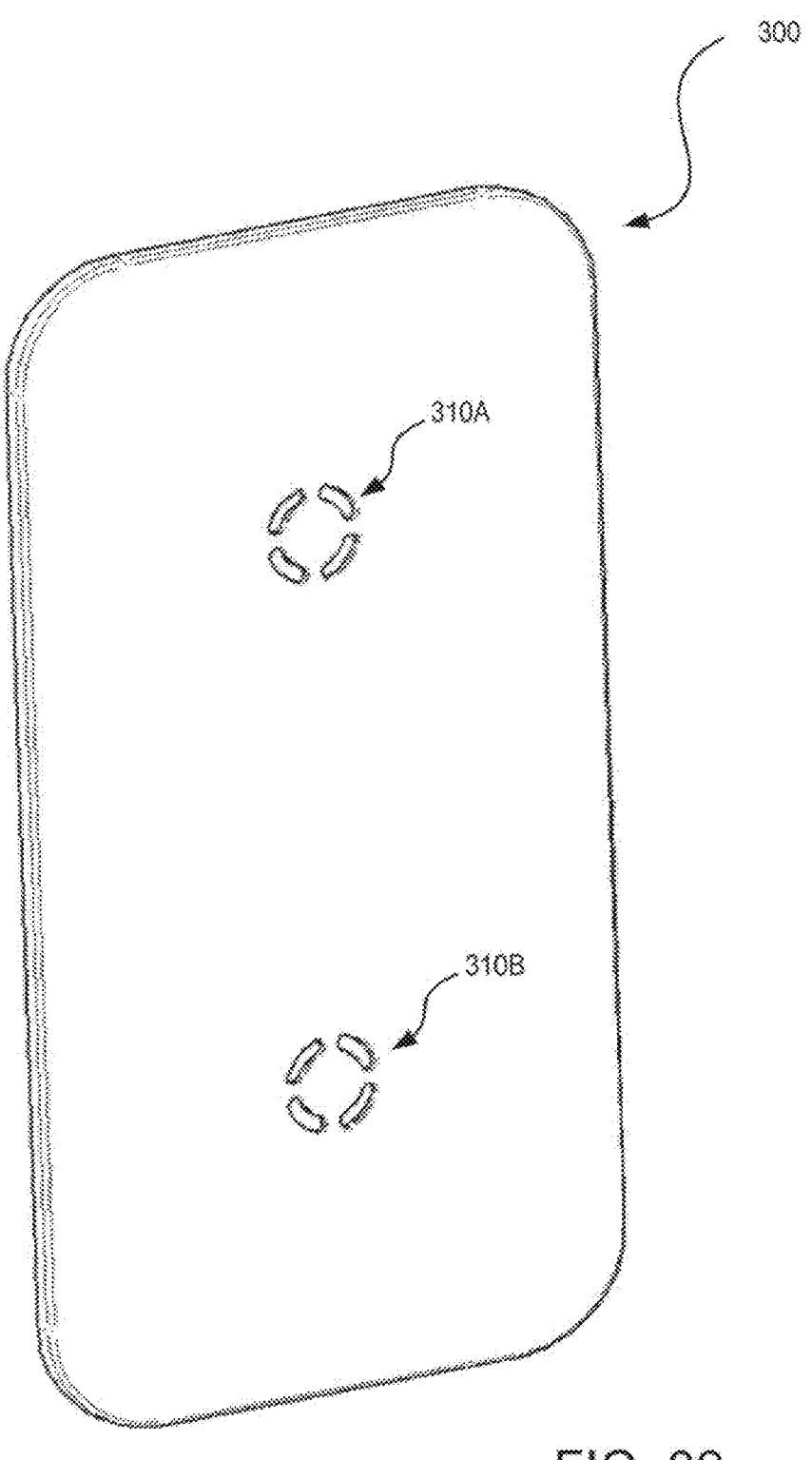
FIG. 32 is a perspective view of a docking platform having docking connectors of an alternate shape.

Docking platforms may include an accessory docking system, a mobile electronic device connection system, one or more electronic assemblies, and one or more enclosure assemblies. Docking platform 300, an additional embodiment of the docking platform detailing external and internal components, is depicted in FIG. 32 in isometric view and in FIGS. 33 and 34 in exploded view. It will be understood that the present docking systems may be formed in a manner similar to that explained here for docking platform 300. In addition, more or fewer mechanical, electrical, and magnetic components may be added to any of the embodiments discussed here in without departing from the scope herein.

Docking platform enclosure assemblies encapsulate internal components of the docking platform and may be formed of one or more layers or components. In the embodiment of docking platform 300, the docking platform body includes an enclosure 302 and an enclosure cover 306, mated by temporary, semi-permanent, or permanent means.

Enclosure 302 and enclosure cover 306 may be formed of any rigid or semi-rigid material, may be electrically nonconductive. Optionally, enclosure 302 and enclosure cover 306 may include stiffening ribs to minimize flexing of docking platform 300. Example docking platform body materials include plastic (acrylonitrile-butadiene styrene, polycarbonate, blended plastics, and other plastic formulations), carbon fiber, and metal (aluminum or stainless steel, for example), among other materials. Enclosure assemblies may incorporate an applied coating or finish for surface protection, electrical insulation, and/or other purposes. For example, enclosure assemblies constructed of plastic or carbon fiber materials may be coated with a clear protective finish and enclosure assemblies constructed of aluminum may be treated by hard anodization.

Electronic assembly 304 enables data transfer, signal transfer, power transfer, power generation, processing, and/or control, among other functions. To carry out these functions, electronic assembly 304 is formed with one or more electronic subassemblies, including but not limited to a controller/processor subassembly 320; a power subassembly 321 (see FIG. 35 for an isolated power subassembly 321 exploded view); a signal processing subassembly 322 for at least signal transfer, processing, and amplification; memory; and/or a wireless communication subassembly 330. In addition, one or both of electronic assembly 304 and wireless communication subassembly may include a first communication system for communicating with an attached docking accessory and a second communication system for communicating with a mobile electronic device. The first and second communication systems may be wired or wireless, or both wired and wireless.

In an alternative embodiment, electronic functions may be differently consolidated and/or distributed within the docking platform without departing from the scope herein.

In a further embodiment, the docking platform may merely provide pass-through functions and/or may include minimal or no active electronics.

A power subassembly may include power storage, generating, and/or receiving components, among other power-related components and functionality. FIG. 35 shows one exemplary power subassembly 321 formed of power electronics and a battery 326, wireless charging interface 324, and charging coil 318. Alternative embodiments of power subassembly 321 may be formed with more or fewer components or different combination of components without departing from the scope herein. Power assembly 321 of FIGS. 34, 35 includes power electronics and a battery 326 to optionally power electronic assembly 304 (FIG. 34), attached docking accessories (see FIGS. 36, 37), and/or an attached mobile electronic device (see FIGS. 36, 37). Power subassembly 321 may also include a wireless charging interface 324 configured to receive and/or transmit wireless power. For example, wireless charging interface 324 may be configured to receive an electrical charging signal from a wireless charging coil 318, formed, for example, by flat-coiling a thin conductive wire. Charging coil 318 may optionally include a shield (not shown) to isolate charging currents from electronic circuits and leads.

In an embodiment, charging coil 318 includes a core and/or membrane of powdered iron or other material formed to, for example, reduce eddy currents and reduce interference by permanent magnets. Optionally, charging coil 318 may be configured to receive a wireless power signal from a charging station equipped with a compatible wireless charging generating coil. Note that a power transfer function may be included in power subassembly 321 to provide power to (and/or receive power from) attached docking accessories, for example, a charging accessory or a docked accessory with sharable power.

Wireless communication subassembly 330 may be configured for wireless transfer of digital data, among other purposes. Wireless communication module 330 may communicate with a mobile electronic device and/or attached/detached docking accessories via Bluetooth, Wi-Fi, Wireless USB, IrDA, Near-Field Communication (NFC), shared wireless, and/or radio frequency, among other wireless communication methods and standards. Communication may also be indirect communication, for example, via the Internet or some intermediary device(s), either through wired or wireless means. One example of such indirect communication is the situation where a linked docking accessory is spaced away from its associated docking platform or mobile electronic device, such as a camera accessory configured as a remote security camera. In alternative embodiments, docking accessories (such as docking accessories 360, 362) detachably attached to the docking platform may wirelessly communicate directly with the mobile electronic device, obviating the need for, or use of, a wireless communication subassembly housed within the docking platform. In an embodiment, docking platform 300 and/or detachably attached docking accessories may be wirelessly controlled from multiple authorized or authenticated mobile electronic devices.

Controller/processor subassembly 320 may include any specialized functions, including communications support functions. For example, communications to and from docking accessories may be processed or pre-processed within the docking platform for the purpose of, for example, authorizing docking accessories, linking and initializing docking accessories, gaining software access to mobile electronic devices (using a hardware "key" docking accessory, for example), offloading communication functions from a mobile electronic device, offloading processing or non-transient data storage to the mobile electronic device, and/or implementing special functions based on an attached docking accessory type, among other purposes.

Signal processing subassembly 322 may include functions for transferring, distributing, altering, quantifying, processing, and amplifying analog signals, among other functions. In some embodiments, the docking platform may include the capability of conductively transferring analog and/or digital signals to and from docking accessories to and/or from a mobile electronic device.

In the embodiment of docking platform 300, the accessory docking system comprises cutouts 310A, 310B, electrical contacts 312A, 312B, magnets 314A, 314B, and additional electronic transfer circuitry. Electrical contacts may be configured for signal, data, and/or power transfer, among other purposes. In an embodiment, electrical contacts 312A, 312B are omitted and cutouts, such as cutouts 310A, 310B, are optionally retained to improve mechanical mating performance and/or docking orientation, among other purposes. In some embodiments, detachably attached docking accessories may include a wireless communication function. Also, in some embodiments, the mechanical mating mechanism for detachably attaching docking accessories to the docking platform includes mating by snap-fit, magnetic bond, reusable adhesive, sticky gel, suction cup, micro-suction tape, spring-clip mechanism, slot-hole key release, reusable adhesive, slide-lock, and/or screw, for example.

Figure 33:
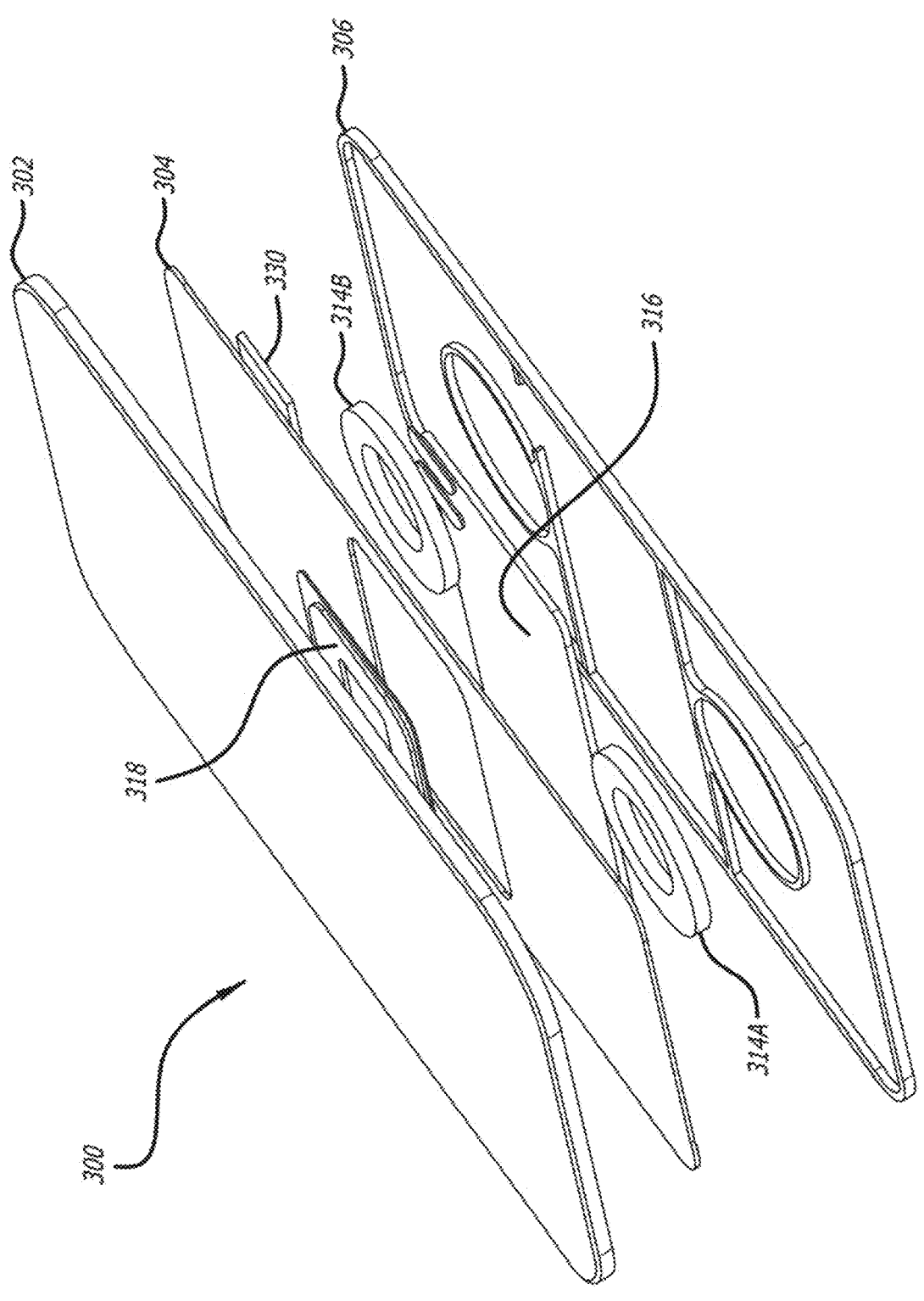
FIG. 33 is an exploded view of the docking platform of FIG. 32.
Figure 34:
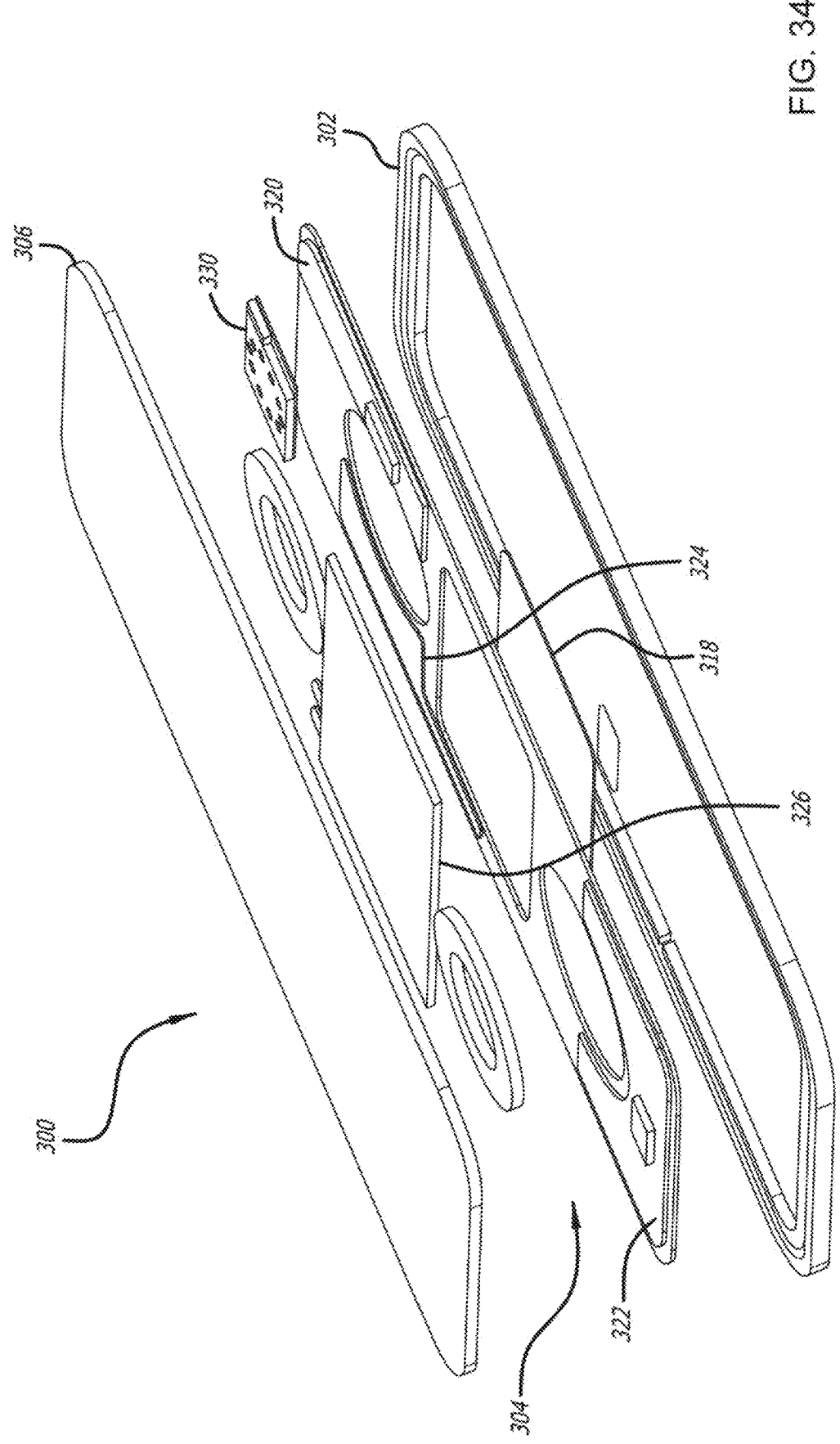
FIG. 34 is an additional exploded view of the docking platform of FIG. 32.
Figure 35:
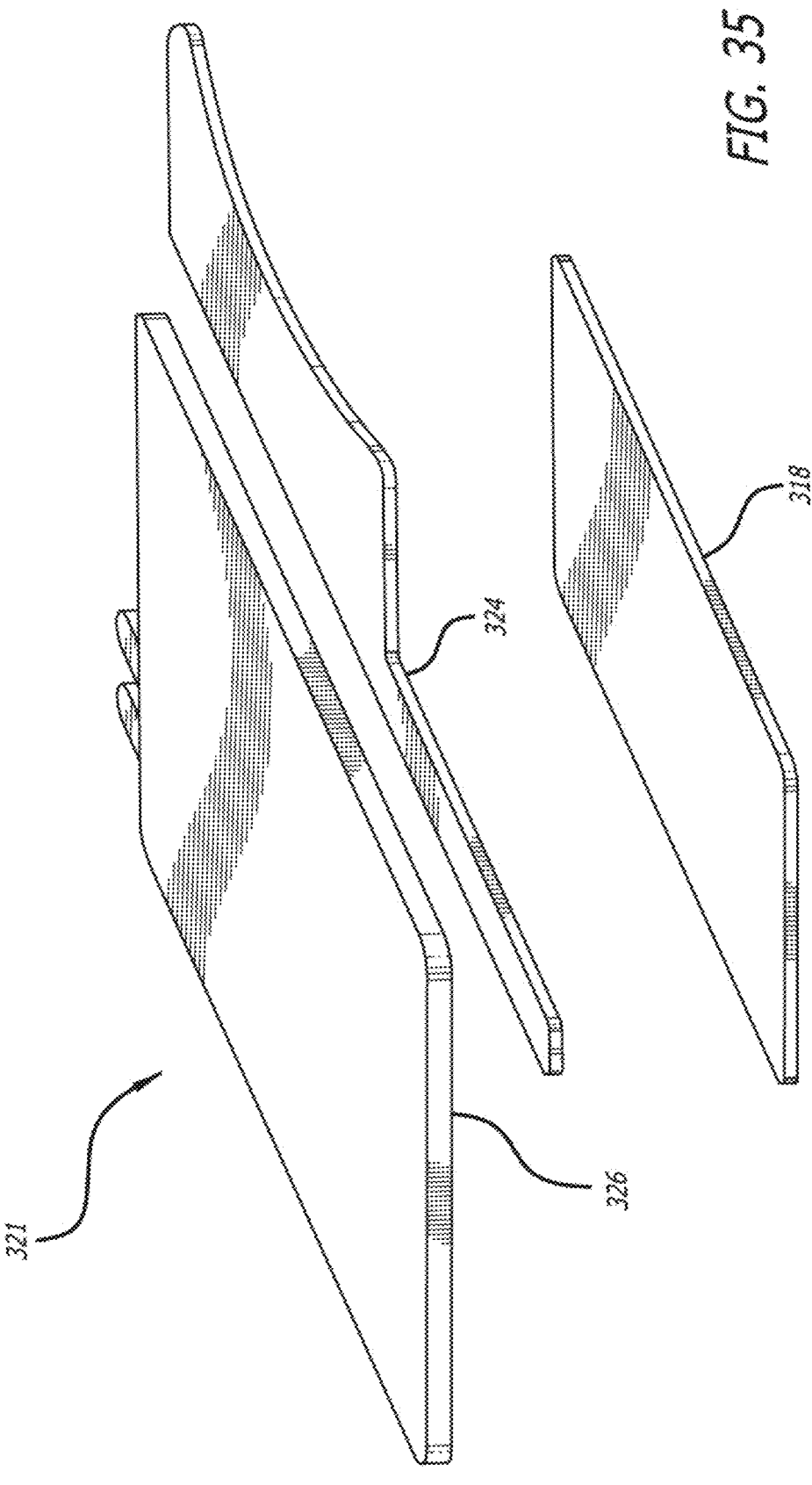
FIG. 35 is an exploded view of a power subassembly of the docking platform of FIGS. 32-34.

Docking platform 300 is shown in FIGS. 33 and 34 with a simplified mobile electronic device connection system that includes a sticky-gel 308 electronic device connection system formed on an exterior surface of enclosure cover 306. The sticky gel may include a first adhesive surface formulated for permanent or semi-permanent attachment to enclosure cover 306 and a second adhesive surface formulated to enable high-strength (high-tack) attachment to, and ease of user detachment from, a mobile electronic device. The second adhesive surface may be formulated to prevent residue formation after detachment of docking platform 300 from mobile electronic devices, objects, or surfaces. Sticky gels may be formed using a 0.1 mm to 1.5 mm thick polyurethane gel layer or may be formed of other thicknesses and formulations. Sticky gel 308, as depicted in FIGS. 33 and 34 includes a sticky polyurethane gel layer measuring 0.65 mm in thickness.

In alternative embodiments, the mobile electronic device connection system may include one or more electrical contacts formed on the docking platform and/or on a mobile electronic device for transferring electrical power, data, and/or signals between the docking platform and mobile electronic device. Additionally, the mobile electronic device connection system may include alternate mechanical mating mechanisms for detachably attaching the docking platform to a mobile electronic device by using, for example, snap-fit, magnetic bond, suction cup, micro-suction tape, spring-clip, key release, slide-lock, slot release, hole release, and/or screw mechanisms, among other mechanisms.

In some embodiments, the docking platform may be configured to determine a docking accessory mounting orientation from among a plurality of permissible orientations and may incorporate a means of optionally configuring electrical contact signals based on the detected orientation (through resistive detection signal switching or other means). In one embodiment, the number of orientations is two. In another embodiment, the number of orientations is four. In a further embodiment, the number of orientations is eight. In some embodiments, the docking platform and/or docking accessories may include redundant electrical contacts to enable mounting-orientation-independent electrical conduction of signals, data, and/or power between docking accessories and the docking platform.

Figure 36:
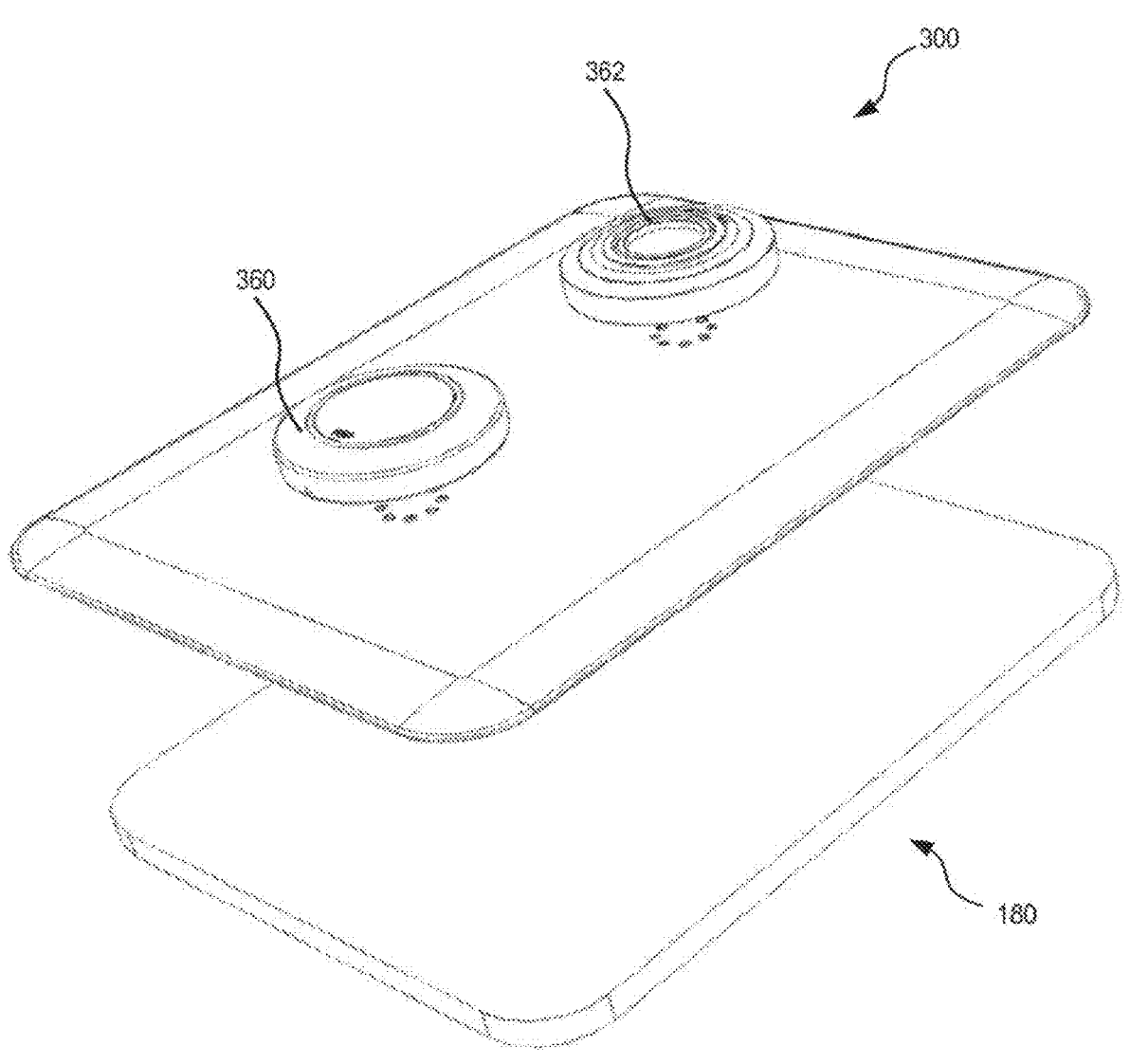
FIG. 36 is an exploded perspective view of one embodiment of a docking platform system, shown aligned with and detached from a compatible tablet mobile electronic device.
Figure 37:
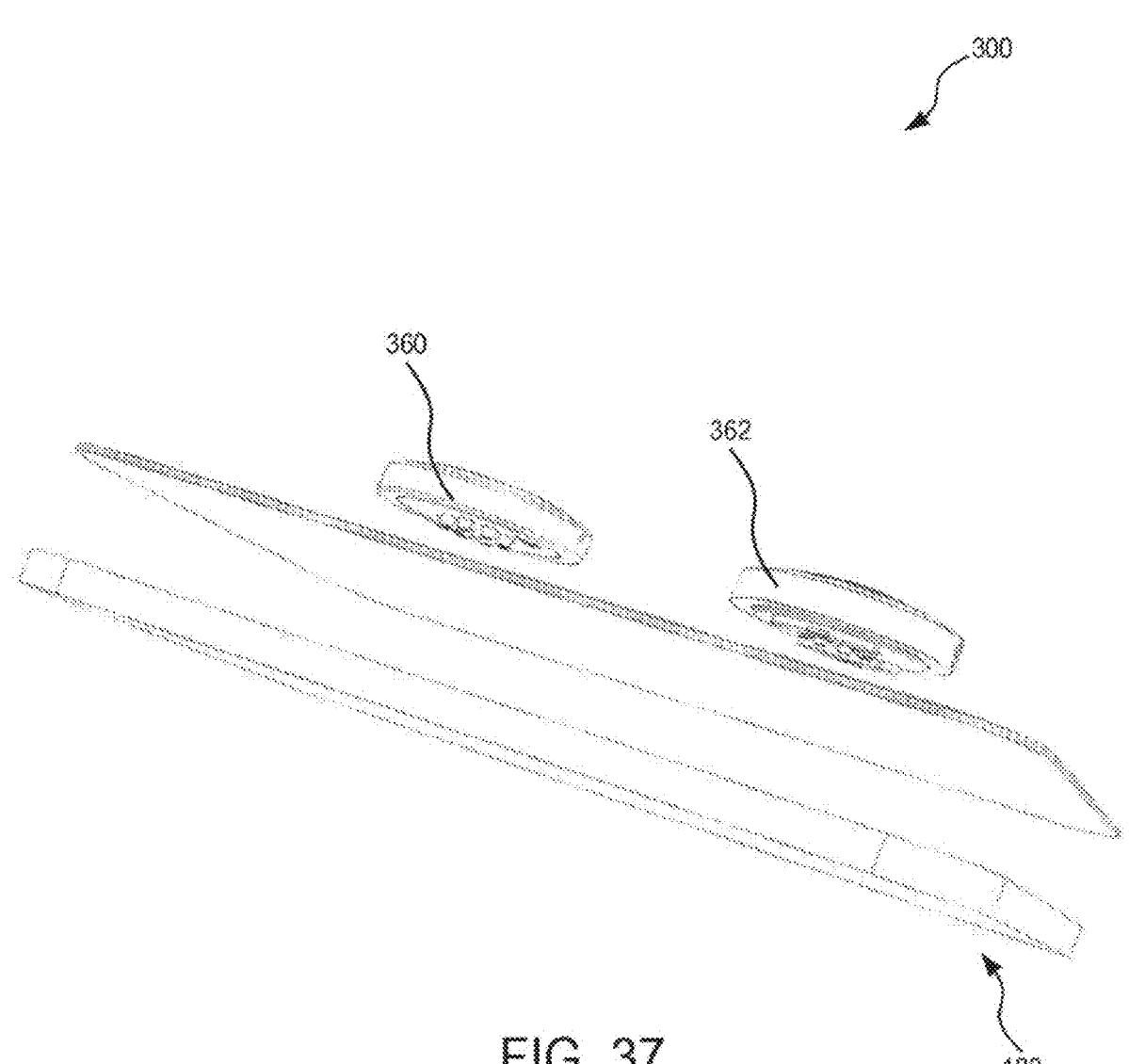
FIG. 37 is an exploded side perspective view of the docking platform system of FIG. 36.

A further embodiment of the docking platform, compatible with a tablet mobile electronic device, is shown in exploded view in FIGS. 36 and 37.

Figure 38:
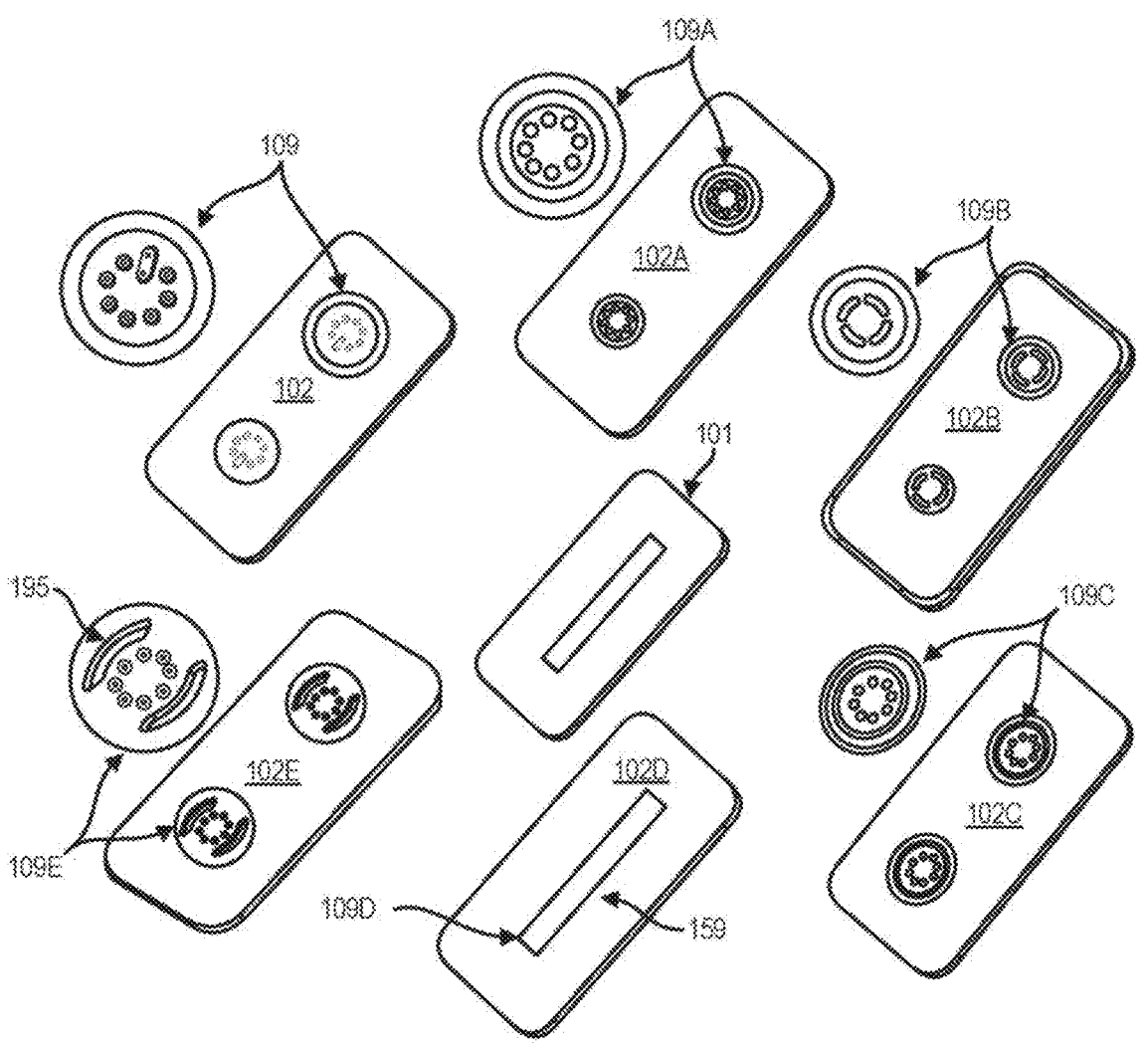
FIG. 38 depicts perspective views of a mobile device and multiple exemplary docking platforms constructed without major docking accessory cavities.

FIG. 38 shows an isometric back view of the mobile electronic device 101 with a generic docking platform 102 on its back face with isometric views of five examples of the docking platform 102 radiating outward from the mobile device 101. FIG. 38 is similar to FIG. 15B, with the exception the docking platforms 102 are configured for flush mounting an accessory to the back surface of mobile electronic device 101 as opposed to the mount strategy of FIG. 15B where an accessory is mounted within a cavity.

Moving clockwise from the top left, the first docking platform is docking platform 102 of FIG. 17.

The second docking platform 102A includes two docking connectors 109A, each comprising a single annular magnetic element beneath the outermost surface of the back face of the mobile electronic device, for temporarily bonding/coupling with docking accessories, similar to docking connector 109. A circular array of eight electrical contacts, each housed within an insulating contact cavity, for transmission of data and power with docked accessories.

The third docking platform 102B includes two docking connectors 109B formed with a single elongated magnetic element for temporarily bonding/coupling with multiple independent docking accessories simultaneously. In one embodiment, docking platform 102B is designed to be used in conjunction with wireless modes of power and data transmission, such as inductive charging and Bluetooth communication, between the mobile electronic device 101 and compatible docking accessories (not shown).

The fourth docking platform 102C includes two docking connectors 109C, each comprising one disc-shaped magnetic element and a circular arrangement of four elongated docking-accessory stabilization cavities for enhancing the lateral stability of docked accessories.

The fifth embodiment of docking platform 102D, center bottom of FIG. 15B, includes magnetic only docking connector 109D docking connector 109E comprising a magnetic attachment formed, in the present embodiment, as a single elongated magnetic element just below the surface of docking platform 102D. The magnetic element enables docking connector 102D to form a detachable attachment to one or more docking accessories (not shown). The docking accessories communicate wirelessly with mobile electronic device 101, for example, to transmit and/or receive one or both of data and power with mobile device 101. Note that docking connector 109D includes no electrical contacts. Also, it will be understood that although magnetic attachment system 159 is shown as a single elongated attached system, more than one magnetic attachment system may be used and different shaped attachment systems may be used without departing from the scope herein.

The sixth docking platform 102E includes two docking connectors 109E, each comprising a single disc-shaped magnetic element, eight electrical contacts arranged in a circular fashion. Each electrical contact is housed within an insulating contact cavity, and an annular stabilization shoulder 195 for enhancing the lateral stability of docked accessories.

Figure 39:
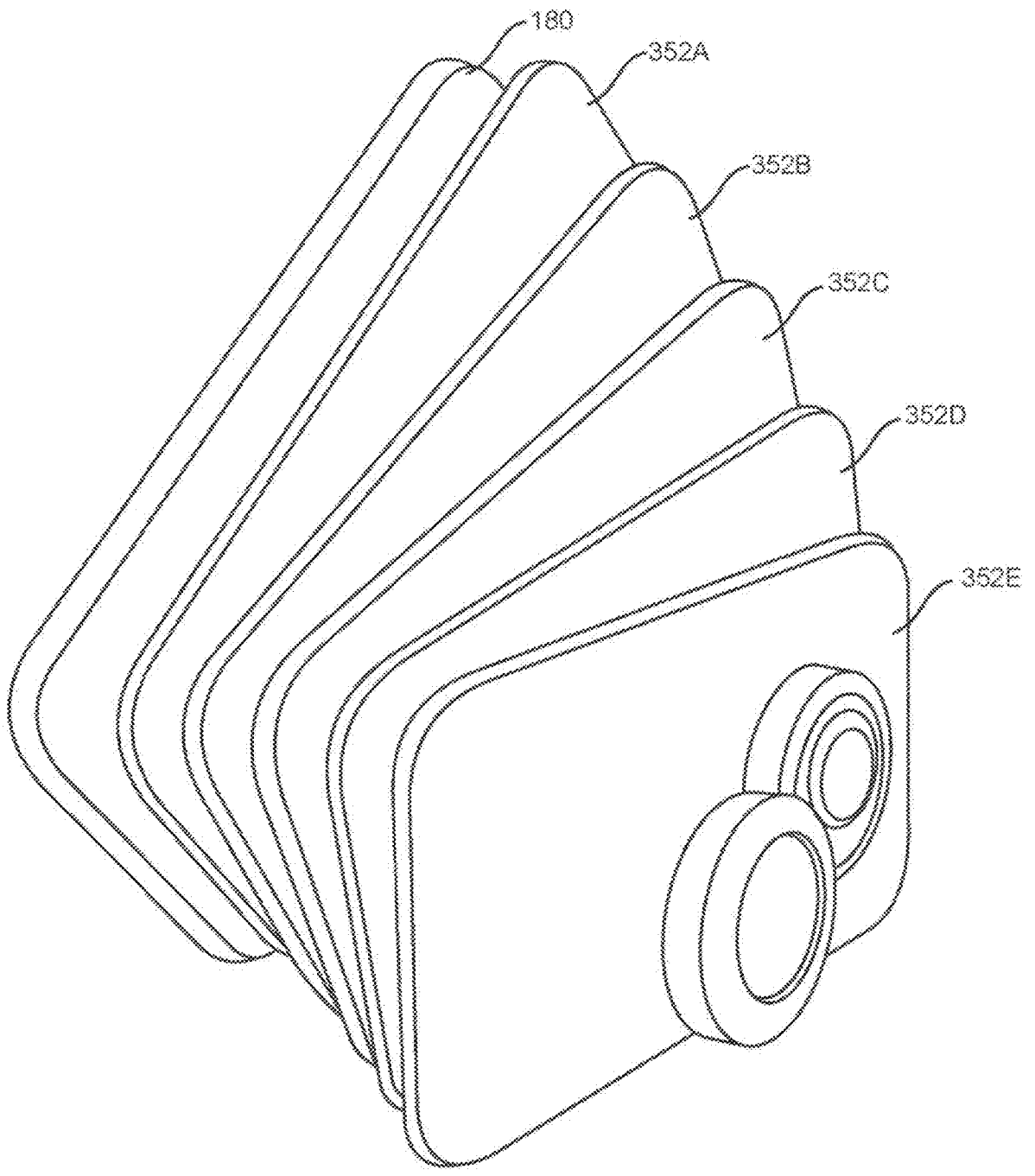
FIG. 39 is an exploded perspective view of alternatively decorated instances of one embodiment of the docking platform system.

FIG. 39 depicts a mobile electronic device 180 detached from alternatively decorated docking platforms 352A, 352B, 352C, 352D, and 352E. Decorated docking platforms 352A, 352B, 352C, 352D, and 352E are represented as fully covered with differing colors, but may alternatively be formed with single of multi-colored patterns or with textured surfaces.

Figure 40A:
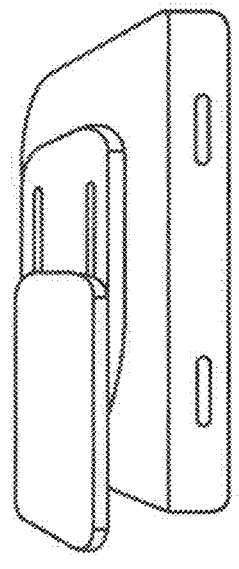
FIG. 40A is a perspective view of one embodiment of the docking platform system that is configured as a case and shown with a sliding game controller docking accessory.

FIG. 40A is a perspective view of a docking platform system configured as a case and shown with a sliding game controller docking accessory, in an embodiment.

Figure 40B:
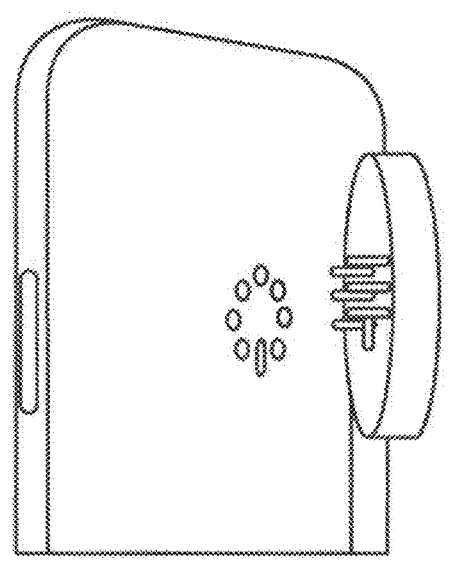
FIG. 40B is a perspective view of one embodiment of the docking platform system, shown with a lens docking accessory in a detached state.

FIG. 40B is a perspective view of a docking platform system, shown with a lens docking accessory in a detached state, in an embodiment.

Figure 40C:
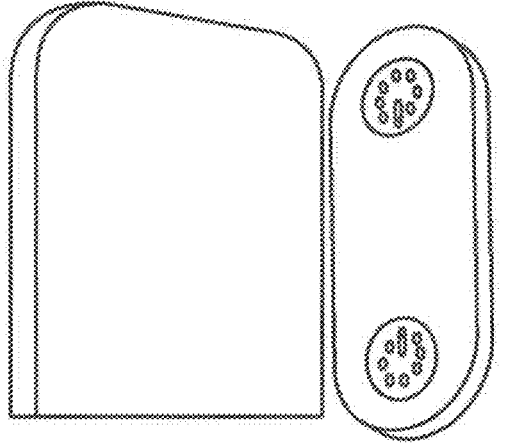
FIG. 40C is a perspective view of one embodiment of the docking platform system, shown with a battery docking accessory in a detached state.

FIG. 40C is a perspective view of a docking platform system, shown with a battery docking accessory in a detached state, in an embodiment.

Figure 40D:
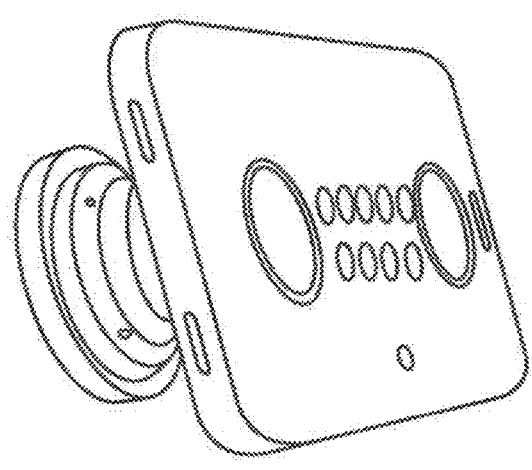
FIG. 40D is a perspective view of one embodiment of the docking platform system configured as a case and shown with two expanding accordion speaker docking accessories and a speaker display function.

FIG. 40D is a front/side perspective view of a docking platform system configured as a case and shown with accordion speaker docking accessories and a speaker display function, in an embodiment.

FIG. 40E is a back/side perspective view of a docking platform system configured as a case and shown with accordion speaker docking accessories in an articulated state, in an embodiment.

While the embodiments shown herein are described with particularity, those skilled in the art will appreciate changes, additions, and applications other than those specifically mentioned, which are within the spirit of this disclosure. For example, mobile electronic device may be a mobile media tablet, as in FIG. 16. The docking platform would then be sized according to a specific application, and the appropriate number and configuration of cavities provided. The platform, cavities, and docking connectors may have different shapes and sizes, as required by a certain application or for aesthetic purposes. The docking connectors may have different modes of attachment to docking accessories.

Docking accessories may be self-powered, and may communicate with the mobile electronic device wirelessly, for example via Bluetooth®. E.g., a digital scale accessory might be docked for transport, then removed and positioned in proximity of the mobile electronic device, while communicating via Bluetooth®, as an object is placed on the scale and its weight displayed on the screen of the mobile electronic device. Accessories may be operable for wireless power transmission between the accessory and the mobile electronic device.

What is claimed is:

1. A docking-accessory platform configured to couple to a mobile electronic device, the platform comprising:
   a front surface;
   a back surface opposite the front surface of the platform, wherein the back surface of the platform faces a back of the mobile electronic device when the platform is coupled to the mobile electronic device;
   a docking connector, wherein the docking connector comprises a cavity and wherein the docking connector comprises an annular magnetic attachment system formed beneath the front surface of the platform,
   wherein the annular magnetic attachment system comprises a magnet and is (i) centered laterally on the platform and (ii) configured to form detachable magnetic attachments to compatible docking accessories.

2. The platform of claim 1, wherein the platform comprises a magnetic element suitable for forming a magnetic bond with a magnetic element of the mobile electronic device.

3. The platform of claim 2, wherein the platform comprises a snap-fit structure suitable for forming an attachment with at least one side of the mobile electronic device.

4. The platform of claim 3, wherein the platform allows wireless power transfer with the mobile electronic device through the front surface and the back surface when the platform is coupled to the mobile electronic device.

5. The platform of claim 4, wherein the platform allows wireless power transfer between a battery accessory and the mobile electronic device through the front surface and the back surface when the platform is coupled to the mobile electronic device and the battery accessory is magnetically attached to the annular magnetic attachment system.

6. The platform of claim 5, wherein the docking connector of the platform comprises an alignment element distinct from the annular magnetic attachment system.

7. The platform of claim 6, wherein the alignment element is elongated along the length of the platform and centered laterally on the platform.

8. The platform of claim 7, wherein the aligning element and the annular magnetic attachment system are configured to jointly fix the orientation of one or more of the compatible docking accessories on the external back surface of the platform.

9. The platform of claim 8, wherein the mobile electronic device is configured to make a determination as to whether the battery accessory is attached to the mobile electronic device based on wireless communication with the battery accessory using a wireless communication standard having a range of no greater than 4 cm.

10. The platform of claim 9, wherein the mobile electronic device is configured to identify the battery accessory based on accessory information that is wirelessly received from the battery accessory.

11. The platform of claim 10, wherein the mobile electronic device is configured to perform a function based on the accessory information.

12. The platform of claim 11, wherein the function is specific to a type of the battery accessory.

13. The platform of claim 12, wherein the platform further comprises side surfaces, and wherein edges between the front surface and side surfaces of the platform are curved.

14. The platform of claim 13, wherein the platform comprises a window element to prevent impediment of a lens of the mobile electronic device.

15. A docking-accessory platform capable of coupling to a mobile electronic device, the platform comprising:
   a front surface;
   a back surface opposite the front surface of the platform, wherein the back surface of the platform faces a back of the mobile electronic device when the platform is coupled to the mobile electronic device;
   a docking connector, wherein the docking connector comprises a cavity and wherein the docking connector comprises an annular magnetic attachment system formed beneath the front surface of the platform,
   wherein the annular magnetic attachment system comprises a magnet and is (i) centered laterally on the platform and (ii) configured to form detachable magnetic attachments to compatible docking accessories.

16. The platform of claim 15, wherein the platform comprises a magnetic element suitable for forming a magnetic bond with a magnetic element of the mobile electronic device.

17. The platform of claim 16, wherein the platform comprises a snap-fit structure suitable for forming an attachment with at least one side of the mobile electronic device.

18. The platform of claim 17, wherein the platform allows wireless power transfer with the mobile electronic device through the front surface and the back surface when the platform is coupled to the mobile electronic device.

19. The platform of claim 18, wherein the platform allows wireless power transfer between a battery accessory and the mobile electronic device through the front surface and the back surface when the platform is coupled to the mobile electronic device and the battery accessory is magnetically attached to the annular magnetic attachment system.

20. The platform of claim 19, wherein the docking connector of the platform comprises an alignment element distinct from the annular magnetic attachment system.

* * * * *